(12) United States Patent
Higashino

(10) Patent No.: US 8,059,017 B2
(45) Date of Patent: Nov. 15, 2011

(54) CODE SEQUENCE GENERATION METHOD, MODULATION APPARATUS, MODULATION METHOD, MODULATION PROGRAM, DEMODULATION APPARATUS, DEMODULATION METHOD, DEMODULATION PROGRAM AND STORAGE MEDIUM

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 1296 days.

(21) Appl. No.: 11/605,583

(22) Filed: Nov. 29, 2006

(65) Prior Publication Data

US 2007/0159367 A1 Jul. 12, 2007

(30) Foreign Application Priority Data

Dec. 12, 2005 (JP) .................................. 2005-358307

(51) Int. Cl.
*H03M 7/00* (2006.01)
(52) U.S. Cl. ................ 341/59; 341/50; 341/51; 341/58; 714/752; 714/792
(58) Field of Classification Search .................... 341/50, 341/51, 58, 59; 375/262, 265; 714/752, 714/792
See application file for complete search history.

(56) References Cited

U.S. PATENT DOCUMENTS

| 6,850,573 B1 * | 2/2005 | Noda | ............................. 375/262 |
| 2004/0243914 A1 | 12/2004 | Noda | |

FOREIGN PATENT DOCUMENTS

| JP | 10-173536 | 6/1998 |
| JP | HEI 10-173536 | 6/1998 |
| JP | 11-110921 | 4/1999 |
| JP | 11-154381 | 6/1999 |
| JP | 11-186917 | 7/1999 |
| JP | HEI 11-186917 | 7/1999 |
| JP | 11-346154 | 12/1999 |
| JP | 2001-077695 | 3/2001 |
| WO | WO 03/032313 | 4/2003 |

OTHER PUBLICATIONS

L. Fredrickson, "Improved Trellis-Coding for Partial-Response Channels", IEEE Transactions on Magnetics, vol. No. 2, Mar. 1995.
L.Fredrickson,"ImprovedTrellis-Coding for Partial-Response Channels", IEEE Transactions Onmagnetics, vol. 31,No. 2,Mar. 1995.

* cited by examiner

*Primary Examiner* — Jean Jeanglaude
(74) *Attorney, Agent, or Firm* — Robert J. Depke; Rockey, Depke & Lyons, LLC

(57) ABSTRACT

A modulation apparatus includes: a modulation section that modulates, in accordance with a correlation table where a data sequence with a predetermined number of bits is associated with a code sequence with a predetermined number of bits, the data sequence into the code sequence to allow a predetermined demodulation section to demodulate the code sequence into the data sequence in accordance with the correlation table, wherein the code sequence is, on NRZI method, a MSN code sequence where a null point of a frequency spectrum on a recording channel or communication channel of the code sequence is matched with a null point of a frequency spectrum of a PR equalized signal including the code sequence and a minimum run length is limited to be greater or equal to one.

48 Claims, 31 Drawing Sheets

| PRECURSOR RUN | MIDDLE RUN | POSTCURSOR RUN |
|---|---|---|
| 00⋯00⋯ | 10⋯010⋯ | 1000⋯0 |

FIG. 8A

| | PRECURSOR RMTR | MIDDLE RMTR | POSTCURSOR RMTR |
|---|---|---|---|
| POSITIVE | 101⋯ | ⋯101⋯ | ⋯010 |
| NEGATIVE | 010⋯ | ⋯101⋯ | ⋯101 |

FIG. 8B

| PRECURSOR RUN | PRECURSOR RMTR | THE NUMBER OF CODE SEQUENCES | |
|---|---|---|---|
| 0 | 14 | 28060 | |
| 1 | 13 | 42317 | |
| 2 | 12 | 53428 | |
| 3 | 11 | 58965 | |
| 4 | 10 | 63167 | |
| 5 | 9 | 65064 | |
| 6 | 8 | 66142 | ← N1 |
| 7 | 7 | 66142 | ← N2 |
| 8 | 6 | 65064 | |
| 9 | 5 | 63167 | |
| 10 | 4 | 58965 | |
| 11 | 3 | 53428 | |
| 12 | 2 | 42317 | |
| 13 | 1 | 28060 | |

FIG. 9

| PRECURSOR POSITIVE RMTR | POSTCURSOR POSITIVE RMTR | THE NUMBER OF CODE SEQUENCES | |
|---|---|---|---|
| 2 | 7 | 64386 | |
| 3 | 6 | 65391 | |
| 4 | 5 | 65725 | ← N 3 |
| 5 | 4 | 65673 | |
| 6 | 3 | 65147 | |

FIG. 10

| PRECURSOR POSITIVE RMTR | POSTCURSOR POSITIVE RMTR | THE NUMBER OF CODE SEQUENCES | |
|---|---|---|---|
| 2 | 7 | 64365 | |
| 3 | 6 | 65383 | |
| 4 | 5 | 65723 | ← N 4 |
| 5 | 4 | 65675 | |
| 6 | 3 | 65157 | |

FIG. 11

| DATA (16BIT) | CODE SEQUENCES (26BIT) |
|---|---|
| 0000000000000000 | 01010000000000000010000000 |
| 0000000000000001 | 00001000000000000010000000 |
| 0000000000000010 | 10001000000000000010000000 |
| 0000000000000011 | 00101000000000000010000000 |
| 0000000000000100 | 10101000000000000010000000 |
| 0000000000000101 | 01000100000000000010000000 |
| 0000000000000110 | 00010100000000000010000000 |
| 0000000000000111 | 10010100000000000010000000 |
| 0000000000001000 | 00000010000000000010000000 |
| 0000000000001001 | 10000010000000000010000000 |
| 0000000000001010 | 00100010000000000010000000 |
| 0000000000001011 | 10100010000000000010000000 |
| 0000000000001100 | 01010010000000000010000000 |
| 0000000000001101 | 00001010000000000010000000 |
| 0000000000001110 | 10001010000000000010000000 |
| 0000000000001111 | 00101010000000000010000000 |
| 0000000000010000 | 10101010000000000010000000 |
| 0000000000010001 | 01000001000000000010000000 |
| 0000000000010010 | 00010001000000000010000000 |
| 0000000000010011 | 10010001000000000010000000 |
| 0000000000010100 | 00000101000000000010000000 |
| 0000000000010101 | 10000101000000000010000000 |
| 0000000000010110 | 00100101000000000010000000 |
| 0000000000010111 | 10100101000000000010000000 |
| 0000000000011000 | 01010101000000000010000000 |
| 0000000000011001 | 10000000100000000010000000 |
| 0000000000011010 | 00100000100000000010000000 |
| 0000000000011011 | 10100000100000000010000000 |
| 0000000000011100 | 01010000100000000010000000 |
| 0000000000011101 | 00001000100000000010000000 |
| 0000000000011110 | 10001000100000000010000000 |
| 0000000000011111 | 00101000100000000010000000 |
| 0000000000100000 | 10101000100000000010000000 |
| 0000000000100001 | 01000100100000000010000000 |
| 0000000000100010 | 00010100100000000010000000 |
| 0000000000100011 | 10010100100000000010000000 |
| 0000000000100100 | 00000101000000000010000000 |
| 0000000000100101 | 10000101000000000010000000 |
| 0000000000100110 | 00100010100000000010000000 |
| 0000000000100111 | 10100010100000000010000000 |
| 0000000000101000 | 01010010100000000010000000 |
| 0000000000101001 | 00010101000000000010000000 |
| 0000000000101010 | 10010101000000000010000000 |
| 0000000000101011 | 00101010100000000010000000 |
| 0000000000101100 | 10101010100000000010000000 |
| 0000000000101101 | 01000000010000000010000000 |
| 0000000000101110 | 00010000010000000010000000 |
| 0000000000101111 | 10010000010000000010000000 |
| 0000000000110000 | 00001000010000000010000000 |
| 0000000000110001 | 10001000010000000010000000 |

FIG. 12A DATA0~49

| DATA (16BIT) | CODE SEQUENCES (26BIT) |
|---|---|
| 0000000000110010 | 00100100010000000010000000 |
| 0000000000110011 | 10100100010000000010000000 |
| 0000000000110100 | 01010100010000000010000000 |
| 0000000000110101 | 01001010010000000010000000 |
| 0000000000110110 | 00000010100000000010000000 |
| 0000000000110111 | 10000010100000000010000000 |
| 0000000000111000 | 00100010100000000010000000 |
| 0000000000111001 | 10100010100000000010000000 |
| 0000000000111010 | 01010010100000000010000000 |
| 0000000000111011 | 00001001010000000010000000 |
| 0000000000111100 | 10001001010000000010000000 |
| 0000000000111101 | 00101001010000000010000000 |
| 0000000000111110 | 10101001010000000010000000 |
| 0000000000111111 | 01000101010000000010000000 |
| 0000000001000000 | 00010101010000000010000000 |
| 0000000001000001 | 10010101010000000010000000 |
| 0000000001000010 | 10000000001000000010000000 |
| 0000000001000011 | 00100000001000000010000000 |
| 0000000001000100 | 10100000001000000010000000 |
| 0000000001000101 | 01010000001000000010000000 |
| 0000000001000110 | 00001000001000000010000000 |
| 0000000001000111 | 10001000001000000010000000 |
| 0000000001001000 | 00101000001000000010000000 |
| 0000000001001001 | 10101000001000000010000000 |
| 0000000001001010 | 01000100001000000010000000 |
| 0000000001001011 | 00010100001000000010000000 |
| 0000000001001100 | 10010100001000000010000000 |
| 0000000001001101 | 00000010001000000010000000 |
| 0000000001001110 | 10000010001000000010000000 |
| 0000000001001111 | 00100010001000000010000000 |
| 0000000001010000 | 10100010001000000010000000 |
| 0000000001010001 | 01010010001000000010000000 |
| 0000000001010010 | 00001010001000000010000000 |
| 0000000001010011 | 10001010001000000010000000 |
| 0000000001010100 | 00101010001000000010000000 |
| 0000000001010101 | 10101010001000000010000000 |
| 0000000001010110 | 01000001001000000010000000 |
| 0000000001010111 | 00010001001000000010000000 |
| 0000000001011000 | 10010001001000000010000000 |
| 0000000001011001 | 00000101001000000010000000 |
| 0000000001011010 | 10000101001000000010000000 |
| 0000000001011011 | 00100101001000000010000000 |
| 0000000001011100 | 10100101001000000010000000 |
| 0000000001011101 | 01010101001000000010000000 |
| 0000000001011110 | 10000010101000000010000000 |
| 0000000001011111 | 01100010101000000010000000 |
| 0000000001100000 | 10100010101000000010000000 |
| 0000000001100001 | 01010010101000000010000000 |
| 0000000001100010 | 00001010101000000010000000 |
| 0000000001100011 | 10001010101000000010000000 |

FIG. 12B DATA50~99

| DATA (16BIT) | CODE SEQUENCES (26BIT) |
|---|---|
| 0000000001100100 | 00101000101000000010000000 |
| 0000000001100101 | 10101000101000000010000000 |
| 0000000001100110 | 01000100101000000010000000 |
| 0000000001100111 | 00010100101000000010000000 |
| 0000000001101000 | 10010100101000000010000000 |
| 0000000001101001 | 00000010101000000010000000 |
| 0000000001101010 | 10000010101000000010000000 |
| 0000000001101011 | 00100010101000000010000000 |
| 0000000001101100 | 10100010101000000010000000 |
| 0000000001101101 | 01010010101000000010000000 |
| 0000000001101110 | 00001010101000000010000000 |
| 0000000001101111 | 10001010101000000010000000 |
| 0000000001110000 | 00101010101000000010000000 |
| 0000000001110001 | 01000000001000000010000000 |
| 0000000001110010 | 00010000001000000010000000 |
| 0000000001110011 | 10010000001000000010000000 |
| 0000000001110100 | 00001000001000000010000000 |
| 0000000001110101 | 10001000001000000010000000 |
| 0000000001110110 | 00100100001000000010000000 |
| 0000000001110111 | 10100100001000000010000000 |
| 0000000001111000 | 01010100001000000010000000 |
| 0000000001111001 | 01000100001000000010000000 |
| 0000000001111010 | 00000010001000000010000000 |
| 0000000001111011 | 10000010001000000010000000 |
| 0000000001111100 | 00100010001000000010000000 |
| 0000000001111101 | 10100010001000000010000000 |
| 0000000001111110 | 01010010001000000010000000 |
| 0000000001111111 | 00001010001000000010000000 |
| 0000000010000000 | 10001010001000000010000000 |
| 0000000010000001 | 00101010001000000010000000 |
| 0000000010000010 | 10101010001000000010000000 |
| 0000000010000011 | 01000101001000000010000000 |
| 0000000010000100 | 00010101001000000010000000 |
| 0000000010000101 | 10010101001000000010000000 |
| 0000000010000110 | 01010001001000000010000000 |
| 0000000010000111 | 01000101001000000010000000 |
| 0000000010001000 | 00100101001000000010000000 |
| 0000000010001001 | 10100101001000000010000000 |
| 0000000010001010 | 10000000101000000010000000 |
| 0000000010001011 | 00100000101000000010000000 |
| 0000000010001100 | 10100000101000000010000000 |
| 0000000010001101 | 01010000101000000010000000 |
| 0000000010001110 | 00001000101000000010000000 |
| 0000000010001111 | 10001000101000000010000000 |
| 0000000010010000 | 00101000101000000010000000 |
| 0000000010010001 | 10101000101000000010000000 |
| 0000000010010010 | 01000100101000000010000000 |
| 0000000010010011 | 00010100101000000010000000 |
| 0000000010010100 | 10010100101000000010000000 |
| 0000000010010101 | 00000100101000000010000000 |

TBL1

FIG. 13A DATA100〜149

| DATA (16BIT) | CODE SEQUENCES (26BIT) |
|---|---|
| 0000000010010110 | 10000100101000000010000000 |
| 0000000010010111 | 00100010010100000010000000 |
| 0000000010011000 | 10100010010100000010000000 |
| 0000000010011001 | 01010010010100000010000000 |
| 0000000010011010 | 00001010010100000010000000 |
| 0000000010011011 | 10001010010100000010000000 |
| 0000000010011100 | 00101010010100000010000000 |
| 0000000010011101 | 10101010010100000010000000 |
| 0000000010011110 | 01000010101000000010000000 |
| 0000000010011111 | 00010010101000000010000000 |
| 0000000010100000 | 10010010101000000010000000 |
| 0000000010100001 | 00000101010100000010000000 |
| 0000000010100010 | 10000101010100000010000000 |
| 0000000010100011 | 00100101010100000010000000 |
| 0000000010100100 | 10100101010100000010000000 |
| 0000000010100101 | 01010101010100000010000000 |
| 0000000010100110 | 10000000000100000010000000 |
| 0000000010100111 | 00100000000100000010000000 |
| 0000000010101000 | 10100000000100000010000000 |
| 0000000010101001 | 01010000000100000010000000 |
| 0000000010101010 | 00001000000100000010000000 |
| 0000000010101011 | 10001000000100000010000000 |
| 0000000010101100 | 00101000000100000010000000 |
| 0000000010101101 | 10101000000100000010000000 |
| 0000000010101110 | 01000100000100000010000000 |
| 0000000010101111 | 00010100000100000010000000 |
| 0000000010110000 | 10010100000100000010000000 |
| 0000000010110001 | 00000010000100000010000000 |
| 0000000010110010 | 10000010000100000010000000 |
| 0000000010110011 | 00100010000100000010000000 |
| 0000000010110100 | 10100010000100000010000000 |
| 0000000010110101 | 01010010000100000010000000 |
| 0000000010110110 | 00001010000100000010000000 |
| 0000000010110111 | 10001010000100000010000000 |
| 0000000010111000 | 00101010000100000010000000 |
| 0000000010111001 | 10101010000100000010000000 |
| 0000000010111010 | 01000010000100000010000000 |
| 0000000010111011 | 00010010000100000010000000 |
| 0000000010111100 | 10010010000100000010000000 |
| 0000000010111101 | 00001010000100000010000000 |
| 0000000010111110 | 10001010000100000010000000 |
| 0000000010111111 | 00100101000100000010000000 |
| 0000000011000000 | 10100101010000000010000000 |
| 0000000011000001 | 01010101010000000010000000 |
| 0000000011000010 | 10000010010000000010000000 |
| 0000000011000011 | 00100010010000000010000000 |
| 0000000011000100 | 10100010010000000010000000 |
| 0000000011000101 | 01010010010000000010000000 |
| 0000000011000110 | 00001010010000000010000000 |
| 0000000011000111 | 10001010010000000010000000 |

TBL1

FIG. 13B DATA150〜199

| DATA (16BIT) | CODE SEQUENCES (26BIT) |
|---|---|
| 0000000011001000 | 00101000100010000010000000 |
| 0000000011001001 | 10101000100010000010000000 |
| 0000000011001010 | 01000100100010000010000000 |
| 0000000011001011 | 00010100100010000010000000 |
| 0000000011001100 | 10010100100010000010000000 |
| 0000000011001101 | 00000101000010000010000000 |
| 0000000011001110 | 10000101000010000010000000 |
| 0000000011001111 | 00100101000010000010000000 |
| 0000000011010000 | 10100101000010000010000000 |
| 0000000011010001 | 01010010100010000010000000 |
| 0000000011010010 | 00001010100010000010000000 |
| 0000000011010011 | 10001010100010000010000000 |
| 0000000011010100 | 00101010100010000010000000 |
| 0000000011010101 | 10101010100010000010000000 |
| 0000000011010110 | 01000000100010000010000000 |
| 0000000011010111 | 00010000100010000010000000 |
| 0000000011011000 | 10010000100010000010000000 |
| 0000000011011001 | 00000100100010000010000000 |
| 0000000011011010 | 10000100100010000010000000 |
| 0000000011011011 | 00100100100010000010000000 |
| 0000000011011100 | 10100100100010000010000000 |
| 0000000011011101 | 01010100100010000010000000 |
| 0000000011011110 | 01000100100010000010000000 |
| 0000000011011111 | 00000010100010000010000000 |
| 0000000011100000 | 10000010100010000010000000 |
| 0000000011100001 | 00100010100010000010000000 |
| 0000000011100010 | 10100010100010000010000000 |
| 0000000011100011 | 01010010100010000010000000 |
| 0000000011100100 | 00000100100010000010000000 |
| 0000000011100101 | 10000100100010000010000000 |
| 0000000011100110 | 00101001010010000010000000 |
| 0000000011100111 | 10101001010010000010000000 |
| 0000000011101000 | 01000101010010000010000000 |
| 0000000011101001 | 00010101010010000010000000 |
| 0000000011101010 | 10010101010010000010000000 |
| 0000000011101011 | 10000000101010000010000000 |
| 0000000011101100 | 00100000101010000010000000 |
| 0000000011101101 | 10100000101010000010000000 |
| 0000000011101110 | 01010000101010000010000000 |
| 0000000011101111 | 00001000101010000010000000 |
| 0000000011110000 | 10001000101010000010000000 |
| 0000000011110001 | 00101000101010000010000000 |
| 0000000011110010 | 10101000101010000010000000 |
| 0000000011110011 | 01010000101010000010000000 |
| 0000000011110100 | 00010000101010000010000000 |
| 0000000011110101 | 10010000101010000010000000 |
| 0000000011110110 | 00000100101010000010000000 |
| 0000000011110111 | 10000100101010000010000000 |
| 0000000011111000 | 00101000101010000010000000 |
| 0000000011111001 | 10101000101010000010000000 |

TBL1

FIG. 14A DATA200∼249

| DATA (16BIT) | CODE SEQUENCES (26BIT) |
|---|---|
| 0000000011111010 | 01010010001010000010000000 |
| 0000000011111011 | 00001010001010000010000000 |
| 0000000011111100 | 10001010001010000010000000 |
| 0000000011111101 | 00101010001010000010000000 |
| 0000000011111110 | 10101010001010000010000000 |
| 0000000011111111 | 01000001001010000010000000 |
| 0000000100000000 | 00010010010010000010000000 |
| 0000000100000001 | 10010010010010000010000000 |
| 0000000100000010 | 00001010010010000010000000 |
| 0000000100000011 | 10000101001010000010000000 |
| 0000000100000100 | 00100101001010000010000000 |
| 0000000100000101 | 10100101001010000010000000 |
| 0000000100000110 | 01010101001010000010000000 |
| 0000000100000111 | 10000010101010000010000000 |
| 0000000100001000 | 00100010101010000010000000 |
| 0000000100001001 | 10100010101010000010000000 |
| 0000000100001010 | 01010010101010000010000000 |
| 0000000100001011 | 00001010101010000010000000 |
| 0000000100001100 | 10001010101010000010000000 |
| 0000000100001101 | 00101010101010000010000000 |
| 0000000100001110 | 10101010101010000010000000 |
| 0000000100001111 | 01000100101010000010000000 |
| 0000000100010000 | 00010100101010000010000000 |
| 0000000100010001 | 10010100101010000010000000 |
| 0000000100010010 | 00000010101010000010000000 |
| 0000000100010011 | 10000010101010000010000000 |
| 0000000100010100 | 00101010101010000010000000 |
| 0000000100010101 | 10101010101010000010000000 |
| 0000000100010110 | 01010010101010000010000000 |
| 0000000100010111 | 00001010101010000010000000 |
| 0000000100011000 | 10001010101010000010000000 |
| 0000000100011001 | 00101010101010000010000000 |
| 0000000100011010 | 01000000000010000010000000 |
| 0000000100011011 | 00010000000010000010000000 |
| 0000000100011100 | 10010000000010000010000000 |
| 0000000100011101 | 00000100000010000010000000 |
| 0000000100011110 | 10000100000010000010000000 |
| 0000000100011111 | 00100100000010000010000000 |
| 0000000100100000 | 10100000000010000010000000 |
| 0000000100100001 | 01010000000010000010000000 |
| 0000000100100010 | 01001010000010000010000000 |
| 0000000100100011 | 00000001000010000010000000 |
| 0000000100100100 | 10000001000010000010000000 |
| 0000000100100101 | 00001001000010000010000000 |
| 0000000100100110 | 10100001000010000010000000 |
| 0000000100100111 | 01010001000010000010000000 |
| 0000000100101000 | 00001001000010000010000000 |
| 0000000100101001 | 10001001000010000010000000 |
| 0000000100101010 | 00101001000010000010000000 |
| 0000000100101011 | 10101001000010000010000000 |

TBL1

FIG. 14B DATA250∼299

| DATA (16BIT) | CODE SEQUENCES (26BIT) |
|---|---|
| 0000000100101100 | 01000101000010000100000000 |
| 0000000100101101 | 00010101000010000100000000 |
| 0000000100101110 | 10010101000010000100000000 |
| 0000000100101111 | 01000100100010000100000000 |
| 0000000100110000 | 01000010100010000100000000 |
| 0000000100110001 | 00010010100010000100000000 |
| 0000000100110010 | 10010010100010000100000000 |
| 0000000100110011 | 10000000100010000100000000 |
| 0000000100110100 | 00100000100010000100000000 |
| 0000000100110101 | 10100000100010000100000000 |
| 0000000100110110 | 01010000100010000100000000 |
| 0000000100110111 | 00001000100010000100000000 |
| 0000000100111000 | 10001000100010000100000000 |
| 0000000100111001 | 00101000100010000100000000 |
| 0000000100111010 | 10101000100010000100000000 |
| 0000000100111011 | 01000100100010000100000000 |
| 0000000100111100 | 00010100100010000100000000 |
| 0000000100111101 | 10010100100010000100000000 |
| 0000000100111110 | 00000010010010000100000000 |
| 0000000100111111 | 10000010010010000100000000 |
| 0000000101000000 | 00100010010010000100000000 |
| 0000000101000001 | 10100010010010000100000000 |
| 0000000101000010 | 01010010010010000100000000 |
| 0000000101000011 | 00010100010010000100000000 |
| 0000000101000100 | 10001010010010000100000000 |
| 0000000101000101 | 00101010010010000100000000 |
| 0000000101000110 | 10101010010010000100000000 |
| 0000000101000111 | 01000001010010000100000000 |
| 0000000101001000 | 00010001010010000100000000 |
| 0000000101001001 | 10010001010010000100000000 |
| 0000000101001010 | 00001010010010000100000000 |
| 0000000101001011 | 10001010010010000100000000 |
| 0000000101001100 | 00100101010010000100000000 |
| 0000000101001101 | 10100101010010000100000000 |
| 0000000101001110 | 01010101010010000100000000 |
| 0000000101001111 | 01001000010010000100000000 |
| 0000000101010000 | 01000100010010000100000000 |
| 0000000101010001 | 00010010001010000100000000 |
| 0000000101010010 | 10010010001010000100000000 |
| 0000000101010011 | 01000000101010000100000000 |
| 0000000101010100 | 00010000101010000100000000 |
| 0000000101010101 | 10010000101010000100000000 |
| 0000000101010110 | 00000100101010000100000000 |
| 0000000101010111 | 10000100101010000100000000 |
| 0000000101011000 | 00100100101010000100000000 |
| 0000000101011001 | 10100100101010000100000000 |
| 0000000101011010 | 01010100101010000100000000 |
| 0000000101011011 | 01001010101010000100000000 |
| 0000000101011100 | 10000000010101000100000000 |
| 0000000101011101 | 00100000010101000100000000 |

FIG. 15A DATA300~349 TBL1

| DATA (16BIT) | CODE SEQUENCES (26BIT) |
|---|---|
| 0000000101011110 | 10100000010100001000000000 |
| 0000000101011111 | 01010000001010001000000000 |
| 0000000101100000 | 00001000001010001000000000 |
| 0000000101100001 | 10001000001010001000000000 |
| 0000000101100010 | 00101000001010001000000000 |
| 0000000101100011 | 10101000001010001000000000 |
| 0000000101100100 | 01000100001010001000000000 |
| 0000000101100101 | 00010100001010001000000000 |
| 0000000101100110 | 10010100001010001000000000 |
| 0000000101100111 | 00000010001010001000000000 |
| 0000000101101000 | 10000010001010001000000000 |
| 0000000101101001 | 00100010001010001000000000 |
| 0000000101101010 | 10100010001010001000000000 |
| 0000000101101011 | 01010010001010001000000000 |
| 0000000101101100 | 00010001001010001000000000 |
| 0000000101101101 | 10001001001010001000000000 |
| 0000000101101110 | 00101001001010001000000000 |
| 0000000101101111 | 10101001001010001000000000 |
| 0000000101110000 | 01000010001010001000000000 |
| 0000000101110001 | 00010001000010001000000000 |
| 0000000101110010 | 10010001000010001000000000 |
| 0000000101110011 | 00000101000010001000000000 |
| 0000000101110100 | 10000101000010001000000000 |
| 0000000101110101 | 00100101000010001000000000 |
| 0000000101110110 | 10100101000010001000000000 |
| 0000000101110111 | 01010101000010001000000000 |
| 0000000101111000 | 10000001001010001000000000 |
| 0000000101111001 | 00100001001010001000000000 |
| 0000000101111010 | 10100001001010001000000000 |
| 0000000101111011 | 01010001001010001000000000 |
| 0000000101111100 | 00001001001010001000000000 |
| 0000000101111101 | 10001001001010001000000000 |
| 0000000101111110 | 00101001001010001000000000 |
| 0000000101111111 | 10101001001010001000000000 |
| 0000000110000000 | 01000100001010001000000000 |
| 0000000110000001 | 00010100001010001000000000 |
| 0000000110000010 | 10010100001010001000000000 |
| 0000000110000011 | 00000010101010001000000000 |
| 0000000110000100 | 10000010101010001000000000 |
| 0000000110000101 | 00100010101010001000000000 |
| 0000000110000110 | 10100010101010001000000000 |
| 0000000110000111 | 01010010101010001000000000 |
| 0000000110001000 | 00010101001010001000000000 |
| 0000000110001001 | 10010101001010001000000000 |
| 0000000110001010 | 00101010001010001000000000 |
| 0000000110001011 | 10101010001010001000000000 |
| 0000000110001100 | 01000000101010001000000000 |
| 0000000110001101 | 00010000101010001000000000 |
| 0000000110001110 | 10010000101010001000000000 |
| 0000000110001111 | 00001000101010001000000000 |

FIG. 15B DATA350~399 TBL1

| | DISABLE DC CONTROL | ENABLE DC CONTROL |
|---|---|---|
| MAXIMUM DSV VALUE | 1669 | 47 |
| MINIMUM DSV VALUE | -314 | -44 |

| | PRECURSOR RUN | MIDDLE RUN | POSTCURSOR RUN |
|---|---|---|---|
| FIG. 32A | 00···00··· | 10···010··· | 1000···0 |

| | | PRECURSOR RMTR | MIDDLE RMTR | POSTCURSOR RMTR |
|---|---|---|---|---|
| FIG. 32B | POSITIVE | 1001··· | ···1001··· | ···0100 |
| | NEGATIVE | 0100··· | ···1001··· | ···0010 |

| PRECURSOR RUN | POSTCURSOR RUN | THE NUMBER OF CODE SEQUENCES |
|---|---|---|
| 11 | 19 | 65263 |
| 12 | 18 | 65458 |
| 13 | 17 | 65591 |
| 14 | 16 | 65627 | ← N11
| 15 | 15 | 65591 |
| 16 | 14 | 65458 |
| 17 | 13 | 65263 |

FIG. 33

| PRECURSOR POSITIVE RMTR | POSTCURSOR PPOSITIVE RMTR | THE NUMBER OF CODE SEQUENCES |
|---|---|---|
| 0 | 5 | 61070 |
| 1 | 4 | 64849 |
| 2 | 3 | 65606 | ← N12
| 3 | 2 | 65243 |
| 4 | 1 | 63252 |

FIG. 34

| DATA (16BIT) | CODE SEQUENCES (34BIT) | DATA (16BIT) | CODE SEQUENCES (34BIT) |
|---|---|---|---|
| 0000000000000000 | 0100000000000001000000000000000000 | 0000000000110010 | 0100100000010000100000000000000000 |
| 0000000000000001 | 0001000000000001000000000000000000 | 0000000000110011 | 0000001000001000010000000000000000 |
| 0000000000000010 | 1000100000000001000000000000000000 | 0000000000110100 | 0100001000001000010000000000000000 |
| 0000000000000011 | 0000010000000001000000000000000000 | 0000000000110101 | 0001001000001000010000000000000000 |
| 0000000000000100 | 0100010000000001000000000000000000 | 0000000000110110 | 1001000100001000010000000000000000 |
| 0000000000000101 | 1000010000000001000000000000000000 | 0000000000110111 | 0000000001001000010000000000000000 |
| 0000000000000110 | 0010001000000001000000000000000000 | 0000000000111000 | 0100000001001000010000000000000000 |
| 0000000000000111 | 0000001000000001000000000000000000 | 0000000000111001 | 0001000001001000010000000000000000 |
| 0000000000001000 | 0100000100000001000000000000000000 | 0000000000111010 | 1000100001001000010000000000000000 |
| 0000000000001001 | 0001000100000001000000000000000000 | 0000000000111011 | 0000010001001000010000000000000000 |
| 0000000000001010 | 1000100100000001000000000000000000 | 0000000000111100 | 0100010001001000010000000000000000 |
| 0000000000001011 | 1100000010000001000000000000000000 | 0000000000111101 | 1001000010001000010000000000000000 |
| 0000000000001100 | 0010000010000001000000000000000000 | 0000000000111110 | 1000010010001000010000000000000000 |
| 0000000000001101 | 0000100010000001000000000000000000 | 0000000000111111 | 0010010001001000010000000000000000 |
| 0000000000001110 | 0100100010000001000000000000000000 | 0000000001000000 | 0000000000001001000000000000000000 |
| 0000000000001111 | 0000000100000001000000000000000000 | 0000000001000001 | 0100000000001001000000000000000000 |
| 0000000000010000 | 0100000100000001000000000000000000 | 0000000001000010 | 0001000000001001000000000000000000 |
| 0000000000010001 | 0001000010000001000000000000000000 | 0000000001000011 | 1000100000001001000000000000000000 |
| 0000000000010010 | 1000100010000001000000000000000000 | 0000000001000100 | 0000010000001001000000000000000000 |
| 0000000000010011 | 0000010010000001000000000000000000 | 0000000001000101 | 0100010000001001000000000000000000 |
| 0000000000010100 | 0100010010000001000000000000000000 | 0000000001000110 | 1000010000001001000000000000000000 |
| 0000000000010101 | 1000010010000001000000000000000000 | 0000000001000111 | 0010001000001001000000000000000000 |
| 0000000000010110 | 0010001010000001000000000000000000 | 0000000001001000 | 0000000100001001000000000000000000 |
| 0000000000010111 | 1000000000100001000000000000000000 | 0000000001001001 | 0100000100001001000000000000000000 |
| 0000000000011000 | 0010000000100001000000000000000000 | 0000000001001010 | 0001000100001001000000000000000000 |
| 0000000000011001 | 0000100000100001000000000000000000 | 0000000001001011 | 1000100100001001000000000000000000 |
| 0000000000011010 | 0100100000100001000000000000000000 | 0000000001001100 | 1000000010001001000000000000000000 |
| 0000000000011011 | 0000001000100001000000000000000000 | 0000000001001101 | 0010000010001001000000000000000000 |
| 0000000000011100 | 0100001000100001000000000000000000 | 0000000001001110 | 0000100010001001000000000000000000 |
| 0000000000011101 | 0001001000100001000000000000000000 | 0000000001001111 | 0100100010001001000000000000000000 |
| 0000000000011110 | 1001000100100001000000000000000000 | 0000000001010000 | 0000000001001001000000000000000000 |
| 0000000000011111 | 0000000001000001000000000000000000 | 0000000001010001 | 0100000001001001000000000000000000 |
| 0000000000100000 | 0100000001000001000000000000000000 | 0000000001010010 | 0001000001001001000000000000000000 |
| 0000000000100001 | 0001000001000001000000000000000000 | 0000000001010011 | 1000100001001001000000000000000000 |
| 0000000000100010 | 1000100001000001000000000000000000 | 0000000001010100 | 0000010001001001000000000000000000 |
| 0000000000100011 | 0000010001000001000000000000000000 | 0000000001010101 | 0100010001001001000000000000000000 |
| 0000000000100100 | 0100010001000001000000000000000000 | 0000000001010110 | 1000010001001001000000000000000000 |
| 0000000000100101 | 1000010001000001000000000000000000 | 0000000001010111 | 0010010001001001000000000000000000 |
| 0000000000100110 | 0010001001000001000000000000000000 | 0000000001011000 | 1000000010001001000000000000000000 |
| 0000000000100111 | 0000001001000001000000000000000000 | 0000000001011001 | 0010000010001001000000000000000000 |
| 0000000000101000 | 0100001001000001000000000000000000 | 0000000001011010 | 0000100010001001000000000000000000 |
| 0000000000101001 | 0001001001000001000000000000000000 | 0000000001011011 | 0100100010001001000000000000000000 |
| 0000000000101010 | 1001001001000001000000000000000000 | 0000000001011100 | 0000001000001001000000000000000000 |
| 0000000000101011 | 1000001001000001000000000000000000 | 0000000001011101 | 0100001000001001000000000000000000 |
| 0000000000101100 | 0010001001000001000000000000000000 | 0000000001011110 | 0001001000001001000000000000000000 |
| 0000000000101101 | 0000100100100001000000000000000000 | 0000000001011111 | 1001001000001001000000000000000000 |
| 0000000000101110 | 0100100100100001000000000000000000 | 0000000001100000 | 1000000000001001000000000000000000 |
| 0000000000101111 | 1000000010100001000000000000000000 | 0000000001100001 | 0010000000001001000000000000000000 |
| 0000000000110000 | 0010000010100001000000000000000000 | 0000000001100010 | 0000100000001001000000000000000000 |
| 0000000000110001 | 0000100000100001000000000000000000 | 0000000001100011 | 0100100000001001000000000000000000 |

TBL2　　　　　　　　　　　　　　　　TBL2

FIG. 35A DATA0〜49　　　FIG. 35B DATA50〜99

| DATA (16BIT) | CODE SEQUENCES (34BIT) |
|---|---|
| 0000000001100100 | 0000010000000100100000000000000000 |
| 0000000001100101 | 0100010000000100100000000000000000 |
| 0000000001100110 | 0001001000000100100000000000000000 |
| 0000000001100111 | 1001000100000100100000000000000000 |
| 0000000001101000 | 0000000010000100100000000000000000 |
| 0000000001101001 | 0100000010000100100000000000000000 |
| 0000000001101010 | 0001000010000100100000000000000000 |
| 0000000001101011 | 1000100010000100100000000000000000 |
| 0000000001101100 | 0000010010000100100000000000000000 |
| 0000000001101101 | 0100010010000100100000000000000000 |
| 0000000001101110 | 1001000001000100100000000000000000 |
| 0000000001101111 | 1000100001000100100000000000000000 |
| 0000000001110000 | 0010010001000100100000000000000000 |
| 0000000001110001 | 0000000001001001001000000000000000 |
| 0000000001110010 | 0100000001001001001000000000000000 |
| 0000000001110011 | 0001000001001001001000000000000000 |
| 0000000001110100 | 1000100001001001001000000000000000 |
| 0000000001110101 | 0000010001001001001000000000000000 |
| 0000000001110110 | 0100010001001001001000000000000000 |
| 0000000001110111 | 1001000010001001001000000000000000 |
| 0000000001111000 | 0010010010001001001000000000000000 |
| 0000000001111001 | 0000000100010001001000000000000000 |
| 0000000001111010 | 0100000100010001001000000000000000 |
| 0000000001111011 | 0001000100010001001000000000000000 |
| 0000000001111100 | 1000100100010001001000000000000000 |
| 0000000001111101 | 1001000000100010001000000000000000 |
| 0000000001111110 | 1000100000100010001000000000000000 |
| 0000000001111111 | 0010010000100010001000000000000000 |
| 0000000010000000 | 1000000010010010001000000000000000 |
| 0000000010000001 | 0010010010010010001000000000000000 |
| 0000000010000010 | 0000010010010010001000000000000000 |
| 0000000010000011 | 0100100100100100010000000000000000 |
| 0000000010000100 | 1000000000000000100000000000000000 |
| 0000000010000101 | 0010000000000000100000000000000000 |
| 0000000010000110 | 0000100000000000100000000000000000 |
| 0000000010000111 | 0100100000000000100000000000000000 |
| 0000000010001000 | 0000001000000000100000000000000000 |
| 0000000010001001 | 0100001000000000100000000000000000 |
| 0000000010001010 | 0001001000000000100000000000000000 |
| 0000000010001011 | 1001001000000000100000000000000000 |
| 0000000010001100 | 0000000100000000100000000000000000 |
| 0000000010001101 | 0100000100000000100000000000000000 |
| 0000000010001110 | 0001000100000000100000000000000000 |
| 0000000010001111 | 1000100100000000100000000000000000 |
| 0000000010010000 | 0000010100000000100000000000000000 |
| 0000000010010001 | 0100010100000000100000000000000000 |
| 0000000010010010 | 1001000010000000100000000000000000 |
| 0000000010010011 | 1000100010000000100000000000000000 |
| 0000000010010100 | 0010010010000000100000000000000000 |
| 0000000010010101 | 0000000001000000100000000000000000 |

TBL2

FIG. 36A DATA100~149

| DATA (16BIT) | CODE SEQUENCES (34BIT) |
|---|---|
| 0000000010010110 | 0100000001000000100000000000000000 |
| 0000000010010111 | 0001000001000000100000000000000000 |
| 0000000010011000 | 1000100001000000100000000000000000 |
| 0000000010011001 | 0000010001000000100000000000000000 |
| 0000000010011010 | 0100010001000000100000000000000000 |
| 0000000010011011 | 1000010001000000100000000000000000 |
| 0000000010011100 | 0010010001000000100000000000000000 |
| 0000000010011101 | 0000000100000000100000000000000000 |
| 0000000010011110 | 0100000100000000100000000000000000 |
| 0000000010011111 | 0001000100000000100000000000000000 |
| 0000000010100000 | 1000100100000000100000000000000000 |
| 0000000010100001 | 1001000000100000100000000000000000 |
| 0000000010100010 | 1000010000100000100000000000000000 |
| 0000000010100011 | 0010010000100000100000000000000000 |
| 0000000010100100 | 1000001000100000100000000000000000 |
| 0000000010100101 | 0010001000100000100000000000000000 |
| 0000000010100110 | 0001001000100000100000000000000000 |
| 0000000010100111 | 0100100100100000100000000000000000 |
| 0000000010101000 | 0000000000100000100000000000000000 |
| 0000000010101001 | 0100000000100000100000000000000000 |
| 0000000010101010 | 0001000000100000100000000000000000 |
| 0000000010101011 | 1000100000100000100000000000000000 |
| 0000000010101100 | 0000010000100000100000000000000000 |
| 0000000010101101 | 0100010000100000100000000000000000 |
| 0000000010101110 | 1000010000100000100000000000000000 |
| 0000000010101111 | 0010010000100000100000000000000000 |
| 0000000010110000 | 0000000010000000100000000000000000 |
| 0000000010110001 | 0100000010000000100000000000000000 |
| 0000000010110010 | 0001000010000000100000000000000000 |
| 0000000010110011 | 1000100010000000100000000000000000 |
| 0000000010110100 | 1001000010000000100000000000000000 |
| 0000000010110101 | 0010010010000000100000000000000000 |
| 0000000010110110 | 0001000100000000100000000000000000 |
| 0000000010110111 | 0100100100000000100000000000000000 |
| 0000000010111000 | 0000001001000000100000000000000000 |
| 0000000010111001 | 0100001001000000100000000000000000 |
| 0000000010111010 | 0001000001000000100000000000000000 |
| 0000000010111011 | 1000100001000000100000000000000000 |
| 0000000010111100 | 0000010001000000100000000000000000 |
| 0000000010111101 | 0100010001000000100000000000000000 |
| 0000000010111110 | 1000010001000000100000000000000000 |
| 0000000010111111 | 0010010001000000100000000000000000 |
| 0000000011000000 | 1001000000010001000000000000000000 |
| 0000000011000001 | 1000010000010001000000000000000000 |
| 0000000011000010 | 0010010000010001000000000000000000 |
| 0000000011000011 | 1000001000010001000000000000000000 |
| 0000000011000100 | 0010001000010001000000000000000000 |
| 0000000011000101 | 0000100000010001000000000000000000 |
| 0000000011000110 | 0100100100010001000000000000000000 |
| 0000000011000111 | 1000100001000100100000000000000000 |

TBL2

FIG. 36B DATA150~199

| DATA (16BIT) | CODE SEQUENCES (34BIT) | DATA (16BIT) | CODE SEQUENCES (34BIT) |
|---|---|---|---|
| 0000000011001000 | 0010000010001000010000000000000000 | 0000000011111010 | 1000100100010010001000000000000000 |
| 0000000011001001 | 0000100001000100001000000000000000 | 0000000011111011 | 1000000010010010001000000000000000 |
| 0000000011001010 | 0100100001000100001000000000000000 | 0000000011111100 | 0010000010010010001000000000000000 |
| 0000000011001011 | 0000001001000100001000000000000000 | 0000000011111101 | 0000100010010010001000000000000000 |
| 0000000011001100 | 0100010010001000010000000000000000 | 0000000011111110 | 0100100010010010001000000000000000 |
| 0000000011001101 | 0001001001000100001000000000000000 | 0000000011111111 | 1001000000000010010010000000000000 |
| 0000000011001110 | 1001001000100001000000000000000000 | 0000000100000000 | 1000010000000010010010000000000000 |
| 0000000011001111 | 0000000000001000100000000000000000 | 0000000100000001 | 0010010000000010010010000000000000 |
| 0000000011010000 | 0100000010000100001000000000000000 | 0000000100000010 | 1000000010000010010010000000000000 |
| 0000000011010001 | 0001000000000100001000000000000000 | 0000000100000011 | 0010000010000010010010000000000000 |
| 0000000011010010 | 1000100000000100001000000000000000 | 0000000100000100 | 0000100100000010010010000000000000 |
| 0000000011010011 | 0000010000001000010000000000000000 | 0000000100000101 | 0100100100000010010010000000000000 |
| 0000000011010100 | 0100010000001000010000000000000000 | 0000000100000110 | 1000000010000010010010000000000000 |
| 0000000011010101 | 1000010010001000010000000000000000 | 0000000100000111 | 0010000010000010010010000000000000 |
| 0000000011010110 | 0010001010001000010000000000000000 | 0000000100001000 | 0000100010000010010010000000000000 |
| 0000000011010111 | 0000000100001000010000000000000000 | 0000000100001001 | 0100100010000010010010000000000000 |
| 0000000011011000 | 0100001010001000010000000000000000 | 0000000100001010 | 0000001000010010010010000000000000 |
| 0000000011011001 | 0001001010001000010000000000000000 | 0000000100001011 | 0100001000010010010010000000000000 |
| 0000000011011010 | 1001001010000100001000000000000000 | 0000000100001100 | 0001001001010010010010000000000000 |
| 0000000011011011 | 1000010100001000010000000000000000 | 0000000100001101 | 1001001001010010010010000000000000 |
| 0000000011011100 | 0010010100001000010000000000000000 | 0000000100001110 | 1000000000010010010010000000000000 |
| 0000000011011101 | 0001001100001000010000000000000000 | 0000000100001111 | 0010000001010010010010000000000000 |
| 0000000011011110 | 0100100100001000010000000000000000 | 0000000100010000 | 0000100001010010010010000000000000 |
| 0000000011011111 | 0000000100001000010000000000000000 | 0000000100010001 | 0100100001010010010010000000000000 |
| 0000000011100000 | 0100000010001000010000000000000000 | 0000000100010010 | 0000100010010010010010000000000000 |
| 0000000011100001 | 0001000010001000010000000000000000 | 0000000100010011 | 0100001000010010010010000000000000 |
| 0000000011100010 | 1000100010001000010000000000000000 | 0000000100010100 | 0001001000010010010010000000000000 |
| 0000000011100011 | 0000100010001000010000000000000000 | 0000000100010101 | 1001001000010010010010000000000000 |
| 0000000011100100 | 0100100010001000010000000000000000 | 0000000100010110 | 0000000100010010010010000000000000 |
| 0000000011100101 | 1000000100010000100000000000000000 | 0000000100010111 | 0100000100010010010010000000000000 |
| 0000000011100110 | 0010001001000100001000000000000000 | 0000000100011000 | 0001001001010010010010000000000000 |
| 0000000011100111 | 1000000010001000010000000000000000 | 0000000100011001 | 1001001001010010010010000000000000 |
| 0000000011101000 | 0010000000001000010000000000000000 | 0000000100011010 | 0000010010010010010010000000000000 |
| 0000000011101001 | 0000100000001000010000000000000000 | 0000000100011011 | 0100010010010010010010000000000000 |
| 0000000011101010 | 0100100000001000010000000000000000 | 0000000100011100 | 1001001000010010010010000000000000 |
| 0000000011101011 | 0000001000001000010000000000000000 | 0000000100011101 | 1001000010001001000000000000000000 |
| 0000000011101100 | 0100001000001000010000000000000000 | 0000000100011110 | 1000100010001001000000000000000000 |
| 0000000011101101 | 0001001000001000010000000000000000 | 0000000100011111 | 0010010010001001000000000000000000 |
| 0000000011101110 | 1001000100001000010000000000000000 | 0000000100100000 | 0100000001000000001000000000000000 |
| 0000000011101111 | 0000000001000010010000000000000000 | 0000000100100001 | 0001000010000010001000000000000000 |
| 0000000011110000 | 0100000001001000010000000000000000 | 0000000100100010 | 1000100010000010001000000000000000 |
| 0000000011110001 | 0001000001001000010000000000000000 | 0000000100100011 | 0000010001000010001000000000000000 |
| 0000000011110010 | 1000100000001000010000000000000000 | 0000000100100100 | 0100010001000010001000000000000000 |
| 0000000011110011 | 0000010000001000010000000000000000 | 0000000100100101 | 1000000001000010001000000000000000 |
| 0000000011110100 | 0100010000001000010000000000000000 | 0000000100100110 | 0010010000000010001000000000000000 |
| 0000000011110101 | 1000010000001000010000000000000000 | 0000000100100111 | 0000000010000010001000000000000000 |
| 0000000011110110 | 0010001000001000010000000000000000 | 0000000100101000 | 0100000010000010001000000000000000 |
| 0000000011110111 | 0000000100001000010000000000000000 | 0000000100101001 | 0001000010000010001000000000000000 |
| 0000000011111000 | 0100001000001000010000000000000000 | 0000000100101010 | 1000100010000010001000000000000000 |
| 0000000011111001 | 0001001000001000010000000000000000 | 0000000100101011 | 1000000010000010001000000000000000 |

FIG. 37A DATA200~249    TBL2

FIG. 37B DATA250~299    TBL2

| DATA (16BIT) | CODE SEQUENCES (34BIT) | DATA (16BIT) | CODE SEQUENCES (34BIT) |
|---|---|---|---|
| 0000000100101100 | 0010000100000000001000000000000000 | 0000000101011110 | 1000010001001000000100000000000000 |
| 0000000100101101 | 0000100010000000001000000000000000 | 0000000101011111 | 0010010001001000000100000000000000 |
| 0000000100101110 | 0100100010000000001000000000000000 | 0000000101100000 | 0000000010001000000100000000000000 |
| 0000000100101111 | 0000000001000000001000000000000000 | 0000000101100001 | 0100000010001000000100000000000000 |
| 0000000100110000 | 0100000001000000001000000000000000 | 0000000101100010 | 0001000010001000000100000000000000 |
| 0000000100110001 | 0001000001000000001000000000000000 | 0000000101100011 | 1000100010001000000100000000000000 |
| 0000000100110010 | 1000100001000000001000000000000000 | 0000000101100100 | 0000010010001000000100000000000000 |
| 0000000100110011 | 0000010001000000001000000000000000 | 0000000101100101 | 0100010010001000000100000000000000 |
| 0000000100110100 | 0100010001000000001000000000000000 | 0000000101100110 | 1000001010001000000100000000000000 |
| 0000000100110101 | 1000010001000000001000000000000000 | 0000000101100111 | 0010001010001000000100000000000000 |
| 0000000100110110 | 0010010001000000001000000000000000 | 0000000101101000 | 0000000110001000000100000000000000 |
| 0000000100110111 | 1000000000100000001000000000000000 | 0000000101101001 | 0100000110001000000100000000000000 |
| 0000000100111000 | 0010000000100000001000000000000000 | 0000000101101010 | 0001000110001000000100000000000000 |
| 0000000100111001 | 0000100000100000001000000000000000 | 0000000101101011 | 1001001000001000000100000000000000 |
| 0000000100111010 | 0100100000100000001000000000000000 | 0000000101101100 | 1000000001001000000100000000000000 |
| 0000000100111011 | 0000001000100000001000000000000000 | 0000000101101101 | 0010000001001000000100000000000000 |
| 0000000100111100 | 0100001000100000001000000000000000 | 0000000101101110 | 0000100001001000000100000000000000 |
| 0000000100111101 | 0001001000100000001000000000000000 | 0000000101101111 | 0100100001001000000100000000000000 |
| 0000000100111110 | 1001001000100000001000000000000000 | 0000000101110000 | 0000000001001000000100000000000000 |
| 0000000100111111 | 0000000010100000001000000000000000 | 0000000101110001 | 0100000001001000000100000000000000 |
| 0000000101000000 | 0100000010100000001000000000000000 | 0000000101110010 | 0001000001001000000100000000000000 |
| 0000000101000001 | 0001000010100000001000000000000000 | 0000000101110011 | 1000100001001000000100000000000000 |
| 0000000101000010 | 1000100010100000001000000000000000 | 0000000101110100 | 0000010001001000000100000000000000 |
| 0000000101000011 | 0000010010100000001000000000000000 | 0000000101110101 | 0100010001001000000100000000000000 |
| 0000000101000100 | 0100010010100000001000000000000000 | 0000000101110110 | 1000001001001000000100000000000000 |
| 0000000101000101 | 1000010010100000001000000000000000 | 0000000101110111 | 0010001001001000000100000000000000 |
| 0000000101000110 | 0010010010100000001000000000000000 | 0000000101111000 | 0000000101001000000100000000000000 |
| 0000000101000111 | 0000000110100000001000000000000000 | 0000000101111001 | 0100000101001000000100000000000000 |
| 0000000101001000 | 0100000110100000001000000000000000 | 0000000101111010 | 0001000101001000000100000000000000 |
| 0000000101001001 | 0001000110100000001000000000000000 | 0000000101111011 | 0100100001001000000100000000000000 |
| 0000000101001010 | 1000100110100000001000000000000000 | 0000000101111100 | 0001000001001000000100000000000000 |
| 0000000101001011 | 1000000001100000001000000000000000 | 0000000101111101 | 0100100001001000000100000000000000 |
| 0000000101001100 | 0010000001100000001000000000000000 | 0000000101111110 | 0001001001001000000100000000000000 |
| 0000000101001101 | 0000100001100000001000000000000000 | 0000000101111111 | 1001000100100100000100000000000000 |
| 0000000101001110 | 0100100001100000001000000000000000 | 0000000110000000 | 1000000000000100000100000000000000 |
| 0000000101001111 | 1000000000010000001000000000000000 | 0000000110000001 | 0010000000000100000100000000000000 |
| 0000000101010000 | 0010000000010000001000000000000000 | 0000000110000010 | 0001000000000100000100000000000000 |
| 0000000101010001 | 0000100000010000001000000000000000 | 0000000110000011 | 0100100000000100000100000000000000 |
| 0000000101010010 | 0100100000010000001000000000000000 | 0000000110000100 | 0000000010000100000100000000000000 |
| 0000000101010011 | 0000001000010000001000000000000000 | 0000000110000101 | 0100000010000100000100000000000000 |
| 0000000101010100 | 0100001000010000001000000000000000 | 0000000110000110 | 0001001000000100000100000000000000 |
| 0000000101010101 | 0001001000010000001000000000000000 | 0000000110000111 | 1001000100000100000100000000000000 |
| 0000000101010110 | 1001001000010000001000000000000000 | 0000000110001000 | 0000001000000100000100000000000000 |
| 0000000101010111 | 0000000010010000001000000000000000 | 0000000110001001 | 0100001000000100000100000000000000 |
| 0000000101011000 | 0100000010010000001000000000000000 | 0000000110001010 | 0001001000000100000100000000000000 |
| 0000000101011001 | 0001000010010000001000000000000000 | 0000000110001011 | 1000100000000100000100000000000000 |
| 0000000101011010 | 1000100010010000001000000000000000 | 0000000110001100 | 0000010000000100000100000000000000 |
| 0000000101011011 | 0000010010010000001000000000000000 | 0000000110001101 | 0100010000000100000100000000000000 |
| 0000000101011100 | 0100010010010000001000000000000000 | 0000000110001110 | 1000001000000100000100000000000000 |
| 0000000101011101 | 1001000100010000001000000000000000 | 0000000110001111 | 1100001000000100000100000000000000 |

FIG. 38A DATA300~349　　　　　　　FIG. 38B DATA350~399

CODE SEQUENCE GENERATION METHOD, MODULATION APPARATUS, MODULATION METHOD, MODULATION PROGRAM, DEMODULATION APPARATUS, DEMODULATION METHOD, DEMODULATION PROGRAM AND STORAGE MEDIUM

CROSS REFERENCES TO RELATED APPLICATIONS

The present invention contains subject matter related to Japanese Patent Application JP2005-358307 filed in the Japanese Patent Office on Dec. 12, 2005, the entire contents of which being incorporated herein by reference.

BACKGROUND OF THE INVENTION

1. Field of the Invention

The present invention relates to a code sequence generation method, modulation apparatus, modulation method, modulation program, demodulation apparatus, demodulation method, demodulation program and storage medium, and is preferably applied to an optical disc device, for example.

2. Description of the Related Art

An optical disc device is here to stay: the optical disc device records data on optical discs such as Compact Disc (CD), Digital Versatile Disc (DVD) and "Blu-ray Disc (Registered Trademark)", and reads data from the optical disc to play back.

To prevent errors of readout or the like, the optical disc device converts data into a predetermined code sequence, and then records the codes on the optical disc.

The optical disc device records data in the following manner: the optical disc device converts, in accordance with a predetermined modulation method, data into code sequences which are suitable for recording on optical discs, and records the code sequences on the optical disc. The optical disc device reproduces data in the following manner: the optical disc device reads out code sequences from the optical disc, and demodulates, in accordance with a demodulation method corresponding to the above modulation method, the code sequences to reproduce the original data.

By the way, the code sequences are recorded on an optical disc (i.e. a storage medium) in the following manner: pits with discrete length are formed on the disc along tracks. With these optical discs, channels for recording or transferring the code sequences have a predetermined frequency spectrum.

The code sequences which have been generated in accordance with a predetermined rule will have a unique frequency spectrum.

Accordingly, the optical disc device brings the code sequence's frequency spectrum close to that of the optical disc (or the channel). That is to say, in the optical disc device, the code sequences with almost the same frequency spectrum as that of the optical disc is applied. This eliminates errors of readout of the code sequences from the optical discs and the like, and improves reproduction characteristics of data.

Therefore, Matched Spectral Null (MSN) codes are disclosed in the following documents: L. Fredrickson, "Improved Trellis-Coding for Partial-Response Channels", IEEE TRANSACTIONS ONMAGNETICS, VOL 31, NO. 2, MARCH 1995; Jpn. Pat. Laid-open Publication No. H10-173536; and Jpn. Pat. Laid-open Publication No. H11-186917. In the case of MSN codes, Partial Response (PR) equalization process is performed while reproducing data, and a null point of the frequency spectrum of reproduced signals (which are after the PR equalization process is performed) and a null point of the frequency characteristics of the code sequences are matched.

SUMMARY OF THE INVENTION

In a case in which the optical disc device produces the code sequences in Non Return to Zero Inverted format (NRZI), pits are formed in association with the length of code sequence from a code of "1" to a code of "0" that is right before a next code of "1". In reality, a minimum run length d, which is the minimum number of consecutive symbols of "0" between the neighboring symbols of "1", may need to be more than one.

However, the MSN coding has no restriction on the minimum run length d, which is substantially set to zero. The optical disc device therefore does not use the MSN coding to record data on the optical discs. Thus, the optical disc device has difficulty in improving its data reproduction characteristics.

The present invention has been made in view of the above points and is intended to provide: a code sequence generation method that produces code sequences to improve data reproduction characteristics; a modulation apparatus, modulation method and modulation program which modulates data into code sequences to improve data reproduction characteristics; a demodulation apparatus, demodulation method and demodulation program which demodulates code sequences into data to improve data reproduction characteristics; and a storage medium which records code sequences to improve data reproduction characteristics.

In one aspect of the present invention, a code sequence generation method, which generates a Matched Spectral Null (MSN) code sequence where a null point of a frequency spectrum on a recording channel or communication channel of a code sequence is matched with a null point of a frequency spectrum of a Partial Response (PR) equalized signal including the code sequence, includes: a state transition diagram formation step of dividing each state on a finite state transition diagram, where a value d (d: an integer greater or equal to 1) of minimum run of the MSN code sequence is restricted and a value of Alternating Digital Sum (ADS) of the code sequence on a Not Return to Zero Inverse (NRZI) method is also restricted, into d+1 states in response to a preceding code sequence including d codes output immediately before the state comes, and restricting transition of one divided state to a next state in accordance with the preceding code sequence to form a finite division state transition diagram where output of codes on the transition to the next state is restricted; and a code sequence generation step of generating, in accordance with the finite division state transition diagram, a MSN code sequence where output of consecutive codes of "1" on the NRZI method is prohibited and a minimum run is limited to be greater or equal to one.

This creates the finite division state transition diagram that does not output consecutive codes of "1" during the state transition. Accordingly, the MSN codes where the minimum run d is limited to be greater or equal to one is generated based on the finite division state transition diagram.

In another aspect of the present invention, a modulation apparatus, a modulation method and a modulation program perform the process of modulating, in accordance with a correlation table where a data sequence with a predetermined number of bits is associated with a code sequence with a predetermined number of bits, the data sequence into the code sequence to allow a predetermined demodulation section to demodulate the code sequence into the data sequence in accordance with the correlation table, wherein the code sequence is, on NRZI method, a MSN code sequence where a null point of a frequency spectrum on a recording channel or communication channel of the code sequence is matched with a null point of a frequency spectrum of a PR equalized signal including the code sequence and a minimum run length is limited to be greater or equal to one.

This makes the code sequence modulated from the data the MSN code where the minimum run d is limited to be greater or equal to one. Accordingly, a null point of a frequency spectrum on a recording channel or communication channel is matched with a null point of a frequency spectrum of the code sequence during reproduction of the data.

In another aspect of the present invention, a demodulation apparatus, a demodulation method and a demodulation program perform the process of demodulating, in accordance with a correlation table where a data sequence with a predetermined number of bits is associated with a code sequence with a predetermined number of bits, the code sequence generated by modulating the data sequence into the data sequence, wherein the code sequence is, on NRZI method, a MSN code sequence where a null point of a frequency spectrum on a recording channel or communication channel of the code sequence is matched with a null point of a frequency spectrum of a PR equalized signal including the code sequence and a minimum run length is limited to be greater or equal to one.

Accordingly, when an original data is reproduced by demodulating the MSN codes where the minimum run d is limited to be greater or equal to one, a null point of a frequency spectrum of a recording channel and communication channel is matched with a null point of a frequency spectrum of the code sequence.

In another aspect of the present invention, a storage medium storing a code sequence with predetermined bits modulated from data with predetermined bits, wherein the code sequence is, on NRZI method, a MSN code sequence where a null point of a frequency spectrum on the storage medium is matched with a null point of a frequency spectrum of a PR equalized reproduction signal including the code sequence and a minimum run length is limited to be greater or equal to one.

Accordingly, when data is reproduced by demodulating the MSN codes where the minimum run d is limited to be greater or equal to one, a null point of a frequency spectrum of the storage medium is matched with a null point of a frequency spectrum of the code sequence.

According to an embodiment of the present invention, this creates the finite division state transition diagram that does not output consecutive codes of "1" during the state transition. Accordingly, the MSN codes where the minimum run d is limited to be greater or equal to one is generated based on the finite division state transition diagram. Thus the code sequence generation method can generate code sequences to improve data reproduction characteristics.

In addition, that makes the code sequence modulated from the data the MSN code where the minimum run d is limited to be greater or equal to one. Accordingly, a null point of a frequency spectrum on a recording channel or communication channel is matched with a null point of a frequency spectrum of the code sequence during reproduction of the data. Thus, the modulation apparatus, the modulation method and the modulation program can modulate data into code sequences to improve data reproduction characteristics.

Furthermore, when an original data is reproduced by demodulating the MSN codes where the minimum run d is limited to be greater or equal to one, a null point of a frequency spectrum of a recording channel and communication channel is matched with a null point of a frequency spectrum of the code sequence. Thus, the demodulation apparatus, the demodulation method and the demodulation program can demodulate code sequences into data to improve data reproduction characteristics.

Furthermore, when data is reproduced by demodulating the MSN codes where the minimum run d is limited to be greater or equal to one, a null point of a frequency spectrum of the storage medium is matched with a null point of a frequency spectrum of the code sequence. Thus, the storage medium can record code sequences to improve data reproduction characteristics.

The nature, principle and utility of the invention will become more apparent from the following detailed description when read in conjunction with the accompanying drawings in which like parts are designate by like reference numerals or characters.

BRIEF DESCRIPTION OF THE DRAWINGS

In the accompanying drawings:

FIGS. 8A and 8B are schematic diagrams illustrating limitation of a maximum run length and RMTR;

FIG. 9 is a schematic diagram illustrating the number of code sequences when the maximum run length is fourteen;

FIG. 10 is a schematic diagram showing the number of code sequences when the RMTR is limited to ten on a code sequence group U1;

FIG. 11 is a schematic diagram illustrating the number of code sequences when the RMTR is limited to ten on a code sequence group U2;

FIGS. 12A and 12B are schematic diagrams illustrating a correlation table of 16/26 MSN codes;

FIGS. 13A and 13B are schematic diagrams illustrating a correlation table of 16/26 MSN codes;

FIGS. 14A and 14B are schematic diagrams illustrating a correlation table of 16/26 MSN codes;

FIGS. 15A and 15B are schematic diagrams illustrating a correlation table of 16/26 MSN codes;

FIGS. 32A and 32B are schematic diagrams illustrating limitation of the maximum run length and RMTR;

FIG. 33 is a schematic diagram illustrating the number of code sequences when the maximum run length is thirty;

FIG. 34 is a schematic diagram illustrating the number of code sequences when the RMTR is limited to ten;

FIGS. 35A and 35B are schematic diagrams illustrating a correlation table of 16/34 MSN codes;

FIGS. 36A and 36B are schematic diagrams illustrating a correlation table of 16/34 MSN codes;

FIGS. 37A and 37B are schematic diagrams illustrating a correlation table of 16/34 MSN codes;

FIGS. 38A and 38B are schematic diagrams illustrating a correlation table of 16/34 MSN codes;

DETAILED DESCRIPTION OF PREFERRED EMBODIMENTS

An embodiment of the present invention will be described in detail with reference to the accompanying drawings.

(1) First Embodiment

(1-1) Overall Configuration of Optical Disc Device

Figure 1:
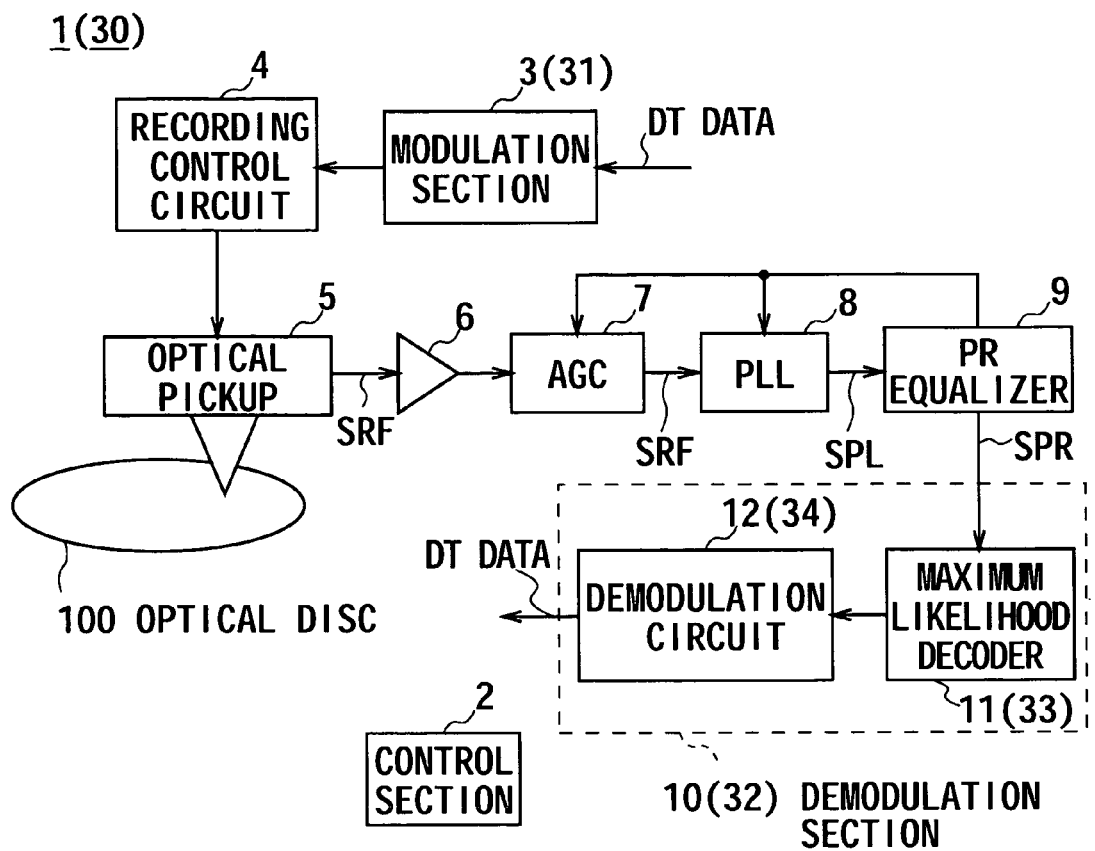
FIG. 1 is a block diagram showing the overall configuration of an optical disc device according to an embodiment of the present invention.

As shown in FIG. 1, an optical disc device 1 includes a control section 2 that takes overall control of the device 1. The optical disc device 1 records data DT on an optical disc 100. The optical disc device 1 also reproduces the data DT from the optical disc 100.

The control section 2 includes a Central Processing Unit (CPU) (not shown) as a main component. The control section 2 reads out various programs, such as control programs, from a Read Only Memory (ROM) (not shown), and loads the programs onto a Random Access Memory (RAM) (not shown) to perform processes such as recording and reproducing the data DT from the optical disc 100.

To record the data DT on the optical disc 100, the optical disc device 1 performs a modulation process through a modulation section 3 on the data DT input from outside to produce a code sequence CL, and then supplies the code sequence CL to a recording control circuit 4 (described later in detail).

The recording control circuit 4 controls, in accordance with the code sequence CL, an optical pickup 5 to emit an optical beam from the optical pickup 5 to a signal recording surface of the optical disc 100. This forms on the optical disc 100 a pit row with a pattern corresponding to the code sequence CL.

To reproduce the data DT from the optical disc 100, the optical disc device 1 under the control of the control section 2 emits a laser beam from the optical pickup 5 to the optical disc 100, and detects the reflection to reproduce a reproduction RF signal SRF by photoelectric conversion, and amplifies the reproduction RF signal SRF through an amplifier 6, and adjusts its signal level through an Auto Gain Control (AGC) circuit 7, and then supplies the reproduction RF signal SRF to a Phase Locked Loop (PLL) circuit 8.

The PLL circuit 8 synchronizes the phase of a sampling clock with a target phase (which is desirable for sampling the reproduction RF signal SRF) to produce a phase synchronization signal SPL, and then supplies the phase synchronization signal SPL to a Partial Response (PR) equalizer 9.

The PR equalizer 9 performs a PR equalization process on the phase synchronization signal SPL to produce a PR equalization signal SPR, and then supplies it to a maximum likelihood decoder 11 of a demodulation section 10. The PR equalizer 9 also supplies a feedback control signal and a phase synchronization signal to the AGC circuit 7 and the PLL circuit 8.

The maximum likelihood decoder 11 of the demodulation section 10 performs a maximum likelihood decoding process on the PR equalization signal SPR supplied from the PR equalizer 9 to create a code sequence CL, and then supplies the code sequence CL to a demodulation circuit 12.

The demodulation circuit 12 performs a demodulation process on the code sequence CL supplied from the maximum likelihood decoder 11 to generate the original data DT (described in detail below).

In this manner, the optical disc device 1 records on the optical disc 100 the code sequence CL, which is generated by modulating the data DT through the modulation section 3. The optical disc device 1 demodulates through the demodulation section 10 the code sequence CL read out from the optical disc 100 to reproduce the original data DT.

(1-2) Principle of Generating Code Sequences

(1-2-1) Frequency Spectrum and State Transition Diagram

By the way, the optical disc device 1 may utilize the following methods to perform the PR equalization process: PR(1,1), PR(1,2,1) and PR(1,2,2,1).

These PR equalization methods can be explained by the following polynomial equations using a symbol D indicating one clock delay of a sampling clock of $Z^{-1}$ on Z-transform:

$$PR(1,1): 1+D \tag{1a}$$

$$PR(1,2,1): 1+2D+D^2=(1+D)^2 \tag{1b}$$

$$PR(1,2,2,1): 1+2D+2D^2+D^3=(1+D+D^2)(1+D) \tag{1c}$$

Figure 2:
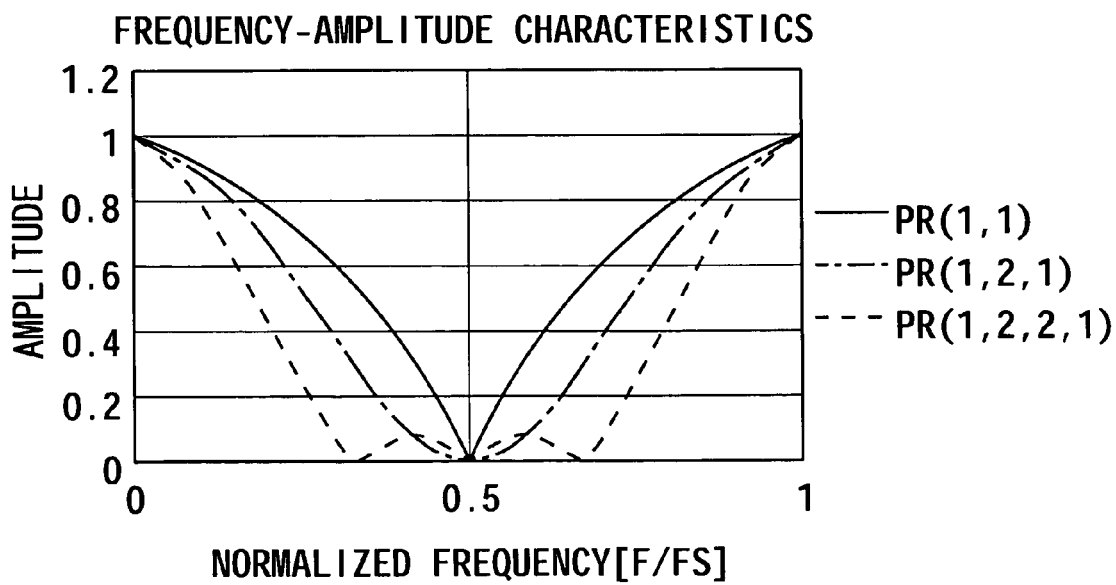
FIG. 2 is a schematic diagram illustrating the frequency spectrums of optical discs.

By the way, if three types of PR equalization methods (PR(1,1), PR(1,2,1) and PR(1,2,2,1)) are used for the optical disc 100 (which is equivalent to a recording channel), there may be a frequency spectrum as shown in FIG. 2. In this case, each frequency spectrum is normalized by sampling frequency fs about the direction of a frequency axis.

As shown in FIG. 2, on any frequency spectrums produced by the PR equalization methods, the amplitude is zero at Nyquist frequency which is one-half of the sampling frequency fs. That is to say, there is a null point at the Nyquist frequency.

This is because the polynomial equations (1a) to (1c) for the PR equalization process have a component of (1+D) which is a characteristic to have a null point at the Nyquist frequency.

The following method to synchronize the frequency spectrums may improve reproduction characteristics on the optical disc 100: the code sequence CL to be recorded on the optical disc 100 is produced such that its frequency spectrum has a null point at the Nyquist frequency, which is to say the code sequence CL is generated to be Matched Spectral Null (MSN) codes.

For example, the above Patent Document 2 discloses a typical method of generating MSN codes: in a case in which codes are expressed in Non Return to Zero Inverted (NRZI), by using a Finite State Transition Diagram (FSTD) which is a kind of state transition diagram restricted, the symbols of "1" and "0" are represented by the symbols of "+1" and "−1", respectively. In this manner, this method puts limitation on Running Digital Sum (RDS) which is a total of consecutive symbols from the start.

On the other hands, Lyle J. Fredrickson, "On the Shannon Capacity of DC- and Nyquist-Free Codes", IEEE TRANSACTIONS ON INFORMATION THEORY, VOL 37, NO. 3, MAY 1991, discloses a FSTD: in a case in which codes are expressed in Non Return to Zero (NRZ), the symbols of "1" and "0" are represented by the symbols of "+1" and "−1", respectively; in a case in which every one bit is multiplied by "−1", Alternate Digital Sum (ADS) and RDS, which are a total of consecutive symbols from the start, have been taken into consideration.

By the way, the above ADS is used as a target for evaluation of Nyquist frequency. If the ADS of the code sequence is within a predetermined range, the frequency spectrum of the code sequence has a null point at the Nyquist frequency.

Figure 3:
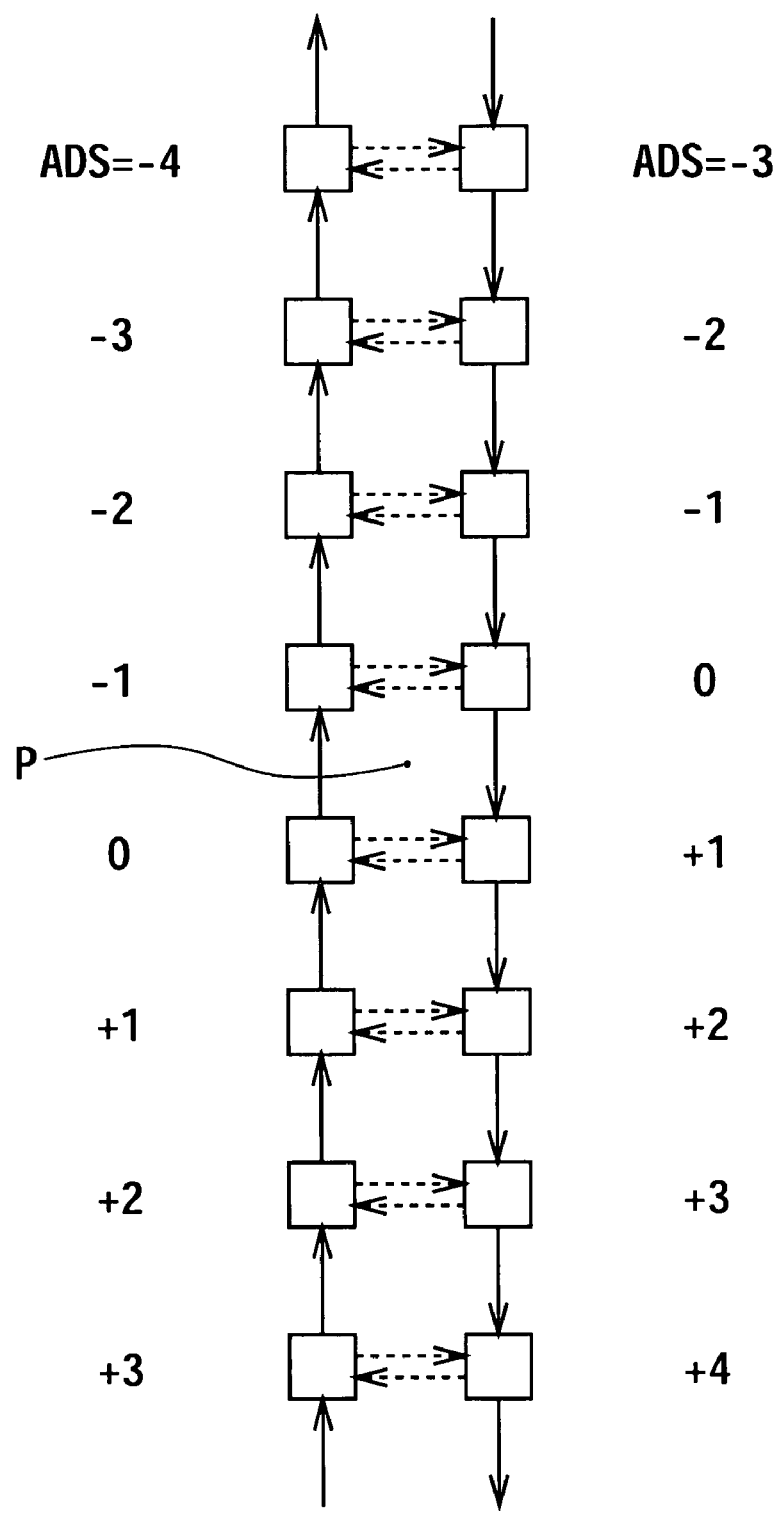
FIG. 3 is a schematic diagram illustrating a FSTD where ADS is restricted.

Accordingly, on the code sequence generation method according to an embodiment of the present invention, to produce a code sequence having a null point at the Nyquist frequency, a FSTD is produced to express symbols in NRZI and to put limitation only on the ADS as shown in FIG. 3.

In FIG. 3, rectangular objects represent states. Solid lines with arrows mean producing symbols of "1" on NRZI from one state to next state. Dotted lines with allows mean producing symbols of "0" on NRZI from one state to next state. The values of ADS are shown near each state.

Figure 4:
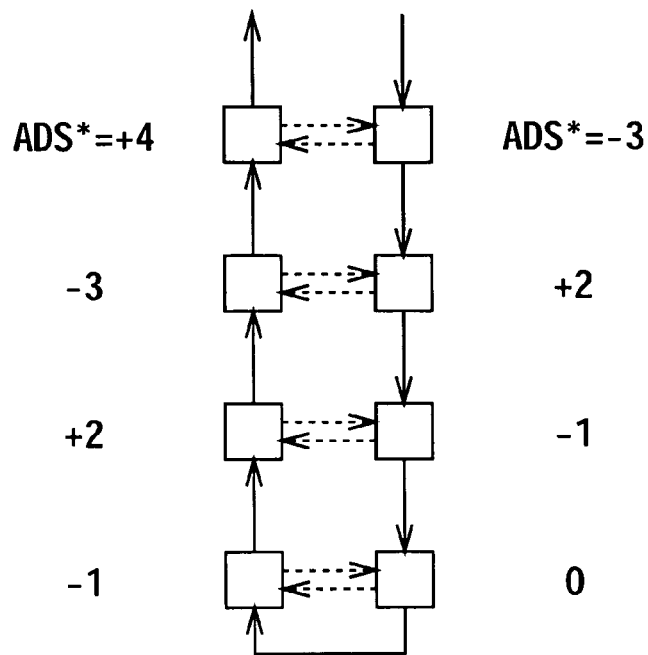
FIG. 4 is a schematic diagram illustrating a reduced-type FSTD where ADS* is restricted.

The FSTD shown in FIG. 3 can be regarded as a symmetrical shape about a center point P as for the values of ADS. As shown in FIG. 4, the reduced FSTD (also referred to as a "reduced-type FSTD) can be produced by folding up and caracoling the FSTD at the center point P such that the states having the same absolute values of ADS are overlapped.

By the way, in FIG. 4, instead of ADS, there are the values of ADS*. The ADS* is equivalent to ADS' in Makoto, Noda, "A New DC- and Nyquist-Free Trellis Code for Partial Response Class-1 and Class-2 Channels", IEEE TRANSACTIONS ON MAGNETICS, VOL 37, NO. 2, MARCH 2001.

(1-2-2) State Transition Diagram with Restriction: Minimum Run Length d=1

By the way, as mentioned above, the code sequence CL is recorded on the optical disc 100 in the following manner: pits with discrete lengths are formed on the optical disc 100 along a predetermined track in accordance with the code sequence CL. Therefore, the minimum run length d of the code sequence CL, which is the minimum number of consecutive symbols of "0" between the symbols of "1" on NRZI, may need to be greater or equal to one.

Accordingly, in the code sequence generation method according to an embodiment of the present invention, the minimum run length d is limited to one. To limit the minimum run length d to one on the FSTD (FIG. 3), the consecutive symbols of "1" is prohibited. That is to say, it always generates a symbol of "0" after a symbol of "1", and a symbol of "0" or "1" after a symbol of "0".

That is to say, in FIG. 3, after it comes to a certain state through a solid line with an arrow, it then moves to a next state through a dotted line with an arrow. If it comes to a certain state through a dotted line with an arrow, it then moves to a next state through a dotted line with an arrow or a solid line with an arrow.

In this case, limitation of the minimum run length d to one means that there is at least one symbol of "0" before a symbol of "1". Therefore, a preceding symbol is focused.

Accordingly, based on the FSTD shown in FIG. 3, one state can be divided into two states: a state that comes through a dotted line with an arrow, and a state that comes through a solid line with an arrow. In this manner, the divided-type FSTD is created as show in FIG. 5.

In other words, to generate the divided-type FSTD (FIG. 5), the FSTD (FIG. 3) is divided into the following two states: a state that comes immediately after generating a symbol of "0", and a state that comes immediately after generating a symbol of "1".

Figure 5:
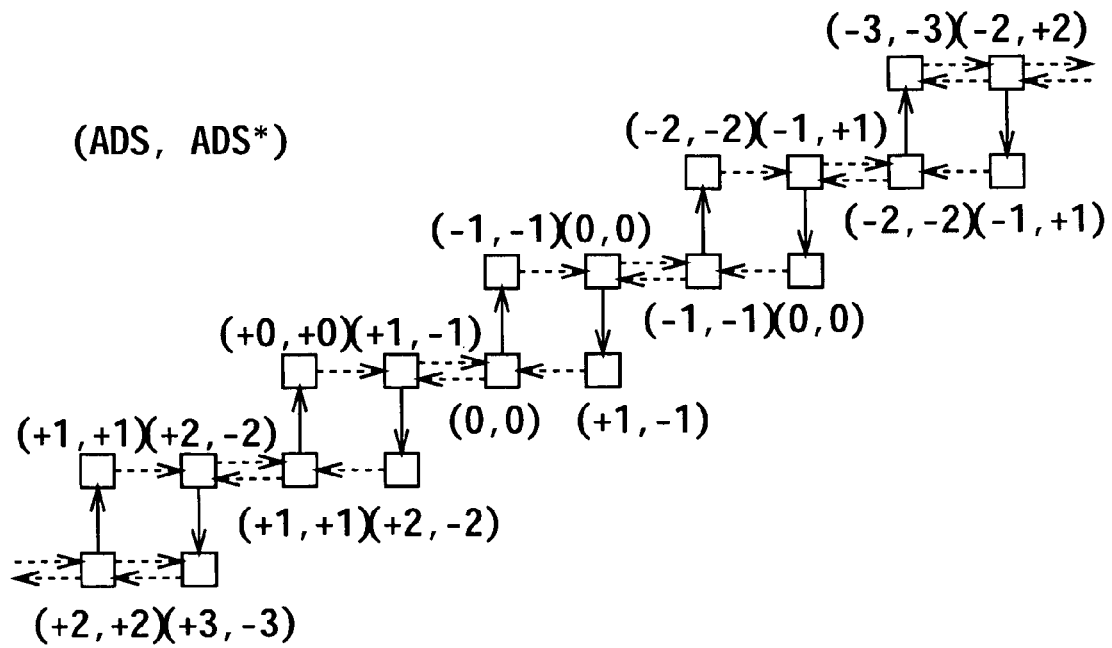
FIG. 5 is a schematic diagram illustrating a divided-type FSTD after dividing one state into two states.

In addition, in a similar way to that of FIG. 5, based on the reduced-type FSTD shown in FIG. 4, one state can be divided into two states: a state that comes through a dotted line with an arrow, and a state that comes through a solid line with an arrow. In this manner, the divided-and-reduced-type FSTD is created as show in FIG. 6.

In the divided-and-reduced-type FSTD (FIG. 6), there is a state that comes through a dotted line with an arrow: there are two types of lines (dotted and solid lines with arrows) output from the states s1, S2, s5, s6 and s9. This shows the fact that a symbol of "0" or "1" is generated after a symbol of "0".

In addition, in the divided-and-reduced-type FSTD (FIG. 6), there is a state that comes through a solid line with an arrow: there are only one type of lines (dotted lines with arrows) output from the states s0, S3, s4, s7 and s8. This shows the fact that a symbol of "0" is generated right after a symbol of "1".

That is to say, the divided-type FSTD (FIG. 5) and the divided-and-reduced-type FSTD (FIG. 6) prevent consecutive symbols of "1". This means that the minimum run length d is always limited to one. In other words, the divided-type FSTD (FIG. 5) and the divided-and-reduced-type FSTD (FIG. 6) puts limitation on the minimum run length d such that the minimum run length d becomes one, based on the FSTD (FIG. 3) and reduced-type FSTD (FIG. 4) capable of producing the MSN codes with the minimum run length d=0.

Therefore, the code sequence generated by the divided-type FSTD (FIG. 5) and the divided-and-reduced-type FSTD (FIG. 6) is the MSN codes with the minimum run length d=1.

In this manner, the code sequence generation method according to an embodiment of the present invention divides up one state in the FSTD into two states: a state that comes immediately after generating a symbol of "0", and a state that comes immediately after generating a symbol of "1". This helps creating the divided-type FSTD and divided-and-reduced-type FSTD that can produce the code sequence CL of MSN codes with the minimum run length d=1.

(1-2-3) Limitation on Transition Range and Determination of Code Length

By the way, the divided-and-reduced-type FSTD (FIG. 6) is to produce the code sequence. In a case in which it performs the state transition n times to move from an initial state to an end state, the divided-and-reduced-type FSTD produces a symbol of "0" or "1" each time it passes the •dotted or solid line. This finally creates the n-length code sequence.

In the divided-and-reduced-type FSTD (FIG. 6), there are two choices to go to a next state from the states (s1, s2, s5, s6, and s9) which come through the dotted line: the dotted line with arrow, or the solid line with arrow. This means there is a plurality of paths to move to another state.

In the divided-and-reduced-type FSTD (FIG. 6), if the initial state and the end state are the same, all the generated code sequence will have the same initial and end states. Therefore, any code sequences can follow any code sequences.

If a certain modulation method converts m-bit data (m: an integer more than one) into n-bit code sequence (n: an integer more than one), it may need code sequences for $2^{16}$ (=65536) patterns of data if the number of bits m is set to 16 in consideration of the processing load of actual modulation process.

Accordingly, the following experiment has been done: under the condition where the initial state and the end state are the same in the divided-and-reduced-type FSTD (FIG. 6), the range of state transition and the code length n are changed in various ways, and the number of types of code sequence is counted.

Figure 6:
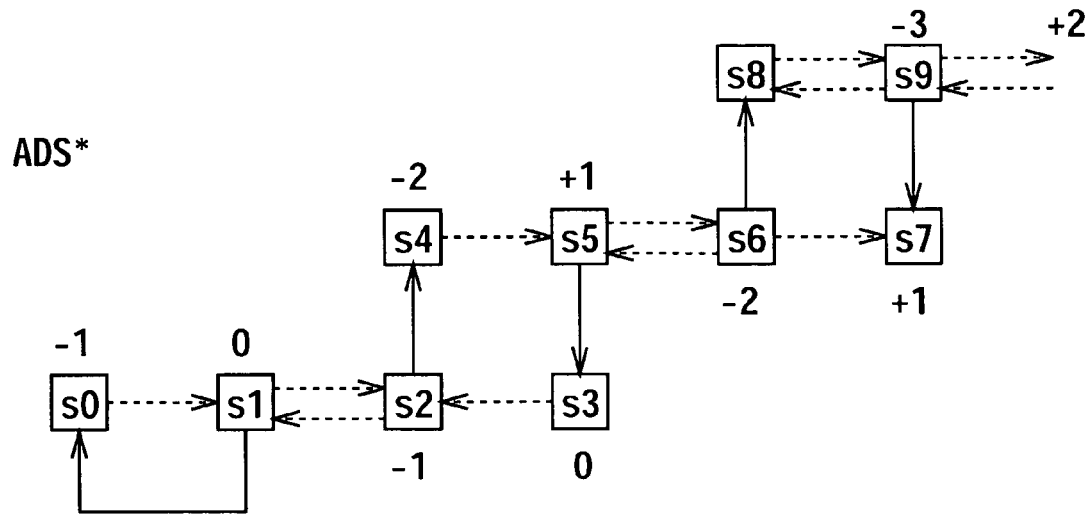
FIG. 6 is a schematic diagram illustrating a divided-and-reduced-type FSTD after dividing one state into two states.
Figure 7:
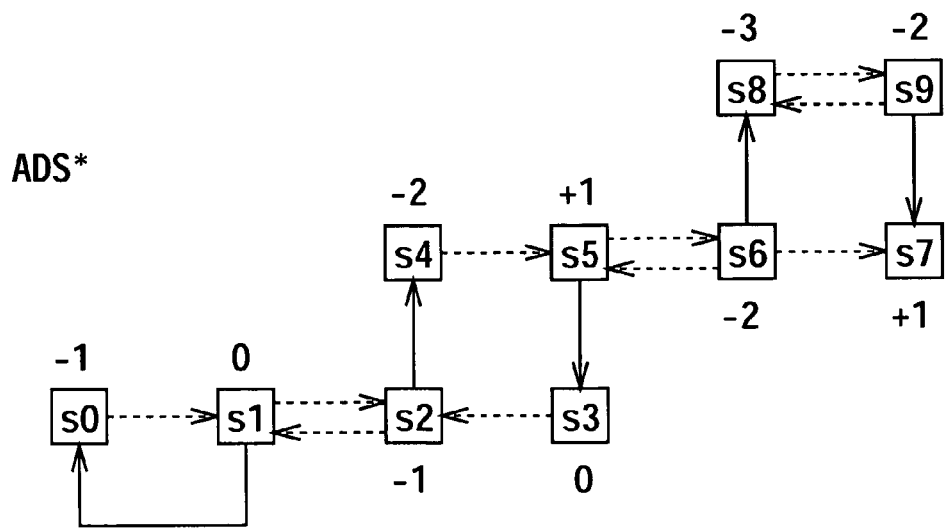
FIG. 7 is a schematic diagram illustrating a 16/26 divided-and-reduced-type FSTD where a minimum run length is limited to one.

The result is this: as shown in FIGS. 6 and 7 (which are in a condition N0 where the state transition of the divided-and-reduced-type FSTD is in the range of 0 to −3 (ADS*), or in the range of s0 to s9, and both the initial and end states are the state s1, and the code length n is 26), that produces more than 65536 code sequences, or 70846 code sequences. That is to say, it produces codes of m/n=16/26. The group of 70846 MSN codes will be also referred to as a "code sequence group U0". The divided-and-reduced-type FSTD shown in FIG. 7 will be also referred to as a "16/26 divided-and-reduced-type FSTD".

By the way, in this case, because the ADS* of state s1 is zero and the state S1 comes immediately after a symbol of "0", the state s1 is applied to as the initial and end states.

In this manner, the code sequence generation method according to an embodiment of the present invention performs, in accordance with the 16/26 divided-and-reduced-type FSTD (FIG. 7), the state transition under the condition where the number of times of state transition n is set to twenty six and the initial and end states are the same. This produces more than 65536 code sequences, or 70846 code sequences CL of MSN codes with the code length n=26 bits and the minimum run length d=1.

(1-2-4) Selection of Code Sequence with Limitation of Maximum Run Length k

The PLL circuit 8 of the optical disc device 1 performs a synchronization process on the code sequence CL read out from the optical disc 100. If the symbol transition of "0" to "1" or "1" to "0" is performed more often, it may be easy for the PLL to perform the synchronization process.

Accordingly, it is preferable that a maximum run length k (which is the maximum number of run length on the code sequence CL or the minimum length of consecutive symbols of "0") be as short as possible.

Therefore, when, out of 70846 code sequences CL in the code sequence group U0, 65536 code sequences CL are extracted to be used as 16/26 codes, the selection is done so as to make the maximum run length k as short as possible.

For instance, as shown in FIG. 8A, the top, middle and end parts of the code sequence CL (with code length n=26) are focused; the maximum consecutive number of symbol "0" which starts from the top part of the code sequence CL is referred to as "precursor RUN"; the maximum consecutive number of symbol "0" which continues to the end part of the code sequence CL is referred to as "postcursor RUN"; and the maximum consecutive umber of symbol "0" on the middle part of the code sequence CL (except the precursor RUN and the postcursor RUN) is referred to as "middle RUN".

To put limitation on the maximum run length k, the following two patters may need to be taken into consideration: consecutive parts in one code sequence CL, and consecutive parts in two consecutive code sequences CL. Accordingly, in reality, the middle RUN and (precursor RUN+postcursor RUN) are restricted.

In addition, the following experiment has been done: under the condition where the values of the precursor RUN, middle RUN and post cursor RUN are changing, it is investigated how many code sequences CL exist that matches the limitation of the precursor RUN, middle RUN and postcursor RUN out of the code sequences CL in the code sequence group U0.

The result is this: as shown in FIG. 9 where the maximum run length k=14, there are 66142 (more than 65536) code sequences CL that matches a condition N1 where the middle RUN is fourteen, the precursor RUN is six and the postcursor RUN is eight. This group of code sequences CL will be also referred to as a "code sequence group U1".

By the way, in FIG. 9, hatched areas indicate that there are more than 65536 code sequences CL.

In addition, as shown in FIG. 9, out of the code sequences CL in the code sequence group U0, there are 66142 (more than 65536) code sequences CL that matches a condition N2 where the middle RUN is fourteen, the precursor RUN is seven and the postcursor RUN is seven. This group of code sequences CL will be also referred to as a "code sequence group U2".

By the way, as shown in FIG. 9 where the values of the precursor RUN, middle RUN and postcursor RUN are changed in various ways with the maximum run length k=14, the number of code sequences CL in the code sequence groups U1 and U2 becomes maximum under the conditions N1 and N2.

In a case in which the values of the precursor RUN, middle RUN and postcursor RUN are changed in various ways with the maximum run length k<14, the number of code sequences CL that matches the limitation of the precursor RUN, middle RUN and postcursor RUN is less than 65536 in any cases. This means that that does not produce 16/26 MSN codes.

In a case in which the values of the precursor RUN, middle RUN and postcursor RUN are changed in various ways with the maximum run length k>14, the number of code sequences CL that matches the limitation of the precursor RUN, middle RUN and postcursor RUN can be more than 65536 in some cases. However, the maximum run length k is set to fourteen in this case because it is preferable to make the maximum run length k as short as possible.

In this manner, in an embodiment of the present invention, the top, middle and end parts of code sequence CL are focused; and it puts limitation on the values of the precursor RUN, middle RUN and postcursor RUN. Accordingly, in a case in which the maximum run length k is fourteen under the condition N1 or N2, the code sequence group U1 or U2 with 66142 (>65536) code sequences CL is generated.

(1-2-5) Extraction of Code Sequence with Limitation on RMTR

In a case in which pits are formed on the optical disc 100 based on the code sequence CL that has been generated under the condition of the minimum run length d=1, the shortest pit will be "2T" corresponding to the code sequence of "10". Accordingly, when this shortest pit is read by the optical pickup 5 of the optical disc device 1 (FIG. 5), the wave length of the reproduction RF signal SRF will be the shortest.

As noted by Jpn. Pat. Laid-open Publication No. H11-346154, it is desirable to prevent the repetition of the reproduction RF signals SRF with shortest wave length while the optical disc device 1 is reproducing the signals from the optical disc 100. In other words, it is desirable that the repetition of the code sequences of "10" be minimized.

Accordingly, an embodiment of the present invention is to extract the code sequences CL in which the maximum number of repetition of the code sequences of "10" (RMTR: Repeated Minimum Transition Run-length) is limited, out of the code sequences CL in the code sequence groups U1 and U2 with the maximum run length k=14. The code sequences of "10" will be also referred to as the "shortest run code sequence".

For example, as shown in FIG. 8B, there are two cases: a case in which the top of the code sequence CL is "1", and a case in which the top of the code sequence CL is "0". In addition, on the code sequence CL with code length n=26, its top, middle and end parts are focused.

In a case in which the top of the code sequence CL is "1", the RMTR that starts from the top part is also referred to as "precursor positive RMTR" if the top part of the code sequence CL is "101 . . . "; the RMTR that continues to the end part is also referred to as "postcursor positive RMTR" if the end part of the code sequence CL is " . . . 010"; and the RMTR on the middle part (except those top and end parts where the shortest run code sequences appear repeatedly) is also referred to as "middle positive RMTR" if the top part of the code sequence CL is "101 . . . ".

In a case in which the top of the code sequence CL is "0", the RMTR that starts from the top part is also referred to as "precursor negative RMTR" if the top part of the code sequence CL is "010 . . . "; the RMTR that continues to the end part is also referred to as "postcursor negative RMTR" if the end part of the code sequence CL is " . . . 101"; and the RMTR on the middle part (except those top and end parts where the shortest run code sequences appear repeatedly) is also referred to as "middle negative RMTR" if the top part of the code sequence CL is "010 . . . ".

However, on the 16/26 divided-and-reduced-type FSTD (FIG. 7), the end state of the code sequence CL becomes s1. This means that the code sequence CL won't be " . . . 101" because the last symbol is always "0". Accordingly, we can leave the above postcursor negative RMTR out of consideration.

In this case, putting limitation on the RMTR means limiting the middle positive RMTR and (postcursor positive RMTR+1+precursor positive RMTR), and limiting the middle negative RMTR and also limiting the precursor negative RMTR.

By the way, on (precursor positive RMTR+1+postcursor positive RMTR) and (precursor negative RMTR+1+postcursor negative RMTR), "1" is added to them. This is to form the shortest run code sequence using a last symbol of "1" of a certain code sequence CL and a top symbol of "0" of the next code sequence CL.

The following experiment has been done: in a case in which the precursor positive RMTR, middle positive RMTR, postcursor positive RMTR, precursor negative RMTR and middle negative RMTR are changed in various ways in a similar way to the case in which the maximum run length k is limited, out of the code sequences CL in the code sequence groups U1 and U2, it is investigated that how many code sequences CL exist that match the limitation of the precursor positive RMTR, middle positive RMTR, postcursor positive RMTR, precursor negative RMTR and middle negative RMTR.

The result is this: as shown in FIG. 10 where the RMTR is ten, out of the code sequences CL in the code sequence group U1, there are 65725 (>65536) code sequences CL that matches a condition N3 where the middle positive RMTR is ten, the precursor positive RMTR is four, the postcursor positive RMTR is five, the precursor negative RMTR is ten and the middle negative RMTR is ten. This group of code sequences CL will be also referred to as a "code sequence group U3".

By the way, in FIG. 10, hatched areas indicate that there are more than 65536 code sequences CL.

By the way, as shown in FIG. 10 where the RMTR is ten, under the condition N3, the number of code sequences CL in the code sequence group U3 is the largest. When the RMTR is less or equal to nine, there are less than 65536 code sequences CL. Therefore, the RMTR is set to ten as the minimum RMTR to produce more than 65536 code sequences CL.

In addition, as shown in FIG. 11 (another part of the experiment result) where the RMTR is ten, out of the code sequences CL in the code sequence group U2, there are more than 65536 code sequences, or 65723 code sequences CL, that match a condition N4 where the middle positive RMTR is ten, the precursor positive RMTR is four, the postcursor positive RMTR is five, the precursor negative RMTR is ten, and the middle negative RMTR is 10. This group of code sequences CL will be also referred to as a "code sequence group U4".

By the way, in FIG. 11, hatched are indicate that there are more than 65536 code sequences CL, in a similar way to that of FIG. 10.

By the way, as shown in FIG. 11 where the RMTR is ten, under the condition N4, the number of code sequences CL in the code sequence group U4 is the largest. When the RMTR is less or equal to nine, there are less than 65536 code sequences CL. Accordingly, the RMTR is set to ten as the minimum RMTR to produce more than 65536 code sequences CL.

In this manner, the code sequence generation method according to an embodiment of the present invention focuses the top, middle and end parts of the cord sequence CL, and put limitation on the values of the precursor positive RMTR, middle positive RMTR, postcursor positive RMTR, precursor negative RMTR and middle negative RMTR. This helps producing the code sequence groups U3 or U4 with 65725 or 65723 code sequences CL (with the RMTR=10) when applying the conditions N3 and N4 to the code sequence groups U1 and U2.

(1-2-6) Correlation Table

In an embodiment of the present invention, out of the code sequence group U3 (with 65725 code sequences CL which are more than $2^{16}$=65536) and the code sequence group U4 (with 65723 code sequences CL which are more than $2^{16}$=65536), especially from the code sequence group U3 whose code sequences are more than those of the code sequence group U4, the 65536 26-bit code sequences are selected, and then each of them is associated with 16-bit data DT.

The 65536 code sequences CL each of which has been associated with the data DT will be also referred to as "16/26 MSN codes MC1".

By the way, the 16/26 MSN codes MC1 are block codes, each of which is independent from one another.

For example, the modulation section 3 and demodulation section 10 of the optical disc device 1 (FIG. 1), as shown in FIGS. 12 to 15 (a part of it), stores the 16/26 MSN codes MC1 as a correlation table TBL1 where 16-bit data DT is associated with 26-bit code sequence CL. The modulation section 3 and demodulation section 10 check the correlation table TBL1 when needed.

(1-3) Principle of Detecting Code Sequences

By the way, as mentioned above, the maximum likelihood decoder 11 of the optical disc device 1 (FIG. 1) performs, based on the PR equalization signal SPR produced by the PR equalizer 9, a maximum likelihood decoding process to produce the code sequences CL.

For example, the most likelihood decoder 11 performs a maximum likelihood decoding process corresponding to Trellis Coded Partial Response Maximum Likelihood (TCPRML). In this case, the most likelihood decoder 11 performs a Viterbi decoding process to determine a maximum likelihood path on a trellis diagram. This trellis diagram may need to correspond to the code sequence CL.

The following describes the trellis diagrams each of which is set for each type of PR equalization method to perform a time varying trellis coded maximum likelihood detection process corresponding to the 16/26 MSN codes MC1.
(1-3-1) PR(1,1+x,x)
In the case of the equalization method of PR(1,1+x,x) (x: any real number), the PR state transition diagram with the limitation of the minimum run length d=1 includes the combination of the states based on the symbols that appeared at two previous points in time, as shown in FIG. 16A.

Figure 16A:
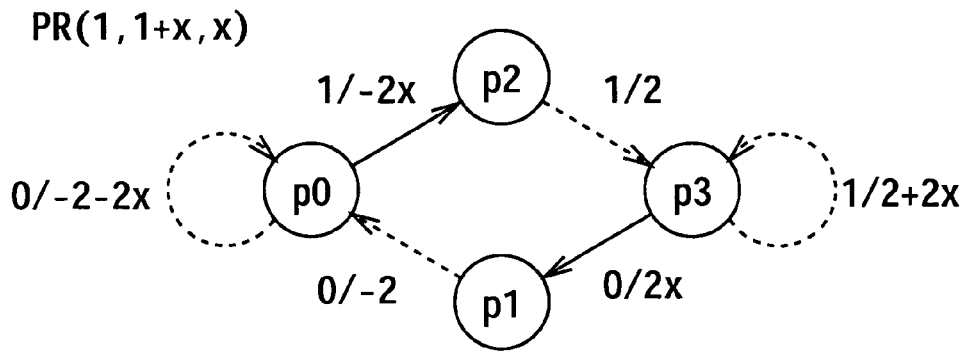
FIGS. 16A to 16C are schematic diagrams illustrating a state transition diagram of PRML where the minimum run length is restricted.
Figure 17:
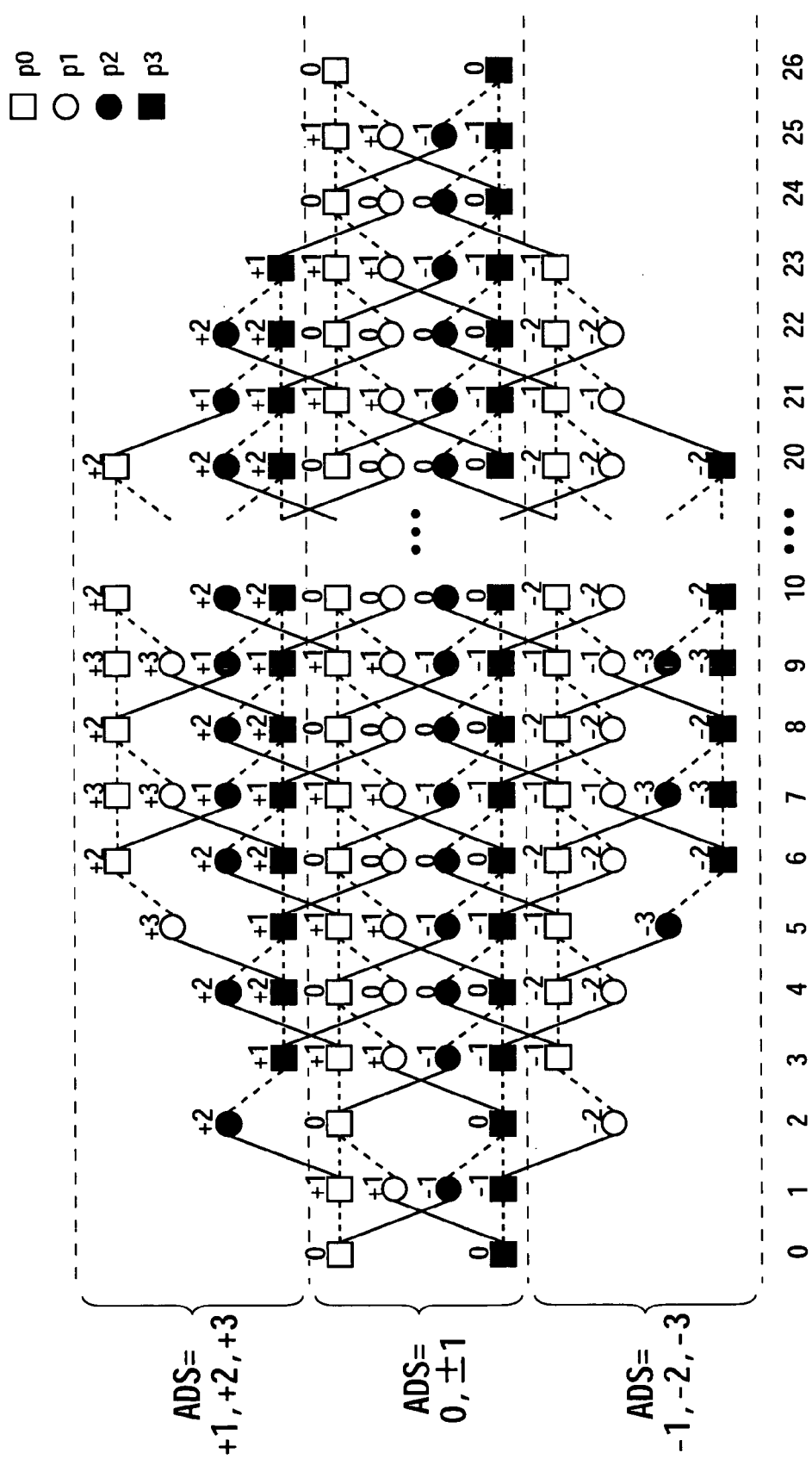
FIG. 17 is a schematic diagram illustrating a trellis diagram when the PR state transition where the minimum run length is limited to 1 is combined with the values of ADS.

The state transition diagram shown in FIG. 16A is combined with the values of ADS of each state of the divided-type FSTD (FIG. 5) to produce a trellis diagram as shown in FIG. 17. In FIG. 17, the shape of objects is associated with the state of PR. The values of ADS are shown near the objects.

By the way, as noted above, the 16/26 MSN codes MC1 are created by starting from the state S1 on the 16/26 divided-and-reduced-type FSTD (FIG. 7). Accordingly, on the state transition diagram (FIG. 16A), the initial state is the state p0 or p3 to perform the state transition and to create the code sequences CL.

Accordingly, the trellis diagram (FIG. 17) only shows the paths from the states p0 and p3. The paths whose initial state is the state p1 or p2 are omitted.

In this manner, in an embodiment of the present invention, in the case of the equalization method of PR(1,1+x,x), the PR state transition diagram with the limitation of the minimum run length d=1 is combined with the values of ADS of each state of the divided-type FSTD. This produces the trellis diagram shown in FIG. 17.
(1-3-2) PR(1,1)
In the case of the equalization method of PR(1,1), the PR state transition diagram with the limitation of the minimum run length d=1, as shown in FIG. 16B, includes the combination of the states corresponding to the symbols that appeared at two previous points in time.

Figure 16B:
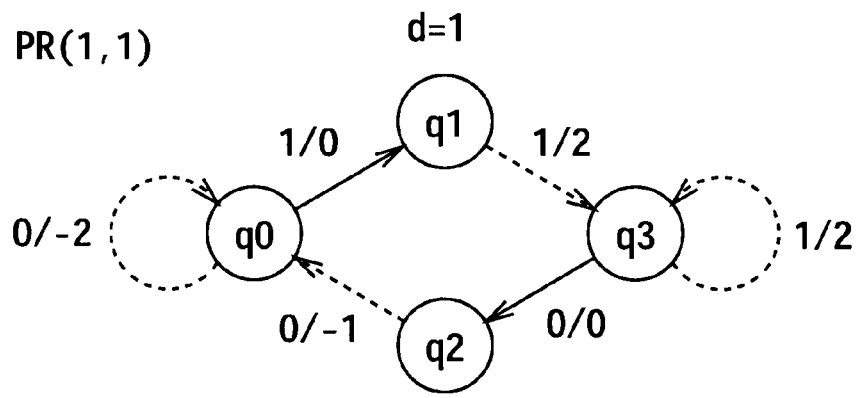

The configuration shown in FIG. 16B is almost the same as that of FIG. 16A, or PR(1,1+x,x). Accordingly, even in the case of the equalization method of PR(1,1), the trellis diagram (FIG. 17) can be produced in the similar way to that of PR(1,1+x,x).
(1-3-3) PR(1,1+a,a+b,b)
In the case of the equalization method of PR(1,1+a,a+b,b) (a and b: any real number), the PR state transition diagram with the limitation of the minimum run length d=1 includes the combination of the states corresponding to the symbols that appeared at three previous points in time, as shown in FIG. 16C.

Figure 16C:
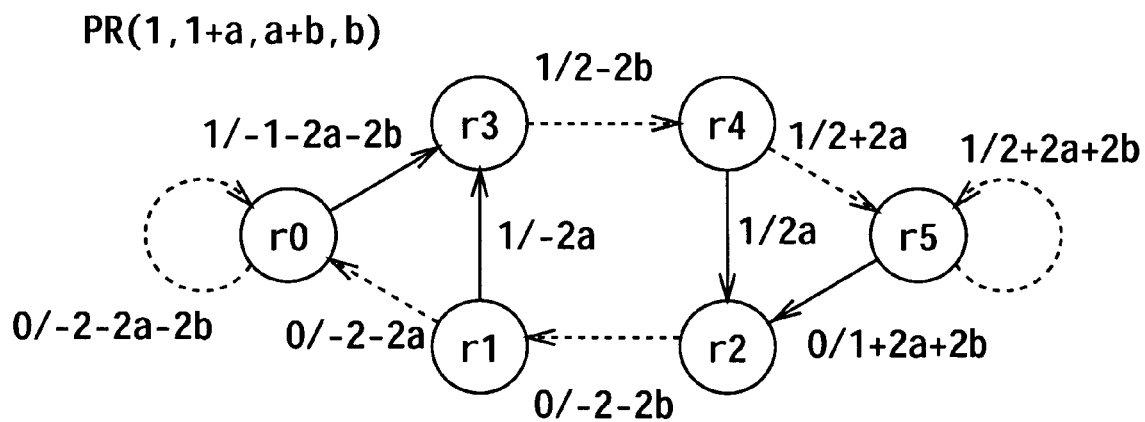

The state transition diagram shown in FIG. 16C is combined with the values of ADS of each state of the divided-type FSTD (FIG. 5). This produces a trellis diagram shown in FIG. 18. By the way, in FIG. 18, the shape of objects is associated with the state of PR. The values of ADS are shown near the objects.

By the way, as mentioned above, the 16/26 MSN codes MC1 are generated by starting from the state s1 of the 16/26 divided-type FSTD (FIG. 7). Therefore, on the state transition diagram in FIG. 16C, the state r0, r1, r4 or r5 becomes the initial state, and then the code sequences CL are generated by performing the state transition.

Accordingly, on the trellis diagram in FIG. 17, only the path from the state r0, r1, r4 or r5 is shown. Some paths, which would exist if the state r2 or r3 is the initial state, are omitted.

Figure 18:
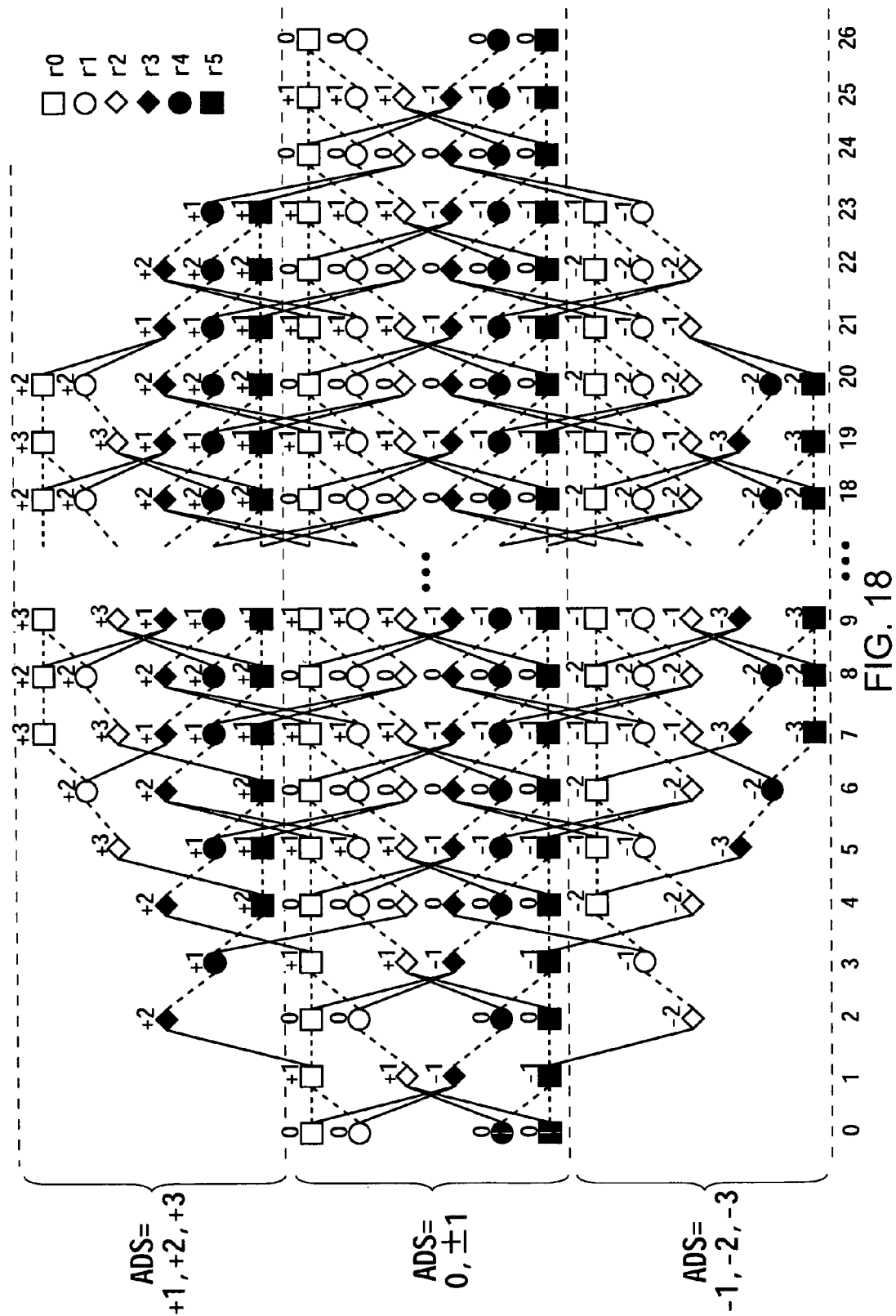
FIG. 18 is a schematic diagram illustrating a trellis diagram when the PR state transition where the minimum run length is limited to 1 is combined with the values of ADS.

In this manner, in an embodiment of the present invention, even if the equalization method is PR(1,1+a,a+b,b), the PR state transition diagram with the limitation of minimum run length d=1 is combined with the values of ADS of each state of the divided-type FSTD to produce the trellis diagram shown in FIG. 18, in a similar way to that of PR(1,1+x,x).

(1-4) Configuration of Modulation Section

The following describes the modulation section 3 of the optical disc device 1 (FIG. 1). The modulation section 3 performs so-called Direct Current (DC) control to bring the values of Digital Sum Value (DSV) close to zero, in addition to the modulation process of converting 16-bit data DT into 26-bit code sequences CL of MSN codes.

As noted by the Patent Document 3 where the codes are expressed in the NRZI method, the DC control for the code sequences is performed in the following method (this method will be also referred to as "DSV relation method"): the remainder after numerical division of 'the number of symbols of "1" in data' by two (i.e. 'the number of symbols of "1" in data' modulo 2) is matched with the remainder after numerical division of 'the number of symbols of "1" in a code sequence' by two (i.e. 'the number of symbols of "1" in a code sequence' modulo 2); DSV of the data is related to DSV of the code sequence; and the DC control is performed to the data.

If the 16-bit data DT is associated with the code sequence CL like the 16/26 MSN codes MC1, the number of code sequences CL in which the number of symbols of "1" is even may need to be more than $2^{15}$ (=32768) and the number of code sequences CL in which the number of symbols of "1" is odd may also need to be more than $2^{15}$ (=32768) to apply the above DSV relation method.

However, in the above code sequence group U3, the number of code sequences CL in which the number of symbols of "1" is even is 33349 (>32768), and the number of code sequences CL in which the number of symbols of "1" is odd is 32376 (<32768). In this manner, it seems difficult to perform the DSV relation method due to lack of the code sequences CL in which the number of symbols of "1" is odd.

In addition, the above DSV relation method will probably not attain the desired effect because the result has not been verified logically.

Accordingly, the modulation section 3 performs the DC control for the code sequences CL in a different manner.

(1-4-1) Circuit Configuration of Modulation Section

Figure 19:
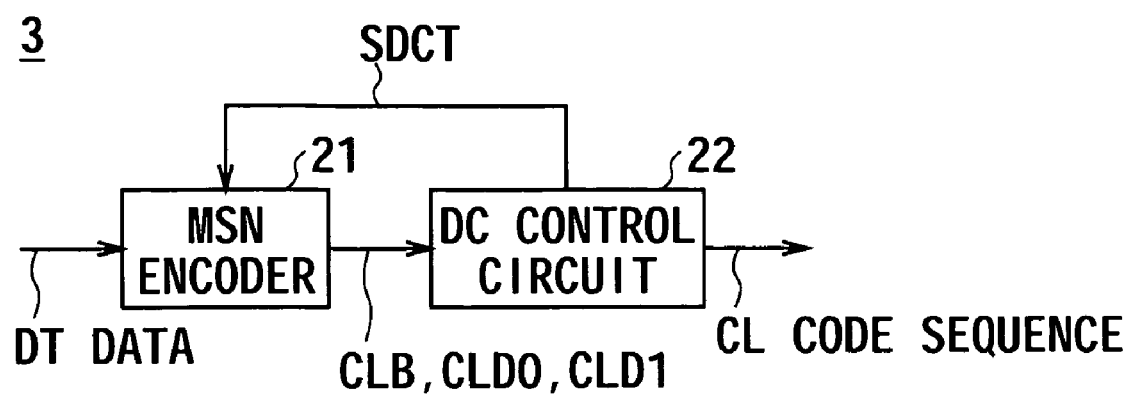
FIG. 19 is a block diagram illustrating the configuration of a modulation section according to a first embodiment of the present invention.

As shown in FIG. 19, the modulation section 3 includes a MSN encoder 21, which performs the modulation process, and a DC control circuit 22, which performs the DC control for the code sequences CL.

The MSN encoder 21, for example, includes a CPU (not shown) as it main component. The MSN encoder 21 reads out various programs, such as a code sequence generation program, from a ROM (not shown), and loads the programs onto a RAM (not shown) to perform the modulation process to convert the data DT into the code sequences CL.

The MSN encoder 21 stores the above correlation table TBL1 in the ROM (not shown). As basic operation, as shown in FIG. 20, the MSN encoder 21 divides the data DT, which are sequentially supplied, into 16-bit parts, and modulates, based on the correlation table TBL1, the 16-bit data DT into 26-bit code sequences CL, and then supplies them to the DC control circuit 22.

Figure 20:
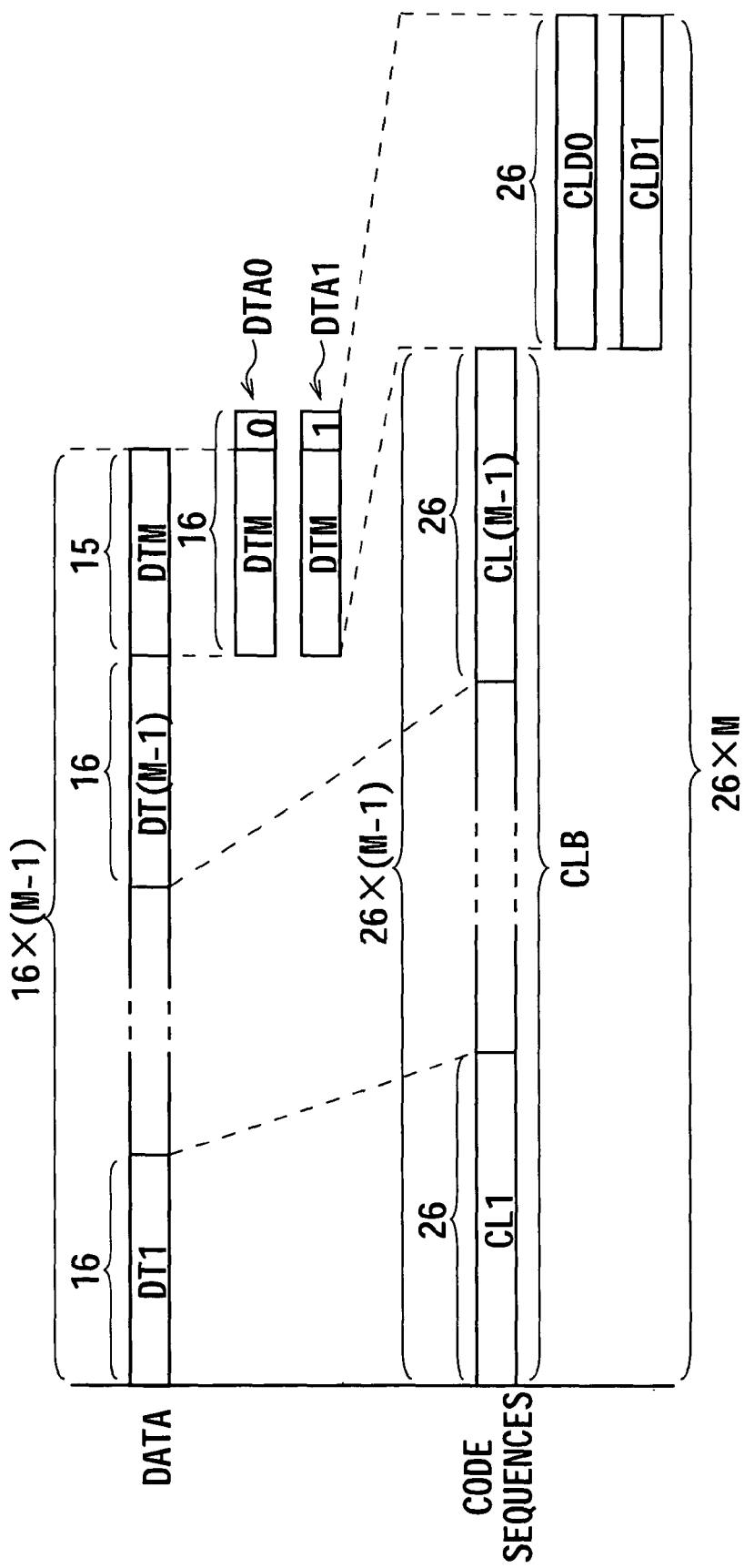
FIG. 20 is a schematic diagram illustrating a modulation process of converting data into code sequences and DCC code sequences.

When a DC control timing signal SDCT is supplied from the DC control circuit 22, the MSN encoder 21 divides the data DT, which are sequentially supplied, into 15-bit parts as shown in FIG. 20, adds a additional bit of data of "0" or "1" to the end part of the 15-bit data DT to produce two types of 16-bit addition data DTA0 and DTA1.

The MSN encoder 21 subsequently modulates, based on the correlation table TBL1, the 16-bit addition data DTA0 and DTA1 into 26-bit DCC code sequences CL0 and CL1 of MSN codes, and then supplies the two types of DCC code sequences CLD0 and CLD1 to the DC control circuit 22.

The DC control circuit 22 includes a CPU (not shown) as a main component. The DC control circuit 22 reads out various programs, such as a DCC code sequence selection program, from a ROM (not shown), and loads the programs onto a RAM (not shown) to perform a process of selecting one of the DCC code sequences to output it.

Actually, the DC control circuit 22 counts the number of code sequences CL supplied from the MSN encoder 21. Each time the DC control circuit 22 counts up (M−1) code sequences CL (M: an integer more than two), the DC control circuit 22 supplies the DC control timing signal SDCT to the MSN encoder 21.

As a result, the MSN encoder 21, as shown in FIG. 20, generates (M−1) data DT and two addition data DTA0 and DTA1 from (16×M−1)-bit data DT. The MSN encoder 21 subsequently modulates them to produce (M−1) code sequences CL (these sequences will be also referred to as "code sequence blocks CLB") and two DCC code sequences CLD0 and CLD1. The MSN encoder 21 then supplies them to the DC control circuit 22.

Figure 21:
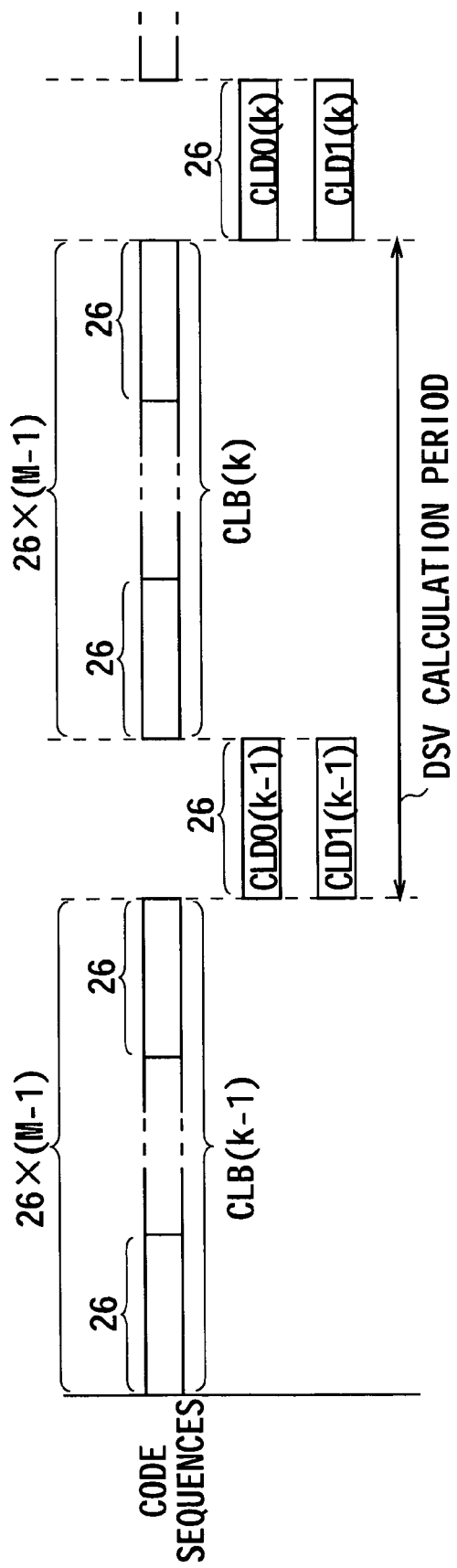
FIG. 21 is a schematic diagram illustrating selection of the DCC code sequences.

The DC control circuit 22, as shown in FIG. 21, outputs the (k−1)th code sequence block CLB(k−1). After that, the DC control circuit 22 does not output the (k−1)th DCC code sequences CLD0 and CLD1 and temporarily stores them in the RAM (not shown).

The DC control circuit 22 then sequentially acquires the code sequences CL included in the kth code sequence block CLB(k) from the MSN encoder 21, and temporarily stores them in the RAM without outputting them.

In addition, the DC control circuit 22 calculates the values VD0 and VD1 of DSV on the (k−1)th DCC code sequences CLD0 and CLD1, and also calculates the value DB of DSV on the kth code sequence block CLB(k).

The DC control circuit 22 compares (VD0+VB) with (VD1+VB), and selects one close to "0" from the DCC code sequences CLD0 and CLD1, and outputs the selected DCC code sequence CLD0 or CLD1 as (k−1)th DCC code sequence, and then outputs the kth code sequence block CLB (k).

In this case, even if the additional bit of data is "0" or "1", the DC control circuit 22 calculates the DSV after outputting the kth code sequence block CLB(k). The DC control circuit 22 will output one of the DCC code sequences whose value of DSV is closer to "0".

In this manner, to add the additional bit to each (16×M−1) bit to do the DC control, even if the additional bit of data is "0" or "1", the modulation section 3 calculates the value of DSV (which is the result of adding the modulated DCC code sequences CLD0 and CLD1 to the code sequence block CLB) for each code sequence block CLB. The modulation section 3 then selects one closer to "0" from the DCC code sequences CLD0 and CLD1 to output it.

(1-4-2) Code Sequence Generation Process

Figure 22:
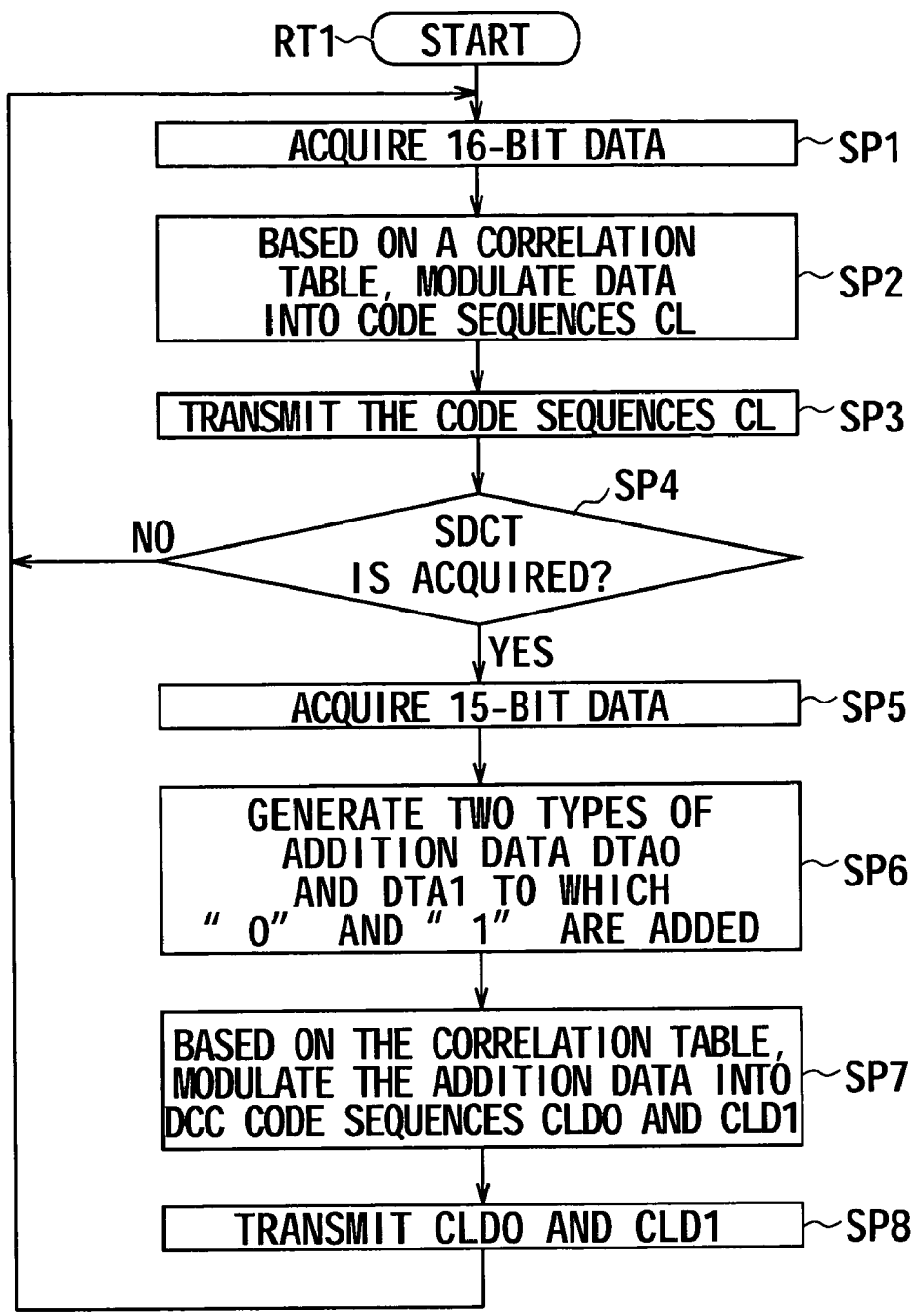
FIG. 22 is a flowchart illustrating a procedure of code sequence generation process.

With reference to FIG. 22, a procedure of code sequence generation process RT1 will be described. The code sequence generation process is performed by the MSN encoder 21 of the modulation section 3 when the optical disc device 1 records the data DT on the optical disc 100 as code sequences CL.

When the data DT is supplied, the MSN encoder 21 starts the procedure of code sequence generation process RT1, and proceeds to step SP1. At step SP1, the MSN encoder 21 divides the data DT into 16-bit parts, and then proceeds to step SP2.

At step SP2, the MSN encoder 21 modulates, based on the correlation table TBL1 on the ROM (not shown), the 16-bit data DT into 26-bit code sequences CL of MSN codes, and then proceeds to next step SP3.

At step SP3, the MSN encoder 21 supplies the code sequences CL to the DC control circuit 22, and then proceeds to next step SP4.

At step SP4, the MSN encoder 21 checks whether or not it has acquired the DC control timing signal SDCT from the DC control circuit 22. The negative result at step SP4 means that it has not yet transmitted (M−1) code sequences CL after outputting the previous DCC code sequences. In this case, the MSN encoder 21 returns to step SP1 to transmit new code sequences CL.

The affirmative result at step SP4 means that it has already transmitted (M−1) code sequences CL after outputting the previous DCC code sequences. In this case, the MSN encoder 21 proceeds to next step SP5 to transmit the DCC code sequences.

At step SP5, the MSN encoder 21 divides the supplied data DT into 15-bit parts, and then proceeds to next step SP6.

At step SP6, the MSN encoder 21 generates the two types of addition data DTA0 and DTA1 where the additional bit of "0" or "1" is added to the end of 15-bit data DT, and then proceeds to next step SP7.

At step SP7, the MSN encoder 21 modulates, based on the correlation table TBL1 on the ROM (not shown), the two types of addition data DTA0 and DTA1 into the 26-bit DCC code sequences CLD0 and CLD1 of MSN codes, and then proceeds to next step SP8.

At step SP8, the MSN encoder 21 supplies the DCC code sequences CLD0 and CLD1 to the DC control circuit 22, and returns to step SP1 to repeat the series of process to produce normal code sequences CL.

(1-4-3) DCC Code Sequence Selection Process

Figure 23:
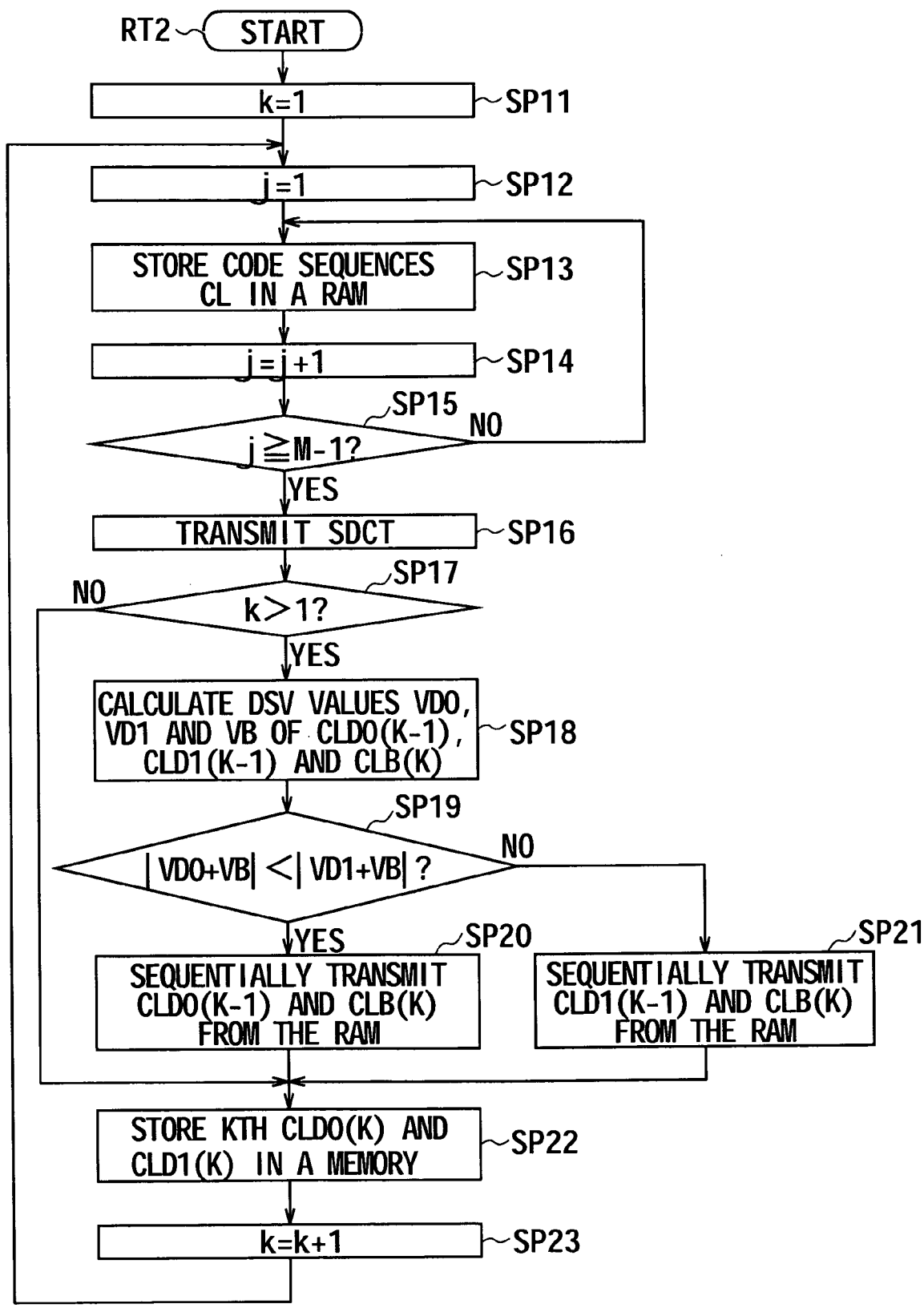
FIG. 23 is a flowchart illustrating a procedure of DCC code sequence selection process.

With reference to FIG. 23, a procedure of DCC code sequence selection process RT2 will be described. The DCC code sequence selection process is performed by the DC control circuit 22 of the modulation section 3 when the optical disc device 1 records the data DT on the optical disc 100 as code sequences CL.

When the code sequences CL are supplied from the MSN encoder 21, the DC control circuit 22 starts the procedure of DCC code sequence selection process RT2, and then proceeds to step SP11. At step SP11, the DC control circuit 22 initializes a variable k to one. The variable k is used to count the code sequence block CLB. The DC control circuit 22 subsequently proceeds to next step SP12.

At step SP12, the DC control circuit 22 initializes a variable j to one. The variable j is used to count the number of code sequences CL in one code sequence block CLB. The DC control circuit 22 subsequently proceeds to next step SP13.

At step SP13, the DC control circuit 22 stores the code sequence CL acquired form the MSN encoder 21 in the RAM (not shown), and then proceeds to next step SP14.

At step SP14, the DC control circuit 22 increments the variable j, and then proceeds to next step SP15.

At step SP15, the DC control circuit 22 checks whether the variable j is greater or equal to (M−1) which is the number of code sequences CL in the code sequence block CLB. The negative result at step SP15 means that the DC control circuit 22 has not acquired yet (M−1) code sequences CL. In this case, the DC control circuit 22 returns to step SP13 to acquire the code sequence CL.

The affirmative result at step SP15 means that the DC control circuit 22 has acquired (M−1) code sequences CL, which is to say the RAM (not shown) has stored kth code sequence block CLB(k). In this case, the DC control circuit 22 proceeds to next step SP16, At step SP16, to forces the MSN encoder 21 to output the DCC code sequences CLD0 and CLD1, the DC control circuit 22 supplies the DC control timing signal SDCT to the MSN encoder 21, and then proceeds to next step SP17.

At step SP17, the DC control circuit 22 checks whether the variable k is greater than one, which is to say it checks whether the RAM has stored the (k−1)th DCC code sequences CLD0($k$−1) and CLD1($k$−1). The affirmative result at step SP17 means that the RAM has already stored the (k−1)th DCC code sequences CLD0($k$−1) and CLD1($k$−1). In this case, the DC control circuit 22 proceeds to next step SP18.

At step SP18, the DC control circuit 22 calculates the values VD0 and VD1 of DSV of the (k−1)th DCC code sequences CLD0 and CLD1, and the value VB of DSV of the kth code sequence block CLB(k). The DC control circuit 22 subsequently proceeds to next step SP19.

At step SP19, the DC control circuit 22 checks whether the absolute value of DSV (VD0+VB), which is in the case where the DCC code sequence CLD0 is selected, is smaller than the absolute value of DSV (VD1+VB), which is in the case where the DCC code sequence CLD1 is selected. The affirmative result at step SP19 means that the value of DSV becomes closer to "0" if the DCC code sequence CLD0, not the DCC code sequence CLD1, is selected. This means that the DCC code sequence CLD0 should be selected. In this case, the DC control circuit 22 proceeds to next step SP20.

At step SP20, the DC control circuit 22 sequentially outputs the (k−1)th DCC code sequence CLD0 and the kth code sequence block CLB(k) from the RAM (not shown), and then proceeds to next step SP22.

The negative result at step SP19 means that the value of DSV becomes closer to "0" if the DCC code sequence CLD1, not the DCC code sequence CLD0, is selected. This means that the DCC code sequence CLD1 should be selected. In this case, the DC control circuit 22 proceeds to next step SP21.

At step SP21, the DC control circuit 22 sequentially outputs the (k−1)th DCC code sequence CLD1 and the kth code sequence block CLB(k) from the RAM (not shown), and then proceeds to next step SP22.

By the way, the negative result at step SP17 means that the RAM has not stored yet the (k−1)th DCC code sequences CLD(k−1) and CLD1($k$−1). This means that it has not to select any DCC code sequences. In this case, the DC control circuit 22 proceeds to next step SP22.

At step SP22, the DC control circuit 22 stores in the RAM (not shown) the DCC code sequences CLD0 and CLD1, which were acquired from the MSN encoder 21. The DC control circuit 22 subsequently proceeds to next step SP23.

At step SP23, the DC control circuit 22 increments the variable k, and then returns to step SP12 to repeat the series of process.

(1-5) Configuration of Demodulation Section

The demodulation section 10 of the optical disc device 1 (FIG. 1) will be described. The demodulation section 10 demodulates the 26-bit code sequence CL of MSN codes into the 16-bit data DT. In addition to that, the demodulation section 10 removes an additional bit which has been added by the modulation section 3 for the DC control.

(1-5-1) Circuit Configuration of Modulation Section

Figure 24:
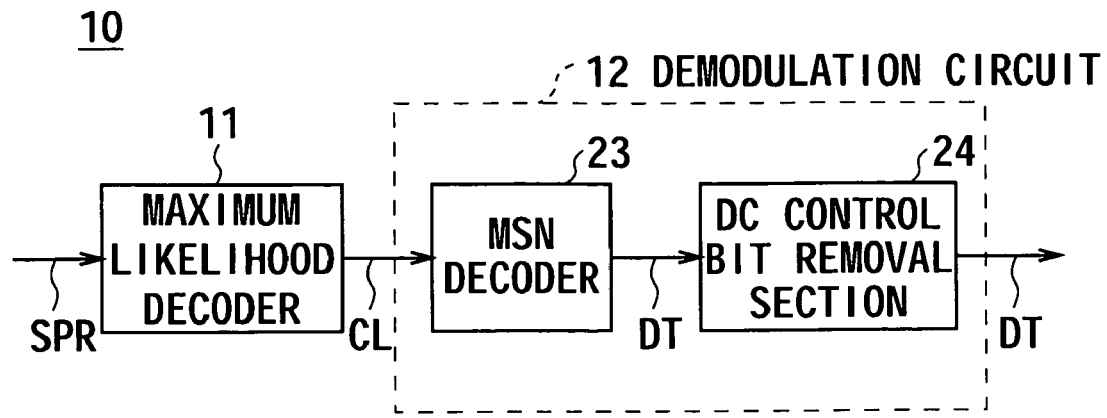
FIG. 24 is a schematic diagram illustrating the configuration of a demodulation section according to a first embodiment of the present invention.

As shown in FIG. 24, the demodulation section 10 includes: the maximum likelihood decoder 11, which performs a maximum likelihood decoding process; a MSN decoder 23, which performs a demodulation process; and a DC control bit removal section 24, which removes the additional bits added for the DC control.

The maximum likelihood decoder 11 includes a CPU (not shown) as main component. The maximum likelihood decoder 11 reads out various programs, such as a TCPRML detection program, from a ROM (not shown), and loads the programs onto a RAM to perform a process of detecting the code sequences CL from the PR equalization signal SPR.

The maximum likelihood decoder 11 has stored in the ROM (not shown) trellis data that indicates the trellis diagrams (the one shown in FIG. 17 or 18) in accordance with the PR equalization method of the PR equalizer 9. The maximum likelihood decoder 11 performs, in accordance with the trellis data, a TCPRML detection process on the analog PR equalization signal SPR which was supplied from the PR equalizer 9 to detect the 26-bit code sequences CL of MSN codes, and then sequentially supplies the code sequences CL to the MSN decoder 23 of the demodulation circuit 12.

The MSN decoder 23 includes a CPU (not shown) as main component. The MSN decoder 23 reads out various programs, such as a decode program, from a ROM (not shown), and then loads the programs onto a RAM (not shown) to perform a demodulation process of converting the code sequences CL into the data DT.

In addition, the MSN decoder 23 has stored the correlation table TBL1 in the ROM (not shown). When the code sequence CL is supplied from the maximum likelihood decoder 11, the MSN decoder 23 sequentially demodulates, based on the correlation table TBL1, the 26-bit code sequences CL of MSN codes into the 16-bit data DT, and then sequentially supplies the data DT to the DC control bit removal section 24.

The DC control bit removal section 24 includes a CPU (not shown) as main component. The DC control bit removal section 24 reads out various programs, such as an additional bit removal program, from a ROM (not shown), and then loads the programs onto a RAM (not shown) to perform a process of removing the additional bits added for the DC control.

The DC control bit removal section 24 counts the number of pieces of data DT supplied from the MSN decoder 23. Each time it counts M, the DC control bit removal section 24 removes the additional bit from the end part of each data DT to reproduce the original data DT which is then output.

In this manner, the demodulation section 10 sequentially detects, based on the trellis diagram, the code sequences CL through the TCPRML detection process, and demodulates, based on the correlation table TBL1, the 26-bit code sequences CL of MSN codes into the 16-bit data DT, and then removes the additional bit from each data DT including M parts to reproduce the original data DT.

(1-5-2) Demodulation Process

Figure 25:
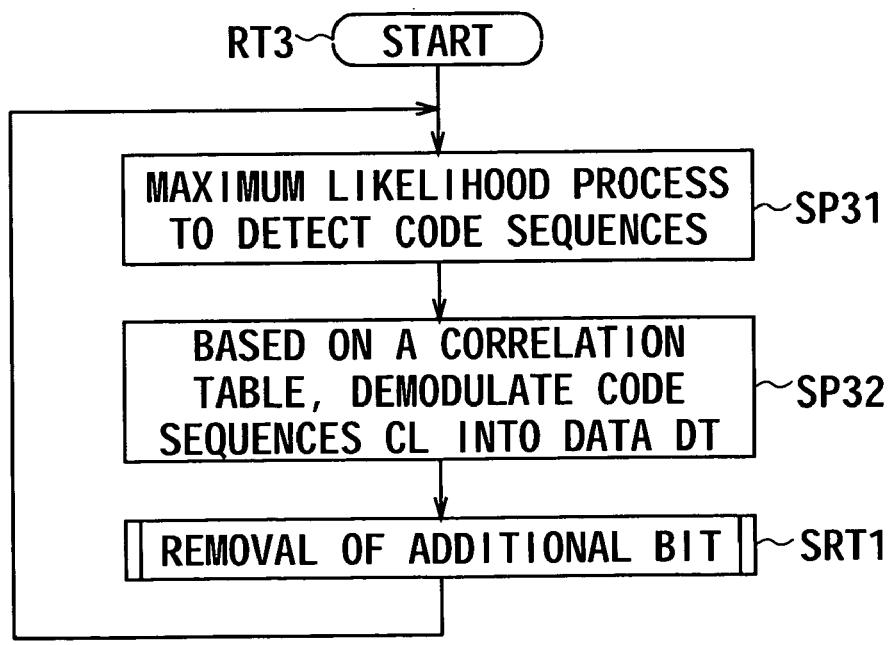
FIG. 25 is a flowchart illustrating a procedure of demodulation process.

With reference to FIG. 25, a procedure of demodulation process RT3 will be described. The demodulation process is performed by the demodulation section 10.

When the analog PR equalization signal SPR is supplied form the PR equalizer 9, the demodulation process 10 starts the procedure of demodulation process RT3, and then proceeds to step SP31.

At step SP31, the demodulation section 10 forces the maximum likelihood decoder 11 to perform the TCPRML detection process based on the trellis diagram (the one shown in FIG. 17 or 18) to detect the 26-bit code sequences CL of MSN codes. The demodulation section 10 subsequently proceeds to next step SP32.

At step SP32, the demodulation section 10 controls the MSN decoder 23 to demodulate the 26-bit code sequences CL of MSN codes into the 16-bit data DT in accordance with the correlation table TBL1. The demodulation section 10 subsequently proceeds to a subroutine of additional bit removal process SRT1.

In the subroutine of additional bit removal process SRT1, the demodulation section 10 controls the DC control bit removal section 24 to count the number of pieces of data DT. The DC control bit removal section 24 then removes the additional bit, which is added for the DC control, each time it counts M pieces of data DT. The demodulation section 10 subsequently outputs the resulting data DT, and returns to step SP31.

Figure 26:
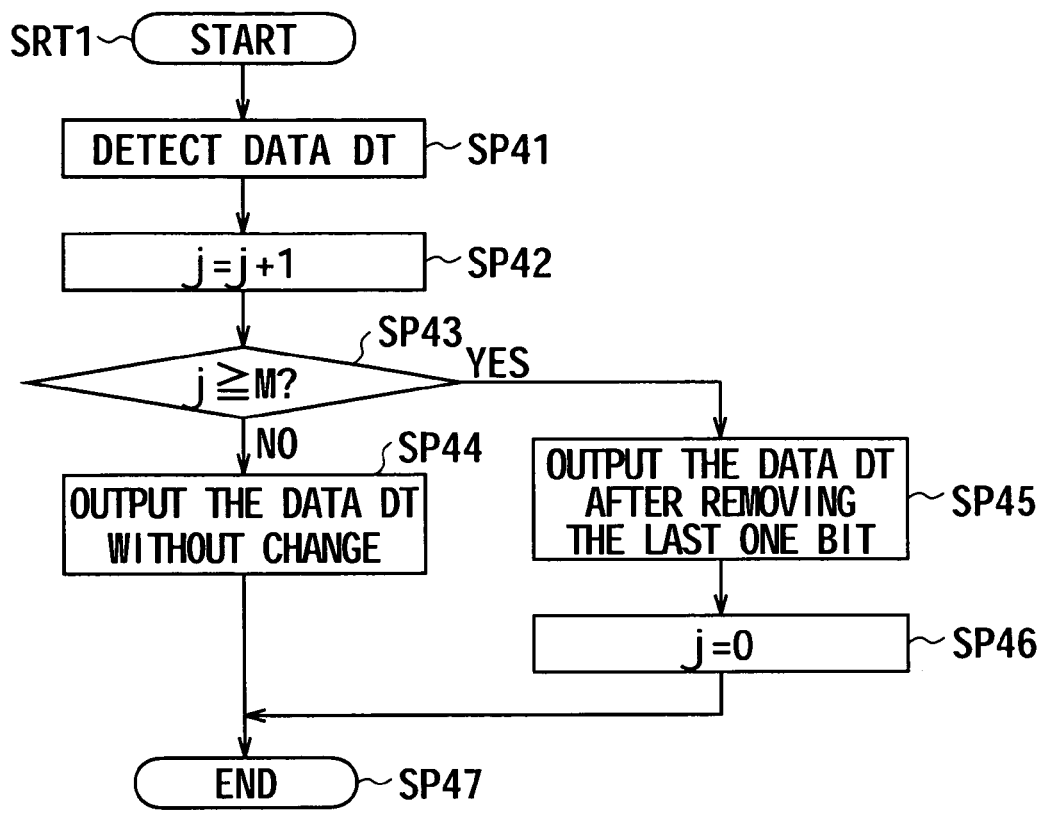
FIG. 26 is a flowchart illustrating a process of additional bit removal process.

The DC control bit removal section 24 performs, in accordance with a flowchart in FIG. 26, a subroutine SRT1 of additional bit removal process.

When the data DT is supplied form the MSN decoder 23, the DC control bit removal section 24 starts the subroutine SRT1 of additional bit removal process, and then proceeds to step SP41. At step SP41, the DC control bit removal section 24 detects one piece of 16-bit data DT, and then proceeds to next step SP42.

At step SP42, the DC control bit removal section 24 increments a variable j to count the number of data DT detected, and then proceeds to next step SP43.

At step SP43, the DC control bit removal section 24 checks whether the variable j is greater or equal to M (the additional bit has been added to the data DT made up of M parts). The negative result at step SP43 means that the counted number of data DT is less than M, so the data DT to which the additional bit is added has still not been detected. In this case, the DC control bit removal section 24 proceeds to next step SP44.

At step SP44, the DC control bit removal section 24 outputs the data DT (detected at step SP44) without doing any other things, and then proceeds to next step SP47 to end the subroutine SRT1 of additional bit removal process.

The affirmative result at step SP43 means that the counted number of data DT has reached M, and that the data DT to which the additional bit is added is detected. In this case, the DC control bit removal section 24 proceeds to next step SP45.

At step SP45, the DC control bit removal section 24 removes the last one bit from the 16-bit data DT, and outputs the remaining 15-bit data DT, and then proceeds to next step SP46.

At step SP46, the DC control bit removal section 24 resets the variable j to zero to restart counting the number of data DT until it reaches M again. The DC control bit removal section 24 subsequently proceeds to next step SP47 to end the subroutine SRT1 of additional bit removal process.

(1-6) Operation and Effects

In an embodiment of the present invention, based on the reduced-type FSTD (FIG. 4) where the symbols are expressed in the NRZI method and the ADS is restricted, the code sequence generation method described above divides one state into the following two states to generate the divided-and-reduced-type FSTD (FIG. 6): a state that comes immediately after generating a symbol of "0", and a state that comes immediately after generating a symbol of "1". In addition, it defines the condition N0 where the state transition on the divided-and-reduced-type FSTD is limited in the range of s0 to s9, the state s1 becomes both the initial and end states, and the number of transition is set to twenty six (FIG. 7).

Accordingly, the code sequence generation method performs the state transition twenty six times in accordance with the 16/26 divided-and-reduced-type FSTD. This produces more than 216 (=65536) code sequences CL, or 70846 code sequences CL of MSN codes where the minimum run length d is limited to one. That is to say, it produces the 16/26 MSN codes in which the minimum run length is limited to one after associating the 16-bit data with the 26-bit code sequences CL.

In addition, as for the code sequence group U0 including 70846 code sequences CL, the code sequence generation method focuses the top, middle and end parts, and put limitation on the maximum number of consecutive symbols of "0". This produces, if the maximum run length k is limited to fourteen, the code sequence groups U1 and U2, each of which includes 66142 code sequences CL.

In this case, it focuses the top, middle and end parts of code sequence CL. This limits not only the number of consecutive symbols of "0" in one code sequence CL but also the number of consecutive symbols of "0" that exist on the adjoining code sequences CL. This makes sure that it limits the maximum run length k on the code sequence groups U1 and U2 even if there are the consecutive code sequences CL.

Furthermore, as for the code sequence groups U1 and U2, the code sequence generation method defines two cases: a case in which the top symbol of code sequence CL is "1", and a case in which the top symbol of code sequence CL is "0". It also focuses the top, middle and end parts, and puts limitation on the RMTR. This generates, if the RMTR is limited to ten, the code sequence group U3 including 65725 code sequences CL and the code sequence group U4 including 65723 code sequences.

In this case, as for the code sequence groups U3 and U4, the top, middle and end parts of code sequence CL are focused, in a similar way to the case where the maximum run length k is restricted. This limits not only the number of consecutive shortest run code sequences of "10" in one code sequence CL but also the number of consecutive shortest run code sequences of "10" that exist on the adjoining code sequences CL. This makes sure that it limits the values of RMTR on the code sequence groups U3 and U4 even if there are the consecutive code sequences CL.

By the way, the equalization process of PR(1,1) (which is performed before demodulation of the 16/26 MSN codes MC1) is expressed by the polynomial equation (1a) described above, where D means one-clock delay of a sampling clock of $Z^{-1}$ on Z-transform.

The equalization process of PR(1,1+x,X) (where x is any real number) is expressed as follows:

$$1+(1+x)D+xD^2=(1+xD)(1+D) \quad (2)$$

The equalization process of PR(1,1+a,a+b,b) (where a and b are any real number) is expressed as follows:

$$1+(1+a)D+(a+b)D^2+bD^3=(1+aD+bD^2)(1+D) \quad (3)$$

The term of (1+D) is included in all the equation (1a), (2) and (3). This means that the equation processes of PR(1,1), PR(1,1+x,X) and PR(1,1+a,a+b,b) have null points at Nyquist frequency, and that the 16/26 MSN codes MC1 match the null points at Nyquist frequency.

That is to say, as for the code sequence generation method that produces the 16/26 MSN codes MC1 of MSN codes where the minimum run length d is limited to one, in a case in which the minimum run length d may need to be greater or equal to one due to a storage medium of the optical disc 100, the null point (Nyquist frequency) of the frequency spectrum of the PR equalization process applied to the reproduction process of the optical disc 100 can be matched with the null point (Nyquist frequency) of the frequency spectrum of the 16/26 MSN codes MC1.

Actually, when the optical disc device 1 recodes the data DT on the optical disc 100, the modulation section 3 modulates, in accordance with the correlation table TBL1, the data DT into the code sequences CL of 16/26 MSN codes MC1. The optical disc device 1 then controls the recording control circuit 4 and the optical pickup 5 (FIG. 1) to form a row of pits on the optical disc 100 based on the code sequences CL.

When the optical disc device 1 reproduces the data DT from the optical disc 100, the demodulation section 10 performs processes, such as PLL and PR equalization processes, on the reproduction RF signals detected based on the pit row on the optical disc 100, and then detects the code sequences CL from the PR equalization signal SPR. The optical disc device 1 subsequently demodulates, in accordance with the correlation table TBL1, the code sequences CL of 16/26 MSN codes MC1 into the data DT which is then output.

As a result, when it reproduces signals from the optical disc 100, the optical disc device 1 can match the null point (Nyquist frequency) of the frequency spectrum of the PR equalization process with the null point (Nyquist frequency) of the frequency spectrum of the 16/26 MSN codes MC1. This improves the reproduction characteristics about the data DT.

In addition, based on the PR state transition diagrams (FIGS. 16A to 16C) where the limitation of the minimum run length d=1 is taken into consideration, the trellis diagrams for each PR equalization method (FIGS. 17 and 18) are created by combining the values of ADS of each state of the divided-type FSTD in FIG. 5. This removes the following: the overlapped states, the state that never appears at a certain point in time, and unnecessary paths.

This prevents moving into wrong states due to noise or the like. Accordingly, this method can detect the code sequences effectively.

By the way, with a Viterbi detector that supports the equalization method of PR(1,2,1), the minimum geometric detection distance is the square root of 24. By contrast, in an embodiment of the present invention where a Time Varying Trellis Coded Viterbi detector supports the trellis diagram (FIG. 17) of the equalization method of PR (1,2,1), the minimum geometric detection distance is the square root of 40. In this manner, this method dramatically increases the minimum geometric detection distance.

The increase of the minimum geometric detection distance is expressed as follows:

$$10 \times \log_{10} \frac{40}{24} = 2.21 \text{ [dB]} \quad (4)$$

In this manner, the increase is 2.21 dB.

In this manner, the TCPRML that supports the 16/26 MSN codes MC1 is performed. Accordingly, this increases the minimum geometric detection distance more than that of the general Partial Response Maximum Likelihood (PRML). That improves the detection capability about the code sequences.

Figures 27, 28:
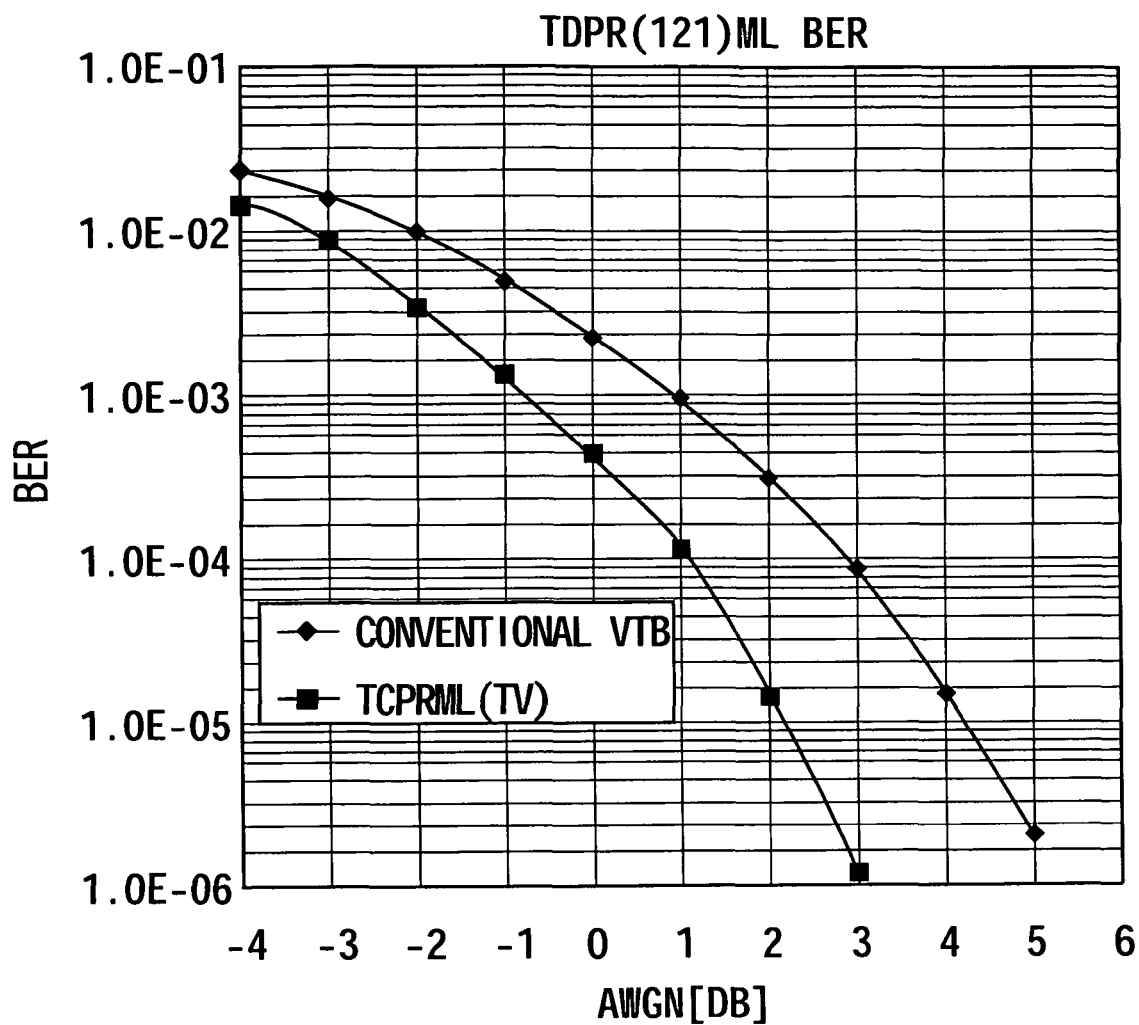
FIG. 27 is a schematic diagram illustrating the result of measurement of bit error rate.
FIG. 28 is a schematic diagram showing a peak value of DSV.

FIG. 27 shows the two measurements: the measurement of bit error rate (bER) of reproduced waveforms on the Time Varying Trellis Coded Viterbi detector that supports the trellis diagram in FIG. 17, where the PR equalization process with the ideal equalization method of PR(1,2,1) is performed to the 16/26 MSN codes MC1 generated by the code sequence generation method according to an embodiment of the present invention, which is then overlapped with white Gaussian noise to produce the reproduced waveforms; and the measurement of bit error rate on the typical Viterbi decoder of PR(1,2,1).

As shown in FIG. 27 where the Time Varying Trellis Coded Viterbi decoder that supports the trellis diagram according to an embodiment of the present invention is applied, the white Gaussian noise immunity is improved by approximate 2.2 dB. This improvement almost corresponds to the theoretical value calculated by the above equation (4). This shows the fact that the minimum geometric detection distance increases.

In reality, the maximum likelihood decoder 11 of the demodulation section 10 of the optical disc device 1 performs, in accordance with the trellis diagram (the one in FIG. 17 or 18), the TCPRML detection process. In a case in which signals are recorded or reproduced from the optical disc 100 with multiple layers of signal recording, that causes, when the code sequences are read from a certain recording layer, lower Signal to Noise Ratio (SNR) due to the influence of other signal recording layers. However, that improves the detection capability about the code sequences compared to the general Viterbi detection process.

The optical disc device 1 selects, when recording the data on the optical disc 100, the DCC code sequence CLD0 or CLD1 such that it corresponds to the additional bit added by the modulation section 3 to the data DT, and outputs it. When reproducing the data DT from the optical disc 100, the demodulation section 10 removes the additional bit to perform the DC control in which the values of DSV of the code sequences CL are brought close to zero.

In this case, the modulation section 3 modulates the additional data DTA0 and DTA1, in which one-bit data "0" or "1" is added to the (16×M−1)-bit data DT (FIG. 20), into the DCC code sequences CLD0 and CLD1. The modulation section 3 then calculates the values of DSV of the DCC code sequences CLD0 and CLD1, and selects the one whose DSV is closer to zero from the code sequences CLD0 and CLD1. In this manner, the modulation section 3 can add an additional bit "0" or "1" so that the value of DSV becomes close to zero.

FIG. 28 shows the result of random pattern simulation in which the 16/26 MSN codes MC1 is used: the peak value (DSV) of the case in which the DC control is performed with M=3, and the peak value (DSV) of the case in which the DC control is not performed by the modulation and demodulation sections 3 and 10 of the optical disc device 1.

As shown in FIG. 28, when the DC control is not performed, the maximum DSV is 1669 and the minimum DSV is −314. When the DC control is performed, the maximum DSV is 47 and the minimum DSV is −44. It means that the DC control helps bringing the peak values of DSV closer to zero. That is to say, the modulation section 3 and demodulation section 10 that perform the DC control brings the values of DSV close to zero.

Figure 29:
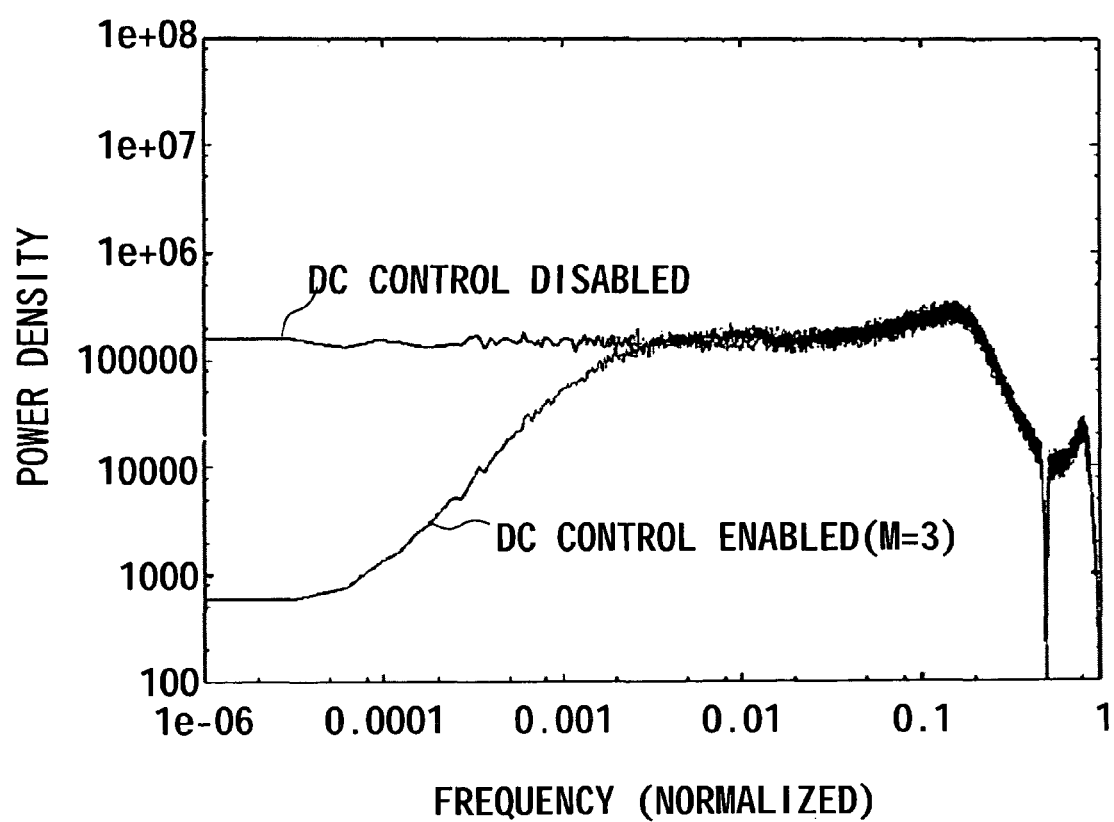
FIG. 29 is a schematic diagram illustrating the power spectrum density of 16/26 MSN codes.

FIG. 29 shows the result of calculation about Power Spectrum Density (PSD) on the code sequences CL when the random pattern simulation is performed. In FIG. 29, the frequencies are normalized.

As shown in FIG. 29, when the DC control is not performed, the low frequency range of the normalized frequency under approximate 0.001 is relatively high. By contrast, when the DC control is performed, the low frequency range is sufficiently reduced.

In this manner, the low frequency range of the code sequences CL is reduced. This prevents the servo system (not shown) of the optical disc device 1 from being interrupted while it performs the recording or reproduction process.

In addition, it is evident from FIG. 29 that the PSD is almost zero at Nyquist frequency (where the normalized frequency is 0.5), and therefore there is a null point.

The above configuration makes this possible: based on the reduced-type FSTD where the symbols are expressed in the NRZI method and the ADS is restricted, one state is divided into the following two states to generate the 16/26 divided-and-reduced-type FSTD: a state that comes immediately after generating a symbol of "0", and a state that comes immediately after generating a symbol of "1". This produces the 16/26 MSN codes MC1 whose minimum run length d is limited to one, when the state transition is performed based on the 16/26 divided-and-reduced-type FSTD.

(2) Second Embodiment (2-1) Overall Configuration of Optical Disc Device

An optical disc device 30 according to a second embodiment of the present invention has almost the same configuration as that of the optical disc device 1 in FIG. 1. Instead of the modulation section 3, the demodulation section 10, the maximum likelihood decoder 11 and the demodulation circuit 12, the optical disc device 30 includes the modulation section 31, the demodulation section 32, the maximum likelihood decoder 33 and the demodulation circuit 34. The description about the same parts will be omitted.

(2-2) Principle of Generating Code Sequences

In the second embodiment, instead of the minimum run length d limited to one like that of the first embodiment, the minimum run length d is limited to two.

(2-2-1) State Transition Diagram with Limitation of Minimum Run Length d=2

When the code sequences are produced, the limitation of the minimum run length d to two means putting two or more consecutive symbols of "0" before a symbol of "1". Accordingly, only two preceding symbols may be focused.

That is to say, the limitation is as follows: producing a symbol of "0" or "1" immediately after the code sequence of "00"; and always producing a symbol of "0" immediately after the code sequences of "01" and "10".

Figure 30:
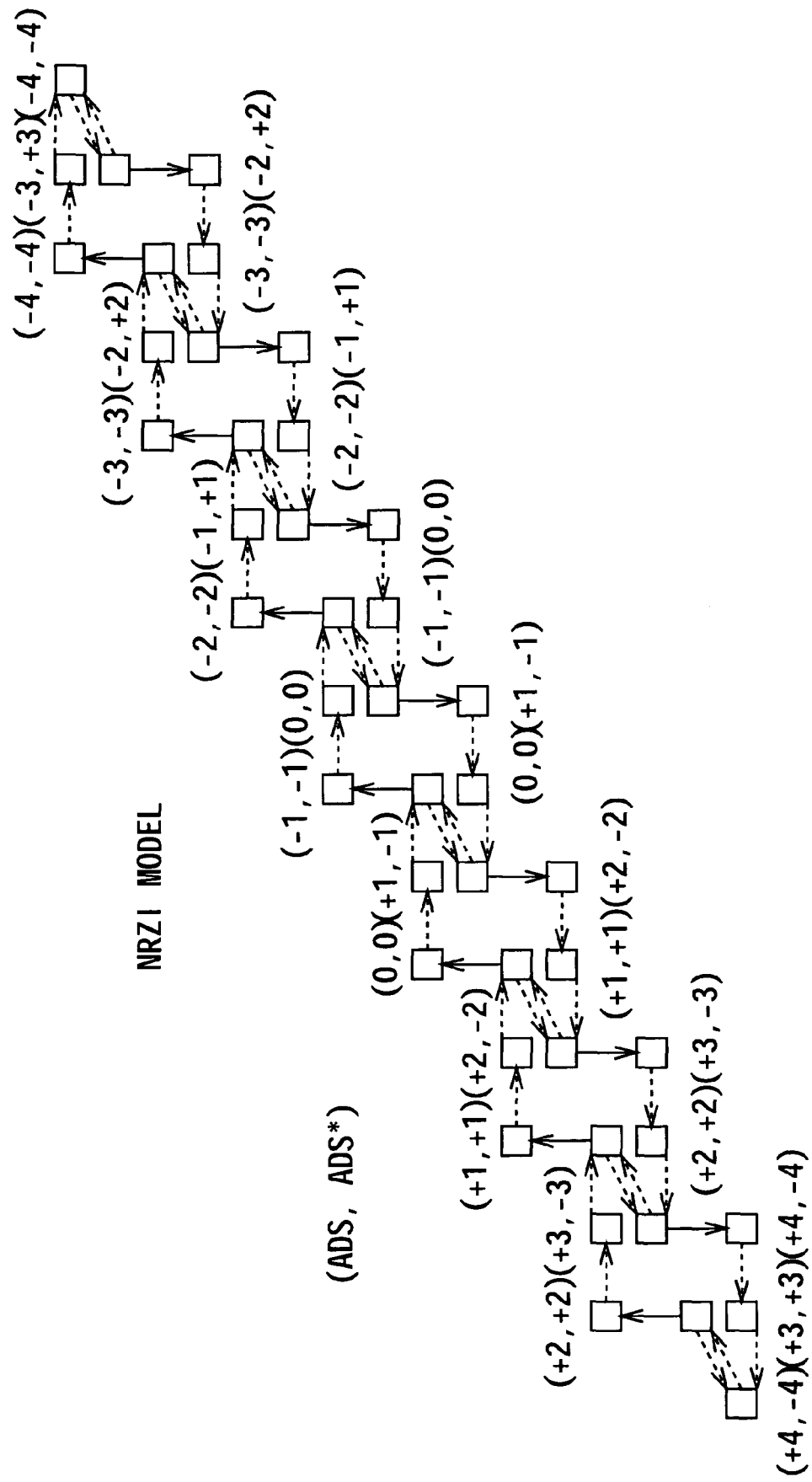
FIG. 30 is a schematic diagram illustrating a divided-and-reduced-type FSTD after dividing one state into three states.

In the second embodiment of the present invention, one state on the FSTD (FIG. 3) is divided into the following three states to produce the divided-type FSTD in FIG. 30: a state that comes via a dotted line with arrow and another dotted line with arrow in that order, a state that comes via a dotted line with arrow and a solid line with arrow in that order, and a state that comes via a solid line with arrow and a dotted line with arrow in that order.

In other words, one state on the FSTD (FIG. 3) is divided into the following three states to produce the divided-type FSTD in FIG. 30: a state that comes immediately after generating symbols of "00", a state that comes immediately after generating symbols of "01", and a state that comes immediately after generating symbols of "10".

Figure 31:
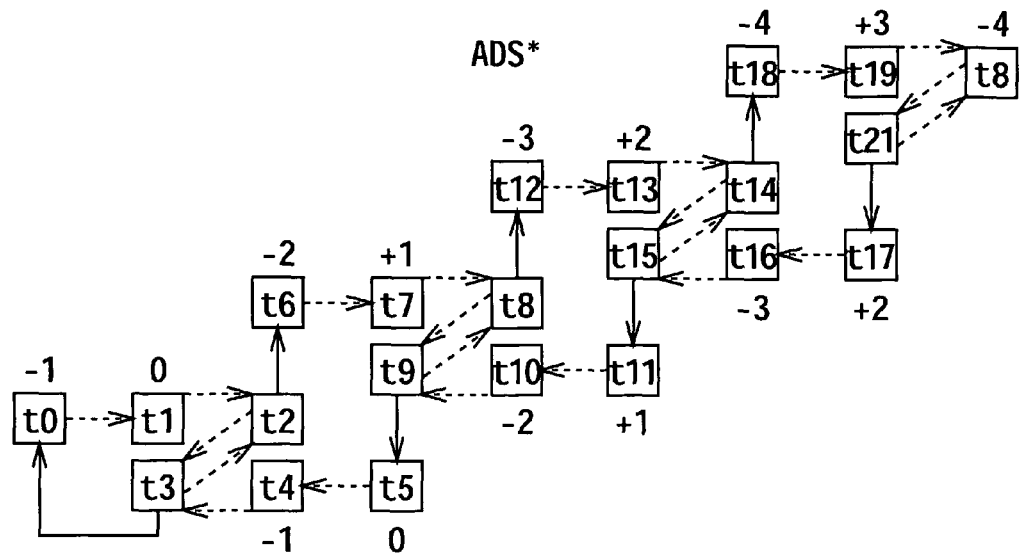
FIG. 31 is a schematic diagram illustrating a 16/34 divided-and-reduced-type FSTD where the minimum run length is limited to two.

In a similar way to that of FIG. 30, one state on the reduced-type FSTD in FIG. 4 is divided into the following three states to produce the divided-and-reduced-type FSTD in FIG. 31: a state that comes via a dotted line with arrow and another dotted line with arrow in that order, a state that comes via a dotted line with arrow and a solid line with arrow in that order, and a state that comes via a solid line with arrow and a dotted line with arrow in that order.

For example, on the divided-type FSTD (FIG. 30) and the divided-and-reduced-type FSTD (FIG. 31), there are three states who have the same value of ADS* like the states t0, t3, and t5; there are three patterns of "00", "01" and "10" about two code sequences that appear immediately before them; and each state generates, when moving to next state, a symbol of "0" or "1", a symbol of "0", or a symbol of "1".

That is to say, on the divided-type FSTD (FIG. 30) and the divided-and-reduced-type FSTD (FIG. 31), a symbol sequence of "00" is always generated after a symbol of "1". This means that the minimum run length d is limited to two. In other words, the divided-type FSTD (FIG. 30) and the divided-and-reduced-type FSTD (FIG. 31) are generated by limiting the minimum run length d to two based on the FSTD (FIG. 3) and the reduced-type FSTD (FIG. 4) that generate MSN codes with the minimum run length d=0.

Accordingly, the divided-type FSTD (FIG. 30) and the divided-and-reduced-type FSTD (FIG. 31) generate the MSN codes in which the minimum run length d is limited to two.

In this manner, on the code sequence generation method according to the second embodiment of the present invention, one state on the FSTD is divided into the following three states to produce the divided-type FSTD and divided-and-reduced-type FSTD that produce the code sequences of MSN codes where the minimum run length d is limited to two: a state that comes immediately after generating symbols of "00", a state that comes immediately after generating symbols of "01", and a state that comes immediately after generating symbols of "10".

(2-2-2) Limitation of Transition Range and Determination of Code Length

In a similar way to that of the first embodiment, based on the divided-and-reduced-type FSTD (FIG. 31), the following is restricted: the range of the state transition of generating the code sequences CL, the initial and end states, and the number of state transition n.

The experiment has been done about the divided-and-reduced-type FSTD (FIG. 31) to count the number of types of code sequences generated, where the number of bits of data DT is sixteen (m=16), the number of desired code sequences CL is for example set to more than 65536, the initial and end states are the same, the range of state transition can be changed, and the code length n varies.

As shown in FIG. 31, that produces 66193 (more than 65536) code sequences, or m/n=16/34 codes, under a condition N10 where the range of state transition on the divided-and-reduced-type FSTD is in the range of 0 to −4 (ADS*) or t0 to t21 (state), and the initial and end states are both equivalent to the state t2, and the code length n is 34. This group of 66193 MSN codes will be also referred to as a "code sequence group U10". The divided-and-reduced-type FSTD in FIG. 31 will be also referred to as a "16/34 divided-and-reduced-type FSTD".

The reason to set both the initial and end states to state t2 is this: the ADS* of the state t2 is −1 which is close to zero, and this state t2 comes immediately after the symbols of "00" generated.

In the code sequence generation method according to the second embodiment of the present invention, based on the 16/34 divided-and-reduced-type FSTD (FIG. 31), and the initial and end states are set to the same, and the state transition is performed thirty four times (n=34). This produces 66193 (more than 65536) code sequences CL of MSN codes with code length n=34 where the minimum run length d is two.

(2-2-3) Limitation on Maximum Run Length k and RMTR for Extraction of Code Sequences The following describes a case where, as for the 66193 code sequences CL in the code sequence group U10, the maximum run length k is limited to extract more than 65536 code sequences CL in the similar way to that of the first embodiment.

For example, as shown in FIG. 32A corresponding to FIG. 8A, in a similar way to that of the first embodiment, the precursor RUN, middle RUN and postcursor RUN are defined. The experiment has been done to investigate the number of code sequences CL that matches the limitation of the precursor RUN, middle RUN and postcursor RUN out of the code sequences CL of the code sequence group U0 under the condition where the values of the precursor RUN, middle RUN and postcursor RUN varies.

FIG. 33 shows a part of the result: there are 65627 (>65536) code sequences CL that matches a condition N11 where the maximum run length k is set to thirty, the middle RUN is thirty, the precursor RUN is sixteen, and the postcursor RUN is fourteen. This group of code sequences CL will be also referred to as a "code sequence group U11".

By the way, in FIG. 33, hatched areas indicate a fact that there are more than 65536 code sequences.

The following describes a case of limiting the RMTR about the 65627 code sequences CL in the code sequence group U11 to extract more than 65536 code sequences.

By the way, in the second embodiment of the present invention, where the minimum run length d is limited to two, the shortest run code sequence is "100".

In this case, as shown in FIG. 32B corresponding to FIG. 8B, in a similar way to that of the first embodiment, there are two cases: a case where the top symbol of the code sequence CL is "1", and a case where the top symbol of the code sequence CL is "0". The top, middle and end parts of these code sequences with code length n=34 are focused. The precursor positive RMTR, the middle positive RMTR and the postcursor positive RMTR, the precursor negative RMTR, the middle negative RMTR and the postcursor negative RMTR are defined.

However, as shown in FIG. 31, as for the code sequence CL, on the 16/34 divided-and-reduced-type FSTD, the end state becomes t2. Accordingly, the last part of the code sequence CL is always "00", not " . . . 0010". This means that we can leave the postcursor negative RMTR out of consideration.

In addition, in the second embodiment of the present invention, as shown in FIG. 32B, the precursor negative RMTR finally becomes the same as the middle negative RMTR because there are not the consecutive shortest run sequences of "100" from the top bit. In addition, the middle negative RMTR becomes the same as the middle positive RMTR.

Accordingly, in the second embodiment of the present invention, only the precursor positive RMTR, the middle positive RMTR and the postcursor positive RMTR may be taken into consideration. Therefore, the experiment has been done in the following manner: to count the number of code sequences CL that matches the limitation of the precursor positive RMTR, the middle positive RMTR and the postcursor positive RMTR out of the code sequences CL in the code sequence group U11, the precursor positive RMTR, the middle positive RMTR and the postcursor positive RMTR is changed in various ways.

FIG. 34 shows a part of the result: out of the code sequences CL in the code sequence group U11, there are 65606 (>65536) code sequences CL that matches a condition N12 where the RMTR is six, the middle positive RMTR is limited to six, the precursor positive RMTR is limited to two, and the postcursor positive RMTR is limited to three. This group of code sequences CL will be also referred to as a "code sequence group U12".

By the way, in FIG. 34, hatched areas indicate a fact that there are more than 65536 code sequences CL.

In this manner, with the code sequence generation method according to the second embodiment of the present invention, the top, middle and end parts of the code sequence CL are focused. The values of the precursor RUN, middle RUN and postcursor RUN are restricted. Accordingly, under the condition N11 about the code sequence group U10, the code sequence group U11 including 65627 code sequences CL can be created if the maximum run length k is thirty.

In addition, with the code sequence generation method according to the second embodiment of the present invention, the values of the precursor positive RMTR, middle positive RMTR and postcursor positive RMTR are restricted. Accordingly, under the condition N12 about the code sequence group U11, the code sequence group U12 including 65605 code sequences CL can be created if the RMTR is six.

(2-2-4) Correlation Table

The code sequence generation method according to the second embodiment of the present invention selects, out of the code sequence group U12, 65536 code sequences (34-bit) CL, and then relates each of them with the 16-bit data DT.

The 65536 code sequences CL each of which is related to each 16-bit piece of data DT will be also referred to as "16/34 MSN codes MC2".

The modulation section 31 and demodulation section 32 of the optical disc device 30 (FIG. 1) stores the 16/34 MSN codes MC2 as a correlation table TBL2 where 16-bit data DT and 34-bit code sequences CL are associated with one another as shown in FIGS. 35 to 38. The modulation section 31 and the demodulation section 32 checks the correlation table TBL2 when needed.

(2-3) Configuration of Modulation Section and Demodulation Section

Figure 39:
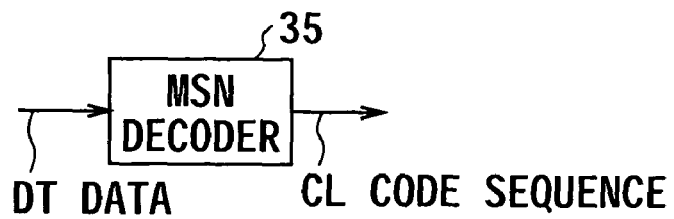
FIG. 39 is a block diagram illustrating the configuration of a modulation section according to a second embodiment of the present invention.
Figure 40:
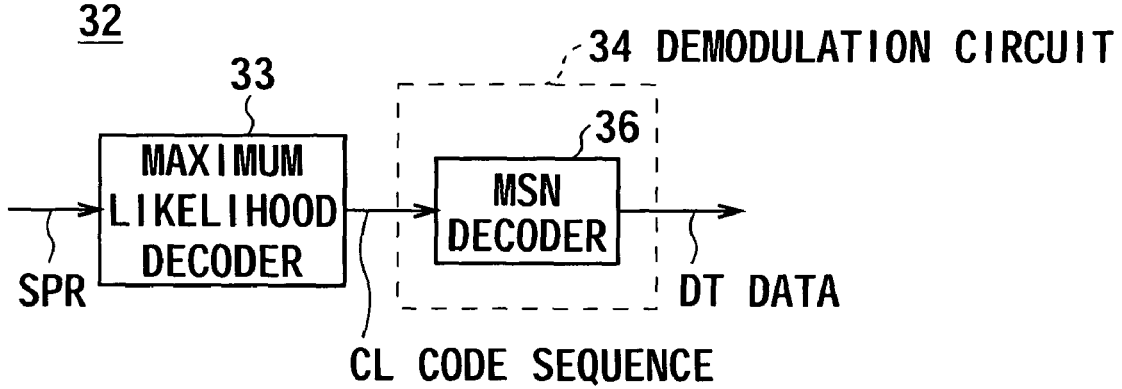
FIG. 40 is a block diagram illustrating the configuration of a demodulation section according to a second embodiment of the present invention.

As shown in FIG. 39, while the modulation section 3 according to the first embodiment of the present invention includes the DC control circuit 22, the modulation section 31 of the optical disc device 30 does not contain the circuit 22.

The MSN encoder 35 of the modulation section 31 is designed in the same way as that of the MSN encoder 21 according to the first embodiment of the present invention. A ROM (not shown) of the MSN encoder 35 contains the correlation table TBL2.

The MSN encoder 35 divides the data DT, which is sequentially supplied, into 16-bit parts, and modulates, in accordance with the correlation table TBL2, the 16-bit data DT into the 34-bit code sequences CL, and then output them.

By the way, the modulation section 31 does not generate and output the DCC code sequences, while that of the first embodiment does.

When the optical disc device 30 records the data DT on the optical disc 100, the modulation section 31 modulates, in accordance with the correlation table TBL2, the data DT into the code sequences CL of 16/34 MSN codes MC2. The optical disc device 30 subsequently forms, in accordance with the code sequences CL, pit rows on the optical disc 100 through the recording control circuit 4 and the optical pickup 5 (FIG. 1).

On the other hand, as shown in FIG. 39, the modulation section 34 of the optical disc device 30 does not include the DC control bit removal section 24, while the demodulation section 10 according to the first embodiment of the present invention does.

The most likelihood decoder 33 is designed in the same way as the most likelihood decoder 11 according to the first embodiment of the present invention. The ROM (not shown) of the most likelihood decoder 33 contains trellis data indicating trellis diagrams that corresponds to both the PR equalization method of the PR equalizer 9 and the 16/34 MSN codes MC2.

The most likelihood decoder 33 performs the TCPRML detection process on the analog PR equalization signal SPR supplied from the PR equalizer 9 in accordance with the trellis data to detect the code sequences CL each of which is the 34-bit MSN codes. The most likelihood decoder 33 subsequently supplies the code sequences CL to the MSN decoder 36 of the demodulation circuit 34.

The MSN decoder 36 is designed in the same way as the MSN decoder 23 according to the first embodiment of the present invention. The ROM (not shown) of the MSN decoder 36 contains the correlation table TBL2.

When the code sequences CL are supplied from the most likelihood decoder 33, the MSN decoder 36 sequentially demodulates, in accordance with the correlation table TBL2, the 34-bit code sequences CL of MSN codes into the 16-bit data DT, and then outputs them.

When the optical disc device 30 reproduces the data DT from the optical disc 100, the optical disc device 30 reads out the reproduction RF signal from the pit row on the optical disc 100, and performs processes such as PLL and PR equalization process to acquire the PR equalization signal SPR, and detects the code sequences CL from the PR equalization signal SPR, and then, in accordance with the correlation table TBL2, demodulates the code sequences of 16/34 MSN codes MC2 into the data DT, by using the demodulation section 32.

In this manner, the modulation section 31 and demodulation section 32 of the optical disc device 30 respectively performs, based on the correlation table TBL2, the modulation process of converting the 16-bit data DT into the 34-bit code sequences CL, and the demodulation process of converting the 34-bit code sequences CL into the 16-bit data DT.

(2-4) Operation and Effects

In the code sequence generation method according to the second embodiment of the present invention, based on the reduced-type FSTD (FIG. 4) where the symbols are expressed in the NRZI method and the ADS is restricted, one state is divided into the following three states to generate the divided-and-reduced-type FSTD (FIG. 31): a state that comes immediately after generating symbols of "00", a state that comes immediately after generating symbols of "01", and a state that comes immediately after generating symbols of "10". In addition, under the condition N10, the state transition of the divided-and-reduced-type FSTD is limited to in the range of t0 to t21, the initial and end states are set to the state t2, and the number of transition is set to thirty four.

Accordingly, the code sequence generation method according to the second embodiment of the present invention performs the state transition thirty four times in accordance with the 16/34 divided-and-reduced-type FSTD. This creates 66193 (more than $2^{16}$ 65536) code sequences CL of MSN codes with the limitation of minimum run length d=2. That is to say, it creates the 16/34 MSN codes with the minimum run length d=2 where the 16-bit data DT is associated with the 34-bit code sequence CL.

In addition, as for the code sequence group U10 including 66193 code sequences CL, the code sequence generation method according to the second embodiment of the present invention focuses the top, middle and end parts. In addition, the maximum number of consecutive symbols of "0" is limited on each part. That creates the code sequence group U11 including 65627 code sequences CL if the maximum run length k is limited to thirty.

In this case, in the similar way to that of the first embodiment, the top, middle and end parts of code sequences CL are focused. Therefore, it limits not only the number of consecutive symbols of "0" in one code sequence CL but also the number of consecutive symbols of "0" in the adjoining code sequences CL. This makes sure that it limits the value of the maximum run length k of the code sequence group U11 even if there are the consecutive code sequences CL.

Furthermore, in the code generation method according to the second embodiment of the present invention, as for the code sequence group U11, there are two cases: a case where the top symbol of the code sequence CL is "1", and a case where the top symbol of the code sequence CL is "0". In addition, the top, middle and end parts are focused to put limitation on the RMTR. This creates the code sequence group U12 including 65606 code sequences CL if the RMTR is limited to six.

In this case, in the similar way to the case where the maximum run length k is restricted, as for the code sequence group U12, the top, middle and end parts of code sequences CL are focused. Therefore, it limits not only the number of consecutive shortest run code sequences of "100" in one code sequence CL but also the number of consecutive shortest run code sequences of "100" in the adjoining code sequences CL.

This makes sure that it limits the value of the RMTR of the code sequence group U12 even if there are the consecutive code sequences CL.

Figure 41:
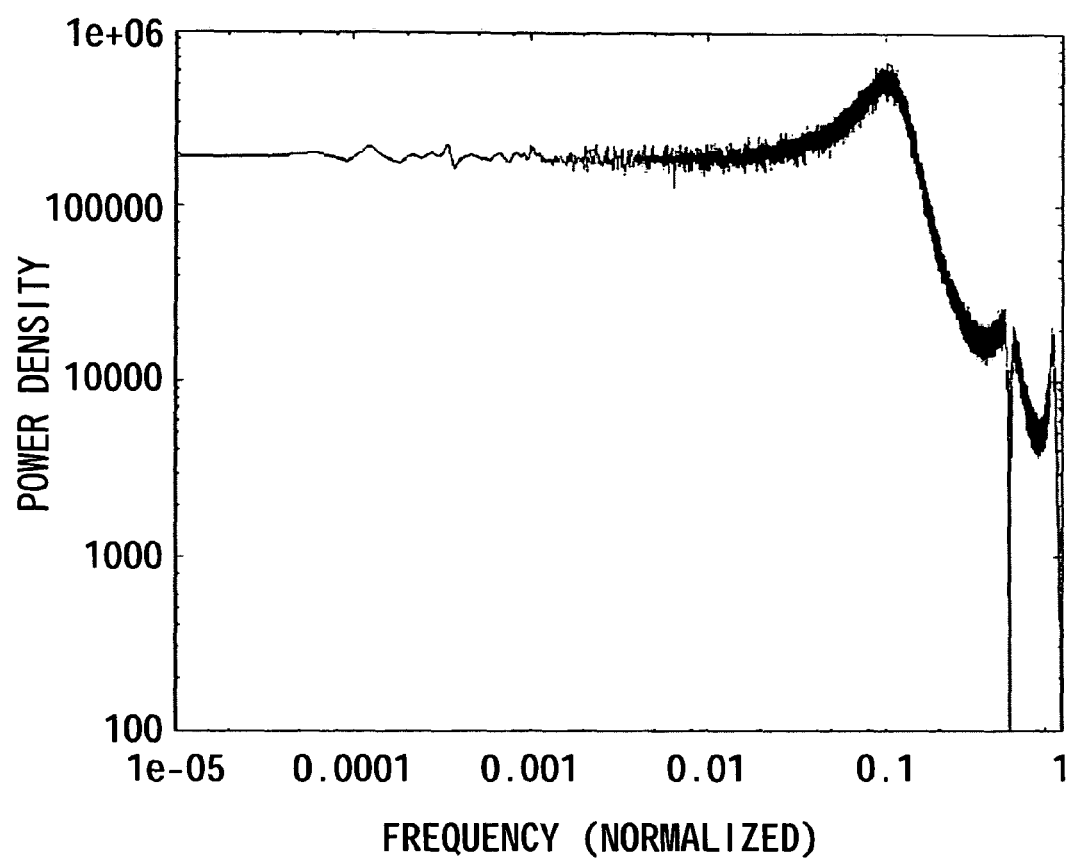
FIG. 41 is a schematic diagram illustrating the power spectrum density of 16/34 MSN codes.

FIG. 41, which corresponds to FIG. 29, shows the result of computations about the power spectrum density of code sequences CL, where the random pattern simulation has been performed using the 16/34 MSN codes MC2.

In FIG. 41, the PSD is almost zero at Nyquist frequency (where the normalized frequency is 0.5) like that of FIG. 29 of the first embodiment. This tells that there is a null point.

Accordingly, as for the 16/34 MSN codes MC2 (with minimum run length d=2) generated by the code sequence generation method according to the second embodiment of the present invention, in a case in which it may need to limit the minimum run length d to more than one due to the use of the optical disc 100 as a storage medium, in the similar way to that of the first embodiment, the null point (Nyquist frequency) of the frequency spectrum of the PR equalization process applied for the reproduction process of the optical disc 100 can correspond to the null point (Nyquist frequency) of the frequency spectrum of the 16/34 MSN codes MC2.

Accordingly, as for the TCPRML detection process by the maximum likelihood decoder 33, the optical disc device 30 can increase the minimum geometric detection distance more than the typical Viterbi decoder does, in the similar way to that of the first embodiment.

As a result, the optical disc device 30 according to the second embodiment of the present invention increases the reproduction characteristics about the data DT, in the same way as the optical disc device 1 according to the first embodiment of the present invention does.

The above configuration makes this possible: based on the reduced-type FSTD where the symbols are expressed in the NRZI method and the ADS is restricted, one state is divided into the following three states to generate the 16/34 divided-and-reduced-type FSTD: a state that comes immediately after generating symbols of "00", a state that comes immediately after generating symbols of "01", and a state that comes immediately after generating symbols of "10". Accordingly, it can produce the 16/34 MSN codes MC2 with minimum run length d=2 when the state transition is performed based on the 16/34 divided-and-reduced-type FSTD.

(3) Other Embodiments

In the above-noted first and second embodiments, the code sequences CL are generated based on the 16/26 divided-and-reduced-type FSTD (FIG. 7) or the 16/34 divided-and-reduced-type FSTD (FIG. 31) which is substantially formed in a staircase pattern. However the present invention is not limited to this. The code sequences CL may be generated based on the differently-shaped FSTD.

For example, to create the MSN codes with minimum run length d=1, the divided-and-reduced-type FSTD may be created by dividing one state of the reduced-type FSTD (FIG. 4) into the following two states: a state that comes immediately after a symbol of "0", and a state that comes immediately after a symbol of "1". To create the MSN codes with minimum run length d=2, the divided-and-reduced-type FSTD may be created by dividing one state of the reduced-type FSTD (FIG. 4) into the following three states: a state that comes immediately after symbols of "00", a state that comes immediately after symbols of "01" and a state that comes immediately after symbols of "10".

To create the MSN codes with minimum run length d=dn (dn: an integer more than three), the divided-and-reduced-type FSTD may be created by focusing dn code symbols generated immediately before and dividing one state of the reduced-type FSTD into the following dn+1 states: a state that comes immediately after symbols of "00 . . . 00", a state that comes immediately after symbols of "00 . . . 01", . . . , a state that comes immediately after symbols of "01 . . . 00", . . . , and a state that comes immediately after symbols of "10 . . . 00".

In the above-noted first and second embodiments, the code sequences CL are generated in accordance with the divided-and-reduced-type FSTD in FIGS. 7 and 31. However the present invention is not limited to this. The code sequences CL may be created in accordance with the not reduced but divided FSTD like those in FIGS. 5 and 30. This may create a plurality of the same code sequences CL from the different paths of state transition. In this case, some of them may be removed to leave one code sequence CL.

Furthermore, in the above-noted first embodiment, more than 65536 code sequences CL (corresponding to the number of bit m=16 of the data DT) are generated under the condition N0 where the state transition of the divided-and-reduced-type FSTD (FIG. 6) is limited in the range of s0 to s9, the initial and end states are set to the state s1, and the number of transition (or the code length) n is set to twenty six. However the present invention is not limited this. The range of state transition, the initial and end states, and the number of transition (or the code length) n may be set in a different manner to create more than 65536 code sequences CL.

Furthermore, in the above-noted second embodiment, more than 65536 code sequences CL (corresponding to the number of bit m=16 of the data DT) are generated under the condition N10 where the state transition of the divided-and-reduced-type FSTD (FIG. 31) is limited in the range of t0 to t21, the initial and end states are set to the state t2, and the number of transition (or the code length) n is set to thirty four. However the present invention is not limited this. The range of state transition, the initial and end states, and the number of transition (or the code length) n may be set in a different manner to create more than 65536 code sequences CL.

In the above-noted first and second embodiments, the maximum run length k is set as small as possible such that more than 65536 code sequences CL can be extracted. However the present invention is not limited to this. As for the method of the first embodiment, the maximum run length k can be more than fifteen if it can create more than 65536 code sequences CL. As for the method of the second embodiment, the maximum run length k can be more than thirty one if it can create more than 65536 code sequences CL. Alternatively, the maximum run length k may not be limited.

In the above-noted first and second embodiments, the RMTR is set as small as possible such that more than 65536 code sequences CL can be extracted. However the present invention is not limited to this. As for the method of the first embodiment, the RMTR can be more than eleven if it can create more than 65536 code sequences CL. As for the method of the second embodiment, the RMTR can be more than seven if it can create more than 65536 code sequences CL. Alternatively, the RMTR may not be limited.

Furthermore, in the above-noted embodiments, the maximum run length k is limited first, and then the RMTR is limited. However the present invention is not limited to this. The RMTR may be limited first before the maximum run length k is limited.

Furthermore, in the above-noted first and second embodiments, the bit number m of data DT is set to sixteen. However the present invention is not limited to this. The bit number m may be set to other numbers such as twelve or eighteen. In this case, the bit number m may be set in accordance with conditions such as processing load of the MSN encoder 21 (34) and MSN decoder 23 (36) and data size of the correlation tables TBL1 and TBL2.

Furthermore, in the above-noted first and second embodiments, each data DT is associated with each code sequence CL like those in the correlation table TBL1 (FIGS. 12 to 15) or the correlation table TBL2 (FIGS. 35 to 38). However the present invention is not limited to this. The data DT and the code sequences CL may be associated with one another in a different manner.

Furthermore, in the above-noted first embodiment, the 16/26 MSN codes are generated from the code sequence group U3. However the present invention is not limited to this. The 16/26 MSN codes may be generated from the code sequence group U4.

Furthermore, in the above-noted first embodiment, the maximum likelihood decoder 11 performs the TCPRML detection process in accordance with the trellis diagrams in FIG. 17 or 18. However the present invention is not limited to this. The maximum likelihood decoder 11 may perform the TCPRML detection process in accordance with other trellis diagrams. If it is based on the state transition diagrams in FIGS. 16A to 16C, the trellis diagrams may include various paths.

Furthermore, in the above-noted first embodiment, the number M, which indicates the number of pieces of data DT in one group to which the additional bit is added when the modulation section 3 and the demodulation section 10 performs the DC control, is set to three. However the present invention is not limited to this. The number M may be other numbers. The DC control may not be performed. In the second embodiment, the DC control may be performed. In this case, the modulation section 31 and the demodulation section 32 may be designed in the same way as the modulation section 3 and the demodulation section 10 in the first embodiment.

In the above-noted embodiments, the optical disc devices 1 and 30 are applied to record or reproduce data from the optical disc 100. However the present invention is not limited to this. An optical disc device only capable of recording or reproducing data from the optical disc 100 may be applied.

Furthermore, in the above-noted embodiments, to record the data DT on the optical disc 100, the optical disc devices 1 and 30 forms pit rows on the optical disc 100 in accordance with the MSN codes in which the minimum run length d is limited. However the present invention is not limited to this. The optical disc 100 may be produced by stampers (injection molding, compression molding or the like) where the pattern of pit rows is formed in accordance with the MSN codes. In this way, the optical disc 100 may be produced in various manners such that the MSN codes (in which the minimum run length d is limited) are recorded on the optical disc 100.

Furthermore, in the above-noted first and second embodiments, the optical disc 100 is a storage medium of the optical disc device 1. In addition, the code sequences CL of MSN codes produced by the code sequence generation method according to an embodiment of the present invention are used to modulate the data DT into the code sequences CL and to demodulate the code sequences CL into the data DT. However, the present invention is not limited to this. Other kinds of disc devices for other storage media (i.e. recording channels) may be used to perform the modulation process and demodulation process on the data and the MSN codes where the minimum run length d is limited: a magnetic disk device for magnetic disks, a magneto optical disc device for magneto optical discs and the like. Alternatively, the method according to the above first and second embodiments of the present invention may be applied to a transmitting device and a receiving device: the transmitting and receiving devices perform the modulation process and demodulation process on the data and the MSN codes where the minimum run length d is limited when they communicate via communication media (i.e. communication channels) such as various kinds of telecommunications, optical communications, cable communications, and wireless communications.

In this case, the minimum run length d may be determined based on the characteristics of the recording channels or communication channels, and the MSN codes with the determined minimum run length d may be applied.

In the above-noted embodiments, the MSN encoder 21 and DC control circuit 22 of the modulation section 3 are hardware. However the present invention is not limited to this. The MSN encoder 21 and DC control circuit 22 of the modulation section 3 can be software.

In this case, the modulation section 3 may include a Digital Signal Processor (DSP) capable of performing a modulation program to offer the functions of code sequence generation and DCC code sequence selection.

Furthermore, in the above-noted embodiments, the maximum likelihood decoder 11, MSN decoder 23 and DC control bit removal section 24 of the modulation section 10 are hardware. However the present invention is not limited to this. The maximum likelihood decoder 11, MSN decoder 23 and DC control bit removal section 24 of the modulation section 10 can be software.

In this case, in the similar way to that of the modulation section 3, the demodulation section 10 may include a DSP capable of performing a demodulation program to offer the functions of demodulation and additional bit removal.

The following storage media may be applied to as a storage medium for storing the modulation program and the demodulation program: the RAM (not shown) of the control section 2, and external storage media such as flexi disk and "MEMORY STICK (Registered Trademark of Sony Corporation)". The modulation and demodulation programs may be installed on the internal storage medium from the external storage medium through a communication cable (such as Universal Serial Bus and "Ethernet (Registered Trademark)"), a wireless Local Area Network (such as IEEE802.11a/b/g (IEEE: Institute of Electrical and Electronics Engineers)) or the like.

In addition, an information processing apparatus, such as personal computers, may execute the modulation and demodulation programs to perform the code sequence generation process, the demodulation process and the like.

The code sequences generated by the code sequence generation method according to an embodiment of the present invention can be applied to various modulation devices, demodulation devices, storage media and communication paths.

It should be understood by those skilled in the art that various modifications, combinations, sub-combinations and alterations may occur depending on design requirements and other factors insofar as they are within the scope of the appended claims or the equivalents thereof.

What is claimed is:

1. A code sequence generation method for generating a Matched Spectral Null (MSN) code sequence where a null point of a frequency spectrum on a recording channel or communication channel of a code sequence is matched with a null point of a frequency spectrum of a Partial Response (PR) equalized signal including said code sequence, said code sequence generation method comprising:

a state transition diagram analyzing step of dividing each state corresponding to a finite state transition diagram, where a value d (d: an integer greater or equal to 1) of minimum run of said MSN code sequence is restricted and a value of Alternating Digital Sum (ADS) of said code sequence on a Not Return to Zero Inverse (NRZI) method is also restricted into d+1 states in based on a preceding code sequence that is comprised of d codes output immediately before, and restricting transition to a next state in accordance with said preceding code sequence to form a finite division state transition diagram where output of codes on the transition to said next state is restricted; and a code sequence generation step of generating, in accordance with said finite division state transition diagram, a MSN code sequence where output of consecutive codes of "1" on said NRZI method is prohibited and a minimum run is limited to be greater or equal to one.

2. The code sequence generation method according to claim 1, wherein if a code of "1" is included in said preceding code sequence associated with each said divided state, the output is restricted so that a code of "0" is output before moving to said next state.

3. The code sequence generation method according to claim 1, wherein the state transition diagram is formed such that two states that have the same absolute value of said SDS are reduced to one state.

4. The code sequence generation method according to claim 1, wherein said code sequence generation step provides transitions n times (n: an integer greater or equal to one) from a predetermined initial state to a predetermined end state on said finite division state transition diagram to generate said code sequence with code length n.

5. The code sequence generation method according to claim 2, wherein if said minimum run is limited to one, said finite division state transition diagram where each state of said finite state transition diagram is divided into two states corresponding to two patterns of said preceding code sequences of "0" and "1" and there is restriction to output a code of "0" when a state with said preceding code sequence of "1" is a next state.

6. The code sequence generation method according to claim 5, wherein said code sequence generation step sets a state that has said value of ADS of "0" on said finite division state transition diagram and comes immediately after outputting a code of "0" to initial and end states, and repeats the state transition twenty six times to generate said MSN code sequence with code length of 26.

7. The code sequence generation method according to claim 5, wherein said code sequence generation step includes a run limitation step of limiting a top run indicating the maximum number of consecutive codes of "0" that starts from a top of said MSN code sequence, an end run indicating the maximum number of consecutive codes of "0" that continues to an end of said MSN code sequence, and a middle run indicating the maximum number of consecutive codes of "0" on a middle part excluding the consecutive parts of symbols of "0" on said top and end of said MSN code sequence to a predetermined value to extract, out of a plurality of said MSN code sequences output in accordance with said finite division state transition diagram, said code sequences that are restricted such that a maximum run between said adjoining MSN code sequences or in one of said MSN code sequences is limited to be less or equal to a predetermined value.

8. The code sequence generation method according to claim 7 wherein:

said code sequence generation step sets a state that has said value of ADS of "0" on said finite division state transition diagram and comes immediately after outputting a code of "0" to initial and end states, and repeats the state transition twenty six times to generate said MSN code sequence with code length of 26; and said run limitation step limits said middle run to fourteen, said top run to six and said end run to eight to extract said MSN code sequence where the maximum run between said adjoining MSN code sequences or in one of said MSN code sequences is limited to fourteen.

9. The code sequence generation method according to claim 7, wherein said run limitation step limits said middle run to fourteen, said top run to seven and said end run to seven to extract said MSN code sequence where the maximum run between said adjoining MSN code sequences or in one of said MSN code sequences is limited to fourteen.

10. The code sequence generation method according to claim 7, wherein said code sequence generation step includes a RMTR limitation step performing the process of:

setting the maximum number of repetition (Repeated Minimum Transition Run-length (RMTR)) of a shortest run code sequence of "10" whose run from a top part of said MSN code sequence is the smallest when a code sequence on said top part is "101" as a positive top RMTR;

setting said RMTR that continues to an end part of said MSN code sequence when a code sequence on said end part is "010" as a positive end RMTR;

setting said RMTR on a part excluding the part where said shortest run codes repeatedly appear from said top and the part where said shortest run codes repeatedly appear to said end when the code sequence on said top part of said MSN code sequence is "101" as a positive middle RMTR;

setting said RMTR that continues from said top part when the code sequence on said top part of said MSN code sequence is "010" as a negative top RMTR;

setting said RMTR that continues to said end part when the code sequence on said end part of said MSN code sequence is "101" as a negative end RMTR;

setting said RMTR on a part excluding the part said shortest run code sequences repeatedly appear from said top and the part where said shortest run code sequences repeatedly appear to said end when the code sequence on the top part of said MSN code sequence is "010" as a negative middle RMTR; and limiting said positive middle RMTR, said positive top RMTR, said positive end RMTR, said negative middle RMTR, and said negative top RMTR to a predetermined value to extract, out of a plurality of MSN code sequences output in accordance with said finite division state transition diagram, said code sequences where said RMTR between said adjoining MSN code sequences or in one of said MSN code sequences is restricted.

11. The code sequence generation method according to claim 10, wherein:

said run limitation step limits said middle run to fourteen, said top run to six and said end run to eight to extract said MSN code sequence where the maximum run between said adjoining MSN code sequences or in one of said MSN code sequences is limited to fourteen; and said RMTR limitation step limits said positive middle RMTR to ten, said positive top RMTR to four, said positive end RMTR to five, said negative middle RMTR to ten and said negative top RMTR to ten to extract said MSN code sequence where the RMTR between said adjoining MSN code sequences or in one of said MSN code sequences is limited to ten.

12. The code sequence generation method according to claim 10, wherein:

said run limitation step limits said middle run to fourteen, said top run to seven and said end run to seven to extract said MSN code sequence where the maximum run between said adjoining MSN code sequences or in one of said MSN code sequences is limited to fourteen; and said RMTR limitation step limits said positive middle RMTR to ten, said positive top RMTR to four, said positive end RMTR to five, said negative middle RMTR to ten and said negative top RMTR to ten to extract said MSN code sequence where the RMTR between said adjoining MSN code sequences or in one of said MSN code sequences is limited to ten.

13. The code sequence generation method according to claim 2, wherein said state transition diagram formation step forms, if the minimum run of said MSN code sequence is limited to two, said finite division state transition diagram where each state of said finite state transition diagram is divided into three states corresponding to three patterns of said preceding code sequences of "00", "01 and "10" and there is restriction to output a code of "0" when a state with said preceding code sequence of "01" or "10" moves to a next state.

14. The code sequence generation method according to claim 13, wherein said code sequence generation step sets a state that has the value of ADS of "−1" on said finite division state transition diagram and comes immediately after outputting a code of "00" to initial and end states, and repeats the state transition thirty four times to generate said code sequence with code length of 34.

15. The code sequence generation method according to claim 13, wherein said code sequence generation step includes a run limitation step of limiting a top run indicating the maximum number of consecutive codes of "0" that starts from a top of said MSN code sequence, an end run indicating the maximum number of consecutive codes of "0" that continues to an end of said MSN code sequence, and a middle run indicating the maximum number of consecutive codes of "0" on a middle part excluding the consecutive parts of symbols of "0" on said top and end of said MSN code sequence to a predetermined value to extract, out of a plurality of said MSN code sequences output in accordance with said finite division state transition diagram, said code sequences that are restricted such that a maximum run between said adjoining MSN code sequences or in one of said MSN code sequences is limited to be less or equal to a predetermined value.

16. The code sequence generation method according to claim 13, wherein:

said code sequence generation step sets a state that has said value of ADS of "−1" on said finite division state transition diagram and comes immediately after outputting a code of "0" to initial and end states, and repeats the state transition thirty four times to generate said MSN code sequence with code length of 34; and said run limitation step limits said middle run to thirty, said top run to fourteen and said end run to sixteen to extract said MSN code sequence where the maximum run between said adjoining code sequences or in one of said code sequences is limited to thirty.

17. The code sequence generation method according to claim 15, wherein said code sequence generation step includes a RMTR limitation step performing the process of:

setting the maximum number of repetition (RMTR) of a shortest run code sequence of "100" whose run from a top part of said MSN code sequence is the smallest when a code sequence on said top part is "1001" as a positive top RMTR;

setting said RMTR that continues to an end part of said MSN code sequence when a code sequence on said end part is "0100" as a positive end RMTR;

setting said RMTR on a part excluding the part where said shortest run codes repeatedly appear from said top and the part where said shortest run codes repeatedly appear to said end when the code sequence on said top part of said MSN code sequence is "1001" as a positive middle RMTR; and limiting said positive middle RMTR, said positive top RMTR and said positive end RMTR to a predetermined value to extract, out of a plurality of MSN code sequences output in accordance with said finite division state transition diagram, said code sequences where said RMTR between said adjoining MSN code sequences or in one of said MSN code sequences is restricted.

18. The code sequence generation method according to claim 17, wherein:

said run limitation step limits said middle run to thirty, said top run to fourteen and said end run to sixteen to extract said MSN code sequence where the maximum run between said adjoining code sequences or in one of said code sequences is limited to thirty; and said RMTR limitation step limits said positive middle RMTR to six, said positive top RMTR to two and said positive end RMTR to three to extract said code sequence where the RMTR between said adjoining code sequences or in one of said code sequences is limited to six.

19. A data encoding apparatus comprising a correlation table where a data sequence with a predetermined number of bits is associated with a code sequence with a predetermined number of bits, said data sequence being translated into said code sequence to allow a predetermined demodulation section to demodulate said code sequence into said data sequence in accordance with said correlation table, wherein said code sequence is NRZI format comprising a MSN code sequence where a null point of a frequency spectrum on a recording channel or communication channel of said code sequence is matched with a null point of a frequency spectrum of a PR equalized signal including said code sequence and a minimum run length is limited to be greater or equal to one.

20. The data encoding apparatus according to claim 19, wherein said data sequence is 16 bits; and a minimum run length of said MSN code sequence is limited to one and said MSN code sequence's code length is 26 bits.

21. The data encoding apparatus according to claim 20, wherein
said MSN code sequence is restricted such that a top run indicating the maximum number of consecutive codes of "0" that starts from a top of said MSN code sequence is limited to six, an end run indicating the maximum number of consecutive codes of "0" that continues to an end of said MSN code sequence is limited to eight, and a middle run indicating the maximum number of consecutive codes of "0" on a middle part excluding the consecutive parts of symbols of "0" on said top and end of said MSN code sequence is limited to fourteen.

22. The data encoding apparatus according to claim 21, wherein
said MSN code sequence is restricted such that said top run is limited to seven, said end run is limited to seven and said middle run is limited to fourteen.

23. The data encodes apparatus according to claim 20, wherein
said MSN code sequence is restricted such that a positive top RMTR indicating the maximum number of repetition (RMTR) of a shortest run code sequence of "10" whose run from a top part of said MSN code sequence is the smallest when a code sequence on said top part is "101" is limited to four; a positive end RMTR indicating said RMTR that continues to an end part of said MSN code sequence when a code sequence on said end part is "010" is limited to five; a positive middle RMTR indicating said RMTR on a part excluding the part where said shortest run codes repeatedly appear from said top and the part where said shortest run codes repeatedly appear to said end when the code sequence on said top part of said MSN code sequence is "101" is limited to ten; a negative top RMTR indicating said RMTR that continues from said top part when the code sequence on said top part is "010" is limited to ten; and a negative middle RMTR indicating said RMTR on a part excluding the part where said shortest run code sequences repeatedly appear from said top and the part where said shortest run code sequences repeatedly appear to said end when the code sequence on said top part is "010" is limited to ten.

24. The data encoding apparatus according to claim 20, wherein
said MSN code sequence is restricted such that a positive top RMTR indicating the maximum number of repetition (RMTR) of a shortest run code sequence of "10" whose run from a top part of said MSN code sequence is the smallest when a code sequence on said top part is "101" is limited to four; a positive end RMTR indicating said RMTR that continues to an end part of said MSN code sequence when a code sequence on said end part is "010" is limited to five; a positive middle RMTR indicating said RMTR on a part excluding the part where said shortest run codes repeatedly appear from said top and the part where said shortest run codes repeatedly appear to said end when the code sequence on said top part of said MSN code sequence is "101" is limited to ten; a negative top RMTR indicating said RMTR that continues from said top part when the code sequence on said top part is "010" is limited to ten; and a negative middle RMTR indicating said RMTR on a part excluding the part where said shortest run code sequences repeatedly appear from said top and the part where said shortest run code sequences repeatedly appear to said end when the code sequence on said top part is "010" is limited to ten.

25. The data encoding apparatus according to claim 19, wherein
said data sequence is 16 bits; and
a minimum run of said MSN code sequence is limited to two and said MSN code sequence's code length is 34 bits.

26. The data encoding apparatus according to claim 19, wherein
said MSN code sequence is restricted such that a top run indicating the maximum number of consecutive codes of "0" that starts from a top of said MSN code sequence is limited to fourteen, an end run indicating the maximum number of consecutive codes of "0" that continues to an end of said MSN code sequence is limited to sixteen, and a middle run indicating the maximum number of consecutive codes of "0" on a middle part excluding the consecutive parts of symbols of "0" on said top and end of said MSN code sequence is limited to thirty.

27. The data encoding apparatus according to claim 26, wherein
said MSN code sequence is restricted such that a positive top RMTR indicating the maximum number of repetition (RMTR) of a shortest run code sequence of "100" whose run from a top part of said MSN code sequence is the smallest when a code sequence on said top part is "1001" is limited to fourteen; a positive end RMTR indicating said RMTR that continues to an end part of said MSN code sequence when a code sequence on said end part is "0100" is limited to sixteen; and a positive middle RMTR indicating said RMTR on a part excluding the part where said shortest run codes repeatedly appear from said top and the part where said shortest run codes repeatedly appear to said end when the code sequence on said top part of said MSN code sequence is "1001" is limited to thirty.

28. The data encoding apparatus according to claim 19, wherein said data encoding section includes:
block modulation means for dividing said data sequentially input into (m×M−1)-bit addition data blocks (M: an integer greater or equal to two) of said data sequence, and sequentially modulating, in accordance with said correlation table, (M−1) data sequences each of which includes m×(M−1)-bit data obtained from a top of said addition data block into (M−1) MSN code sequences;
addition modulation means for generating two types of addition data by adding an additional bit of "0" or "1" to said data sequence including (m−1)-bit data obtained from an end of said addition data block, and modulating, in accordance with said correlation table, said two types of addition data into two types of addition code sequences;
storage means for temporarily storing said two types of addition code sequences and (M−1) MSN code sequences modulated after said addition code sequences; and
addition code sequence selection means for performing Direct Current (DC) control of said code sequence by calculating Digital Sum Values (DSV) of M code sequences in a case in which said (M−1) MSN code sequences are output from said storage means after said two types of addition code sequences, selecting one whose DSV is closer to zero out of said two types of addition code sequences, and sequentially outputting the selected addition code sequence along with said (M−1) MSN code sequences.

29. A data encoding method executed by a microprocessor controlled system comprising:
generating a signal in accordance with a correlation table where a data sequence with a predetermined number of bits is translated into a code sequence with a predetermined number of bits, said data sequence being translated as said code sequence to allow a demodulation section to demodulate said code sequence into said data sequence in accordance with said correlation table, wherein
said code sequence is NRZI format comprised of a MSN code sequence where a null point of a frequency spectrum on a recording channel or communication channel of said code sequence is matched with a null point of a frequency spectrum of a PR equalized signal including said code sequence and a minimum run length is limited to be greater or equal to one.

30. A data encoding program executed by a microprocessor controlled system for causing the microprocessor controlled system to execute:
data encoding in accordance with a correlation table where a data sequence with a predetermined number of bits is associated with a code sequence with a predetermined number of bits, said data sequence being translated into said code sequence to allow a decoding section to decode said code sequence into said data sequence in accordance with said correlation table, wherein
said code sequence NRZI format comprised of a MSN code sequence where a null point of a frequency spectrum on a recording channel or communication channel of said code sequence is matched with a null point of a frequency spectrum of a PR equalized signal including said code sequence and a minimum run length is limited to be greater or equal to one.

31. A data decoding apparatus comprising:
a decoding section that decodes a signal in accordance with a correlation table where a data sequence with a predetermined number of bits is associated with a code sequence with a predetermined number of bits, said code sequence having been previously generated by translating said data sequence into said code sequence, wherein
said code sequence is NRZI format comprised of a MSN code sequence where a null point of a frequency spectrum on a recording channel or communication channel of said code sequence is matched with a null point of a frequency spectrum of a PR equalized signal including said code sequence and a minimum run is limited to be greater or equal to one.

32. The data decoding apparatus according to claim 31, wherein
said data sequence is 16 bits; and
a minimum run length of said MSN code sequence is limited to one and said MSN code sequence's code length is 26 bits.

33. The data decoding apparatus according to claim 32, wherein
said MSN code sequence is restricted such that a top run indicating the maximum number of consecutive codes of "0" that starts from a top of said MSN code sequence is limited to six, an end run indicating the maximum number of consecutive codes of "0" that continues to an end of said MSN code sequence is limited to eight, and a middle run indicating the maximum number of consecutive codes of "0" on a middle part excluding the consecutive parts of symbols of "0" on said top and end of said MSN code sequence is limited to fourteen.

34. The data decoding apparatus according to claim 33, wherein
said MSN code sequence is restricted such that said top run is limited to seven, said end run is limited to seven and said middle run is limited to fourteen.

35. The data decoding apparatus according to claim 33, wherein
said MSN code sequence is restricted such that a positive top RMTR indicating the maximum number of repetition (RMTR) of a shortest run code sequence of "10" whose run from a top part of said MSN code sequence is the smallest when a code sequence on said top part is "101" is limited to four; a positive end RMTR indicating said RMTR that continues to an end part of said MSN code sequence when a code sequence on said end part is "010" is limited to five; a positive middle RMTR indicating said RMTR on a part excluding the part where said shortest run codes repeatedly appear from said top and the part where said shortest run codes repeatedly appear to said end when the code sequence on said top part of said MSN code sequence is "101" is limited to ten; a negative top RMTR indicating said RMTR that continues from said top part when the code sequence on said top part is "010" is limited to ten; and a negative middle RMTR indicating said RMTR on a part excluding the part where said shortest run code sequences repeatedly appear from said top and the part where said shortest run code sequences repeatedly appear to said end when the code sequence on said top part is "010" is limited to ten.

36. The data decoding apparatus according to claim 34, wherein
said MSN code sequence is restricted such that a positive top RMTR indicating the maximum number of repetition (RMTR) of a shortest run code sequence of "10" whose run from a top part of said MSN code sequence is the smallest when a code sequence on said top part is "101" is limited to four; a positive end RMTR indicating said RMTR that continues to an end part of said MSN code sequence when a code sequence on said end part is "010" is limited to five; a positive middle RMTR indicating said RMTR on a part excluding the part where said shortest run codes repeatedly appear from said top and the part where said shortest run codes repeatedly appear to said end when the code sequence on said top part of said MSN code sequence is "101" is limited to ten; a negative top RMTR indicating said RMTR that continues from said top part when the code sequence on said top part is "010" is limited to ten; and a negative middle RMTR indicating said RMTR on a part excluding the part where said shortest run code sequences repeatedly appear from said top and the part where said shortest run code sequences repeatedly appear to said end when the code sequence on said top part is "010" is limited to ten.

37. The data decoding apparatus according to claim 31, wherein
said data sequence is 16 bits; and
a minimum run length of said code sequence is limited to two and said code sequence's code length is 34 bits.

38. The data decoding apparatus according to claim 37, wherein
said MSN code sequence is restricted such that a top run indicating the maximum number of consecutive codes of "0" that starts from a top of said MSN code sequence is limited to fourteen, an end run indicating the maximum number of consecutive codes of "0" that continues to an end of said MSN code sequence is limited to sixteen, and a middle run indicating the maximum number of consecutive codes of "0" on a middle part excluding the consecutive parts of symbols of "0" on said top and end of said MSN code sequence is limited to thirty.

39. The data decoding apparatus according to claim 38, wherein
said MSN code sequence is restricted such that a positive to RMTR indicating the maximum number of repetition (RMTR) of a shortest run code sequence of "100" whose run from a top part of said MSN code sequence is the smallest when a code sequence on said top part is "1001" is limited to fourteen; a positive end RMTR indicating said RMTR that continues to an end part of said MSN code sequence when a code sequence on said end part is "0100" is limited to sixteen; and a positive middle RMTR indicating said RMTR on a part excluding the part where said shortest run codes repeatedly appear from said top and the part where said shortest run codes repeatedly appear to said end when the code sequence on said top part of said MSN code sequence is "1001" is limited to thirty.

40. The data decoding apparatus according to claim 31 further comprising
a Trellis Coded Partial Response Maximum Likelihood (TCPRML) detection section that detects said code sequence by performing a Partial Response (PR) equalization process and a maximum likelihood decoding process on a signal acquired through said transmission channel in accordance with a trellis configuration generated based on a PR equalized state transition diagram where a minimum value d of run is limited to be greater or equal to one and a finite division state transition diagram.

41. The data decoding apparatus according to claim 40, wherein
said trellis configuration is associated with the passage of time, including a path that allows to move to a possible state at each time and from said state to a state at next time.

42. The data decoding apparatus according to claim 41, wherein
said data sequence is 16 bits;
a minimum run of said MSN code sequence is limited to one and said MSN code sequence is 26 bits; and
said trellis configuration is generated based on a state transition diagram corresponding to PR(1,1).

43. The data decoding apparatus according to claim 41, wherein
said data sequence is 16 bits;
a minimum run of said MSN code sequence is limited to one and said MSN code sequence is 26 bits; and
said trellis configuration is generated based on a state transition diagram corresponding to PR(1,1+x,x) (x: any real number).

44. The data decoding apparatus according to claim 41, wherein
said data sequence is 16 bits;
a minimum run of said MSN code sequence is limited to one and said MSN code sequence is 26 bits; and
said trellis configuration is generated based on a state transition diagram corresponding to PR(1,1+a,a+b,b) (a and b: any real number).

45. The data decoding apparatus according to claim 31, wherein
said MSN code sequence is modulated for each m-bit data in accordance with said correlation table from addition data where each (M×m−1) bit data (M: an integer greater or equal to one) is associated with an additional bit to bring DSV of said MSN code sequence close to zero, wherein
said data decoding section further includes:
data decoding means for sequentially decoding, in accordance with said correlation table, said MSN code sequence into said data sequence; and
additional bit removal means for removing said additional bit from each of M data sequences to extract an original data sequence.

46. A data decoding method executed by a microprocessor controlled system comprising:
decoding a signal in accordance with a correlation table where a data sequence with a predetermined number of bits is associated with a code sequence with a predetermined number of bits, said code sequence having been previously generated by translating said data sequence into said code sequence, wherein
said code sequence is NRZI format comprising a MSN code sequence where a null point of a frequency spectrum on a recording channel or communication channel of said code sequence is matched with a null point of a frequency spectrum of a PR equalized signal including said code sequence and a minimum run is limited to be greater or equal to one.

47. A data encoding program stored in an electronic memory of an information processing apparatus for causing the information processing apparatus to execute:
demodulating a signal in accordance with a correlation table where a data sequence with a predetermined number of bits is associated with a code sequence with a predetermined number of bits, said code sequence having been previously generated by translating said data sequence into said code sequence, wherein
said code sequence is NRZI format comprising a MSN code sequence where a null point of a frequency spectrum on a recording channel or communication channel of said code sequence is matched with a null point of a frequency spectrum of a PR equalized signal including said code sequence and a minimum run is limited to be greater or equal to one.

48. A storage medium storing a plurality of code sequences with predetermined bits that have been translated from data with predetermined bits, wherein
the code sequences are demodulated in accordance with a correlation table such that a data sequence with a predetermined number of bits is associated with a code sequence with a predetermined number of bits, said code sequence having been previously generated by translating corresponding data sequences into said plurality of code sequences,
each said code sequence is NRZI format comprising a MSN code sequence where a null point of a frequency spectrum on said storage medium is matched with a null point of a frequency spectrum of a PR equalized reproduction signal including said code sequence and a minimum run is limited to be greater or equal to one.

* * * * *